US012695273B2

(12) United States Patent
Chen et al.

(10) Patent No.: US 12,695,273 B2
(45) Date of Patent: Jul. 28, 2026

(54) LASER PACKAGE STRUCTURE

(71) Applicant: iReach Corporation, Hsinchu (TW)

(72) Inventors: Shou-Lung Chen, Hsinchu (TW);
Hsin-Chan Chung, Hsinchu (TW);
Hsiu-Ju Yang, Hsinchu (TW);
Chih-Chiang Lu, Hsinchu (TW);
Kuo-Min Huang, Hsinchu (TW)

(73) Assignee: IREACH CORPORATION, Hsinchu
(TW)

( * ) Notice: Subject to any disclaimer, the term of this
patent is extended or adjusted under 35
U.S.C. 154(b) by 1350 days.

(21) Appl. No.: 17/477,811

(22) Filed: Sep. 17, 2021

(65) Prior Publication Data

US 2022/0085571 A1     Mar. 17, 2022

(30) Foreign Application Priority Data

Sep. 17, 2020   (TW) ................................ 109132140

(51) Int. Cl.
*H01S 5/183*      (2006.01)
*H01S 5/02*       (2006.01)
*H01S 5/0233*     (2021.01)
(52) U.S. Cl.
CPC ............ *H01S 5/183* (2013.01); *H01S 5/0206*
(2013.01); *H01S 5/0233* (2021.01)
(58) Field of Classification Search
CPC ...... H01S 5/183; H01S 5/0206; H01S 5/0233;
H01S 5/06825; H01S 5/02253;
(Continued)

(56) References Cited

U.S. PATENT DOCUMENTS 8,743,923 B2 *   6/2014  Geske .................. G01S 7/4815
372/50.12
2003/0089902 A1 *   5/2003  Liu ....................... H01S 5/0262
257/22
(Continued)

FOREIGN PATENT DOCUMENTS

CN        103078033 A      5/2013
CN        104916759 A      9/2015
(Continued)

OTHER PUBLICATIONS

Office Action and Search Report from TIPO for Taiwanese Patent
App. No. 109132140 (Jan. 10, 2025) with English language trans-
lation thereof.
(Continued)

*Primary Examiner* — Xinning(Tom) Niu
(74) *Attorney, Agent, or Firm* — McClure, Qualey &
Rodack, LLP

(57) ABSTRACT
A package structure of a laser device is provided, including:
a first light transmissive substrate including a first surface, a
second surface opposing the first surface, a first side surface
between the first surface and the second surface, and a
second side surface opposing the first side surface; a laser
structure including a first laser chip and a second laser chip
which are disposed on the first surface, and the first laser
chip including a third side surface; a first optical component
disposing on the first light transmissive substrate and cor-
responding in position to the first laser chip; and a second
optical component disposing on the light transmissive sub-
strate and corresponding in position to the second laser chip;
wherein the first side surface is coplanar with the third side
surface.

18 Claims, 57 Drawing Sheets

(58) Field of Classification Search
CPC ............. H01S 5/02208; H01S 5/02257; H01S 5/0234; H01S 5/02345; H01S 5/0236; H01S 5/04257; H01S 5/18305; H01S 2301/176; H01S 5/423; H01S 5/02315; H01S 5/02335; H01S 5/0237
See application file for complete search history.

(56) References Cited

U.S. PATENT DOCUMENTS

| | | | |
|---|---|---|---|
| 2003/0209714 A1 | 11/2003 | Taskar et al. | |
| 2006/0227836 A1 | 10/2006 | Omori et al. | |
| 2011/0147779 A1 | 6/2011 | Kang et al. | |
| 2012/0001166 A1* | 1/2012 | Doany ................... | H10F 77/50 |
| | | | 257/E31.127 |
| 2013/0092850 A1* | 4/2013 | Ootorii .............. | H01S 5/02253 |
| | | | 250/552 |
| 2013/0272330 A1* | 10/2013 | Joseph ................... | H01S 5/023 |
| | | | 372/36 |
| 2014/0239334 A1 | 8/2014 | Wang | |
| 2014/0339581 A1 | 11/2014 | Kwon et al. | |
| 2015/0222094 A1 | 8/2015 | Lee et al. | |
| 2016/0043528 A1 | 2/2016 | Adachi et al. | |
| 2019/0237935 A1* | 8/2019 | Schrama ............... | H01S 5/4018 |
| 2019/0324359 A1* | 10/2019 | Shimizu ............. | G03B 21/2006 |
| 2020/0343695 A1* | 10/2020 | Mathai ................. | H01S 5/0234 |

FOREIGN PATENT DOCUMENTS

| | | |
|---|---|---|
| CN | 108074884 A | 5/2018 |
| CN | 109192841 A | 1/2019 |
| CN | 110494995 A | 11/2019 |
| CN | 111162442 A | 5/2020 |
| TW | 200529470 A | 9/2005 |
| TW | 200531310 A | 9/2005 |
| TW | 201031033 A1 | 8/2010 |
| TW | 201637204 A | 10/2016 |
| TW | 201824367 A | 7/2018 |
| TW | 201841392 A | 11/2018 |
| TW | 201915564 A | 4/2019 |
| TW | 201937629 A | 9/2019 |
| TW | 202032811 A | 9/2020 |

OTHER PUBLICATIONS

Examination report dated May 29, 2025, listed in related China patent application No. 202111094524.8.
Examination report dated Jun. 5, 2025, listed in related Taiwan patent application No. 114117761.

* cited by examiner

<u>10</u>

20'

20"

70A

720

70B

70C

750

750

750

70'

1235C

1250

1230

1200
1202
1210
1260

1220
1204

1260

1200C

1235D

1250

1230

1200
1202
1210
1260

1220
1204

1260

1200D

1400A

1400B

LASER PACKAGE STRUCTURE

CROSS-REFERENCE TO RELATED APPLICATION

The present application claims a priority benefit, under 35 U.S.C. § 119(e), to Taiwan Application No. 109132140 filed on Sep. 17, 2020, titled "Laser Package Structure," which is incorporated herein by reference in their entirety.

TECHNICAL FIELD

The present disclosure relates to a package structure of a semiconductor laser.

BACKGROUND

FIG. 1 shows a cross-sectional view of a conventional laser package structure (for example, a conventional Vertical Cavity Surface Emitting Lase (VCSEL) component). The laser chip 110 is mounted on a ceramic substrate 100 and then undergoes wire bonding to form a wire 120. After that, a spacer 130 is disposed around the laser chip 110 to form a cavity 140. Then, an optical component 150 is disposed on the laser chip 110 to form a laser chip package structure 10 which can be subsequently connected to an external circuit board (not shown).

SUMMARY

According to an embodiment of the present disclosure, a package structure of a laser device includes: a first transparent substrate including a first surface, a second surface opposing the first surface, a first side surface between the first surface and the second surface, and a second side surface opposing the first side surface; a laser structure including a first laser chip and a second laser chip which are disposed on the first surface, and the first laser chip including a third side surface; a first optical component disposing on the first transparent substrate and corresponding in position to the first laser chip; and a second optical component disposing on the transparent substrate and corresponding in position to the second laser chip; wherein the first side surface is coplanar with the third side surface.

BRIEF DESCRIPTION OF THE DRAWINGS

Technical features of the present disclosure are illustrated by embodiments, depicted by accompanying drawings, and described below. However, the description and the accompanying drawings are illustrative rather than restrictive of the present disclosure.

FIG. 25A to FIG. 25C are schematic views showing the semiconductor laser element in accordance with an embodiment of the present disclosure, wherein FIG. 25A and FIG. 25B are top views of the semiconductor laser element and the light emitting unit, respectively, and FIG. 25C shows the semiconductor laser element in the cross section taken along line E-E of FIG. 25A.

FIG. 27A and FIG. 27B are respectively a top view and a cross-sectional view showing the semiconductor laser element according to another embodiment of the present disclosure, wherein FIG. 27B shows the semiconductor laser element in the cross-section taken along line E-E of FIG. 27A.

FIG. 28A and FIG. 28B are respectively a top view and a cross-sectional view showing the semiconductor laser element according to still one embodiment of the present disclosure, wherein FIG. 28B shows the semiconductor laser element in the cross-section taken along line E-E of FIG. 28A.

FIG. 28C and FIG. 28D are top views showing a portion of the array of light emitting units according to one embodiment of the present disclosure, wherein FIG. 28D is an enlarged view of a portion of FIG. 28C.

DETAILED DESCRIPTION OF THE EMBODIMENTS

Figure 1:
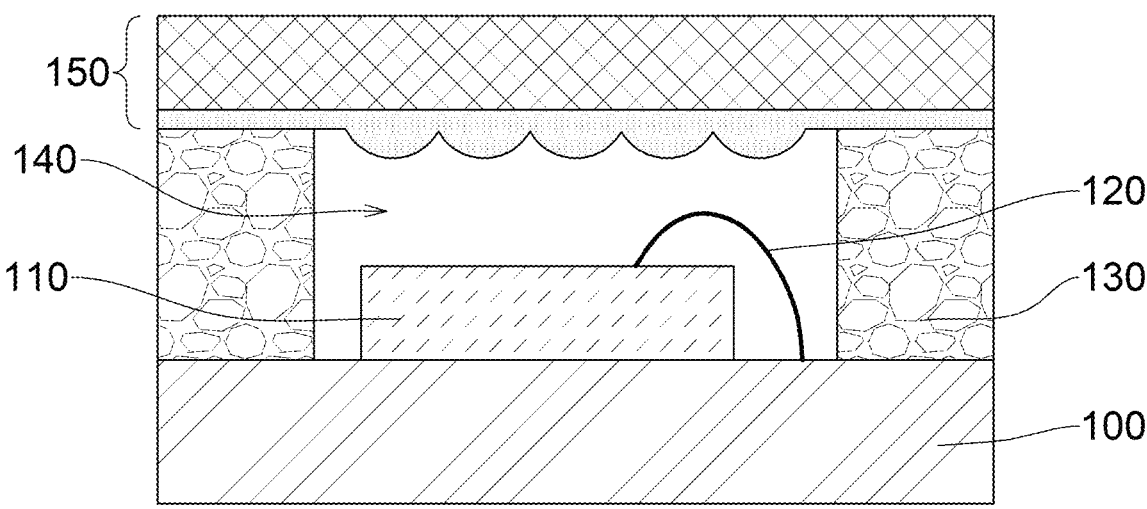
FIG. 1 is a cross-sectional view of a conventional laser package structure.

The concepts of the present disclosure are depicted by drawings and described by embodiments. In the drawings and description, similar or same parts are denoted by same reference signs. For the sake of illustration, the thickness and shapes of layers are neither the actual dimensions of the components nor proportional thereto in size. Components not shown in the drawings or described herein are well known to persons skilled in the art.

Figure 2A:
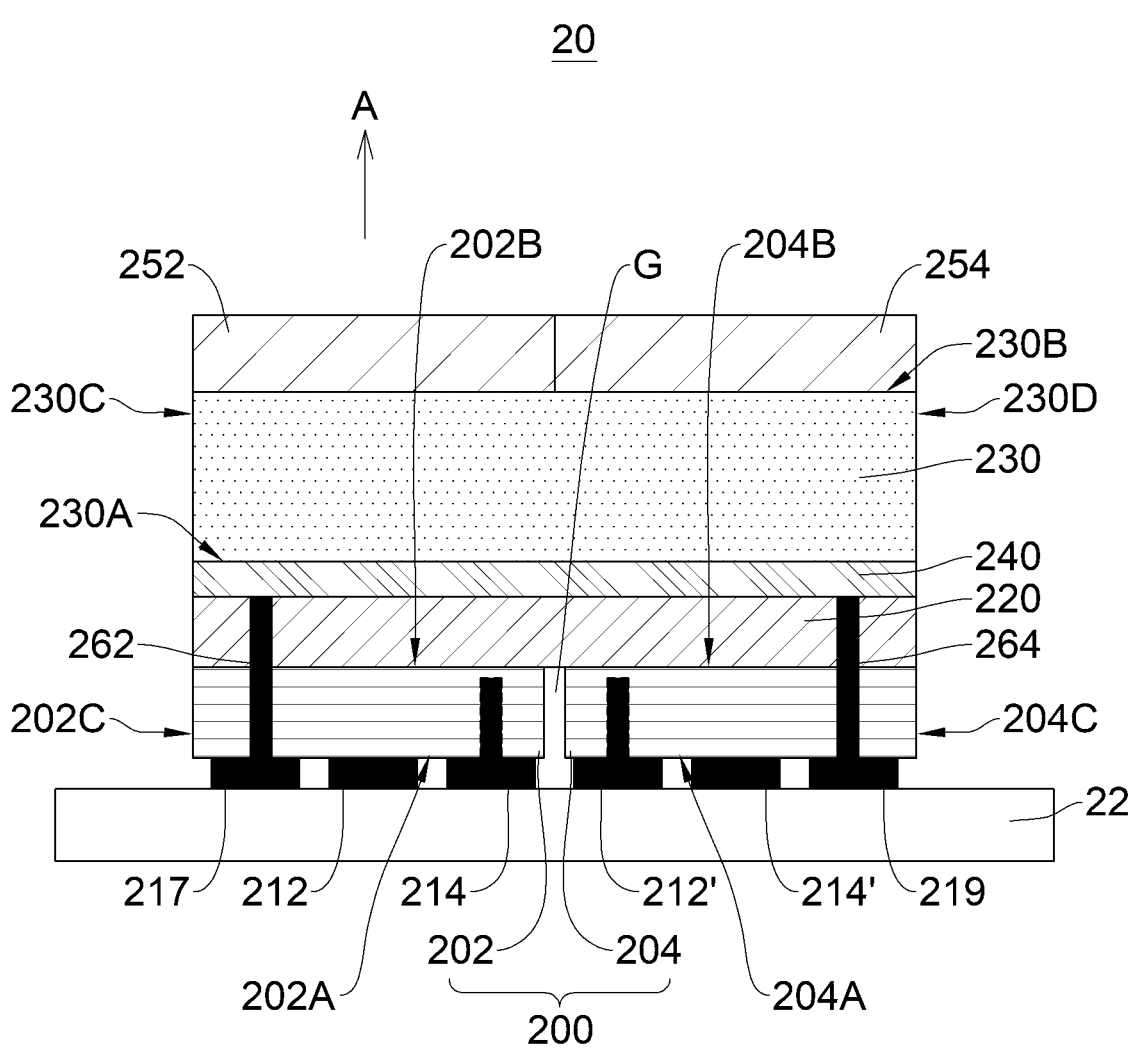
FIG. 2A and FIG. 2B are cross-sectional views of laser package structures in the first embodiment and its variant embodiment of the present disclosure.
Figure 2B:
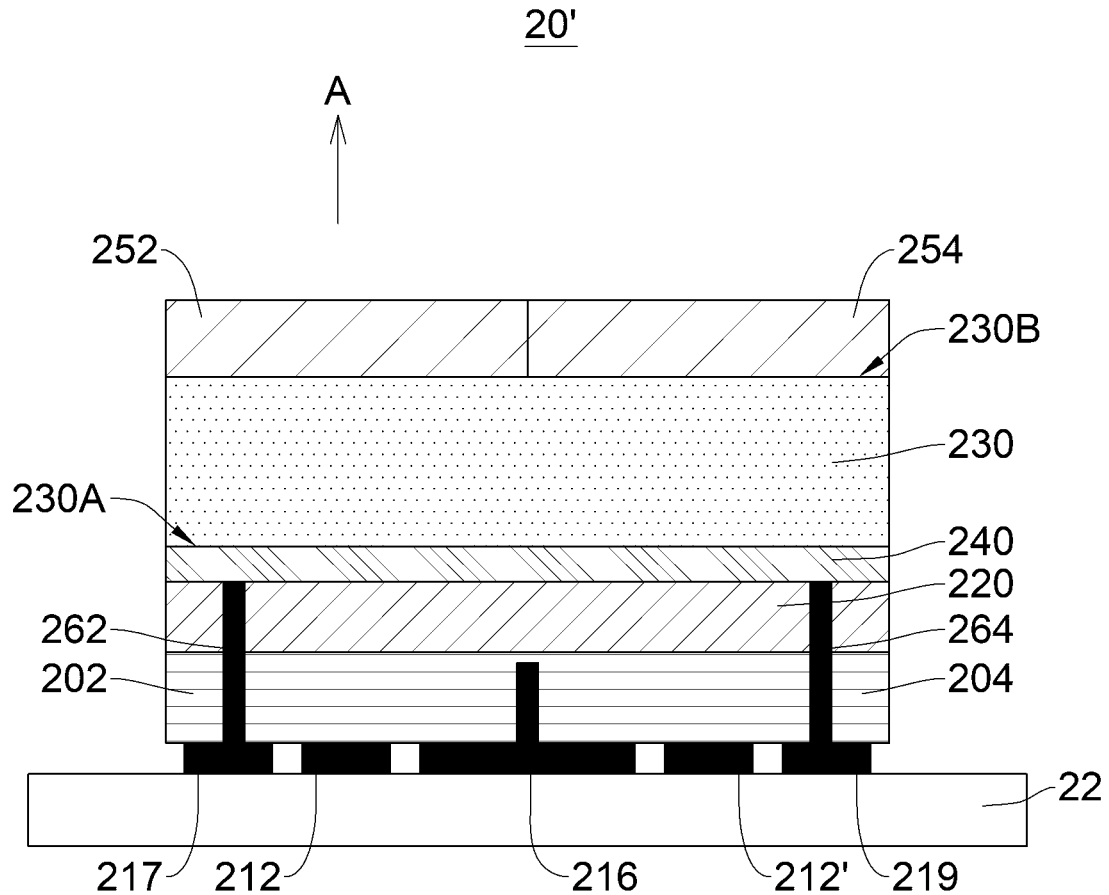

Referring to FIG. 2A and FIG. 2B, the cross-sectional views of laser package structures in the first embodiment and its variant embodiment of the present disclosure are shown. In this embodiment, the laser package structure 20 can be attained by a wafer-level packaging (WLP) process and has integrated light forms. That is, in one single package structure, at least two optical components are integrated into a chip. The two optical components modify the light forms of the passing light. The two optical components are respectively dedicated to different light forms.

In this embodiment, a package structure of a laser device 20 includes a laser element 200 to emit laser beams. The laser element 200 includes a first laser chip 202 and a second laser chip 204. The first laser chip 202 and the second laser chip 204 each have a light-exiting surface (the light-exiting direction is indicated by arrow A in the FIGURES) and a lower surface opposing the light-exiting surface. An electrode member including a first electrode 212 and a second electrode 214 is disposed on a first lower surface 202A of first laser chip 202 to form an electrical connection connected with an external circuit (for example, be electrically connected to an external circuit board 22.) An electrode member including a first electrode 212' and a second electrode 214' is disposed on a second lower surface 204A of second laser chip 204 to form an electrical connection connected with an external circuit (for example, be electrically connected to an external circuit board 22). In this embodiment, the first electrode 212 and the second electrode 214 are n-electrode and p-electrode, respectively. However, in another embodiment, the first electrode 212 and the second electrode 214 are p-electrode and n-electrode, respectively, depending on whether the first electrode 212 and second electrode 214 correspond in position to the p-semiconductor layer or the n-semiconductor layer of the first laser chip 202. In this embodiment, the first electrode 212' and the second electrode 214' are p-electrode and n-electrode, respectively. However, in another embodiment, the first electrode 212' and the second electrode 214' are, for example, the n-electrode and the p-electrode, respectively. The polarities of the first electrodes and the second electrodes depend on the actual design of the package structure and thus are not restricted to the present disclosure.

Although the accompanying drawings show that the first laser chip 202 has one first electrode 212 and one second electrode 214, it is also feasible for first laser chip 202 to have multiple first electrodes 212 or multiple second electrodes 214. The first electrode 212 is the same as or different from the second electrode 214 in size and shape, as the accompanying drawings serve an illustrative purpose only.

Take the first laser chip 202 as an example, the first laser chip 202 includes a semiconductor stack. The semiconductor stack includes an n-type semiconductor layer, an active layer and a p-type semiconductor layer sequentially arranged in a bottom-to-top order. The first electrode 212 and the second electrode 214 are, for example, an n-electrode and a p-electrode, respectively. The first electrode 212 is electrically connected to the n-type semiconductor layer. The second electrode 214 is electrically connected to the p-type semiconductor layer through a conductive via in the semiconductor stack. In another embodiment, the first laser chip 202 further includes at least two conductive layers (i.e., metal layers) disposed below the n-type semiconductor layer and on the p-type semiconductor layer, respectively, and electrically connected to the n-type semiconductor layer and the p-type semiconductor layer, respectively. The conductive via, for example, penetrates the semiconductor stack. The second electrode 214 is electrically connected to the conductive member (i.e., metal pillar) in the via and thus is electrically connected to the p-type semiconductor layer. Alternatively, in another embodiment, the second electrode 214 extends upward from an outer side of the semiconductor stack in order to be electrically connected to the p-type semiconductor layer. An insulating layer (not shown), for example, covers the side wall of the semiconductor stack around the via to prevent any short circuit from occurring to second electrode 214 or a corresponding conductive material in the p-type semiconductor layer and active layer of first laser chip 202. The second laser chip 204 is structurally similar to the first laser chip 202, and thus related details of the second laser chip 204 are, for the sake of brevity, not described herein.

In the embodiment illustrated by FIG. 2A, there may be an gap between the first laser chip 202 and the second laser chip 204, and the gap G is not filled with any materials. In another embodiment, an insulating material is disposed between first laser chip 202 and second laser chip 204 to not only separate but also support the first laser chip 202 and the second laser chip 204. The insulating material can cover only the sidewalls of the first laser chip 202 and the second laser chip 204, and the gap G still exists between the first laser chip 202 and the second laser chip 204, or the insulating material can totally fill the gap G between the first laser chip 202 and the second laser chip 204. The light-exiting surfaces 202B,204B of first laser chip 202 and second laser chip 204 are jointed to a first transparent substrate 230 through adhesive layer 220. That is, the adhesive layer 220 locates between the first transparent substrate 230 and the laser chip structure 200. The transparent substrate can be a light transmissive substrate. The first transparent substrate 230 has a first surface 230A facing the light-exiting surfaces 202B, 204B of the first laser chip 202 and the second laser chip 204, and a second surface 230B opposite to the first surface 230A. The first transparent substrate 230 further includes a first side surface 230C between the first surface 230A and the second surface 230B, and a second side surface 230D opposing the first side surface 230C. In this embodiment, a conductive layer 240 is disposed on the first surface 230A of the first transparent substrate 230. The above mentioned first lower surface 202A of the first laser chip 202 and the above mentioned second lower surface 204A of the second laser chip 204 are away from the second surface 230B of the first transparent substrate 230 than the light-exiting surfaces 202B, 204B to the second surface 230B. The first laser chip 202 and the second laser chip 204 are jointed to the conductive layer 240 through the adhesive layer 220. That is, the adhesive layer 220 locates between the conductive layer 240 and the laser chip structure 200, and the conductive layer 240 locates between the adhesive layer 220 (or the laser chip structure 200) and the first transparent substrate 230. The conductive layer 240 includes a linear, a meandering curved, a patterned or a non-patterned conductive structure. The present disclosure is not restrictive of the structure of the conductive layer 240.

Still referring to the embodiments shown in FIG. 2A and FIG. 2B, since the laser package structure 20 is attained by a wafer-level packaging (WLP) process, the first laser chip 202 includes a third side surface 202C coplanar with the first side surface 230C of the first transparent substrate 230. Besides, the second laser chip 204 includes a fourth side surface 204C coplanar with the second side surface 230D of the first transparent substrate 230.

In the embodiment illustrated by FIG. 2A, the laser package structure 20 further includes a first optical component 252 and a second optical component 254. The first optical component 252 and the second optical component 254 are mounted on the second surface 230B of the first transparent substrate 230 and correspond in position to the first laser chip 202 and the second laser chip 204, respectively. The laser package structure 20 further includes a first conductive post 262 and a second conductive post 264 respectively penetrates the first laser chip 202 and the second laser chip 204 and connects to conductive layer 240, thereby allowing the conductive layer 240 to be electrically connected to an external circuit. For example, the first conductive post 262 and the second conductive post 264 are electrically connected to an external circuit board 22 through electrodes 217, 219, respectively. In the embodiment, the first conductive post 262 and the second conductive post 264 also penetrate the adhesive layer 220. The electrode 217 disposes on the first lower surface 202A of the first laser chip 202, and the electrode 219 disposes on the second lower surface 204A of the second laser chip 204.

The first transparent substrate 230 is made of a transparent material or a light transmissive material, such as glass, sapphire, SiC, Si, or GaAs. In an embodiment, the conductive layer 240 is made of a transparent conductive material or a light transmissive material, such as Indium Tin Oxide (ITO), Gallium Zinc Oxide (GZO), Indium Zinc Oxide (IZO), or Indium Gallium Zinc Oxide (IGZO), to prevent blocking the light emitted from first laser chip 202 and second laser chip 204. In this embodiment, the conductive layer 240 covers no less than 10% (i.e., a minimum 10%) but no more than 70% (i.e., a maximum 70%) of the area of the first surface 230A. In another embodiment, the conductive layer 240 is made of a metal-containing material and disposed at part of the periphery of the first surface 230A so as not to impede the emission of light beams. In this embodiment, the conductive layer 240 covers no greater than 20% of the area of first surface 230A.

In this embodiment, the first optical component 252 and the second optical component 254 are either identical or different, and each of them can be a diffraction optical element (DOE), micro lens array, metalens, or the combination of the above optical components. The light beams emitted from the first laser chip 202 and the second laser chip 204 can be converted into uniform planar light sources, structured light source, array-dot light sources, or irregularly-distributed point light sources by the first optical component 252 and the second optical component 254.

According to an embodiment of the present disclosure, the first optical component 252 and the second optical component 254 are elements independent of the first transparent substrate 230 and conductive layer 240. In a variant embodiment of the present disclosure, the first optical component 252 and the second optical component 254 are directly formed by performing an appropriate process on first transparent substrate 230. For instance, it is feasible to perform a nanoimprinting process on a coating layer on the first transparent substrate 230, so as to nanoimprint patterns of the first optical component 252 and the second optical component 254 on the first transparent substrate 230, or directly perform a patterning process (for example, etching) on the first transparent substrate 230 and thereby directly enable a surface (for example, second surface 230B) of the transparent substrate to form the first optical component 252 and the second optical component 254, or form a surface plating layer on a surface (for example, second surface 230B) of the first transparent substrate 230 and thereby form the first optical component 252 and the second optical component 254. The surface plating layer includes one of $SiO_2$, $SiN_x$, $Al_2O_3$, and $TiO_2$ which are applicable to optical thin-films. In this embodiment, the first optical component 252 and the second optical component 254 are formed or disposed on the second surface 230B of the first transparent substrate 230. However, in another embodiment, the optical components of the laser package structure are beside the first surface 230A of the first transparent substrate 230 and locates under the conductive layer 240, more specifically, the conductive layer 240 is disposed between the first transparent substrate 230 and optical component.

The first laser chip 202 and the second laser chip 204 can be separate laser chips or can be diced from a common epitaxial wafer according to a predetermined pitch. By controlling the arrangement of the laser chips, the laser package structure of the present disclosure has an integrated light form. The integrated light form is integrated from one or more light forms. Given the aforesaid structure, the constituent elements of the laser package structure are arranged to adjustably attain the desirable light forms. In the embodiment illustrated by FIG. 2A, the first laser chip 202 and the second laser chip 204 are formed by dicing a wafer according to a specific pitch.

The first laser chip 202 and the second laser chip 204 are not completely separated as shown in FIG. 2B. In this embodiment, the first laser chip 202 and the second laser chip 204 are electrically connected to the external electronic device by a common electrode 216. The common electrode 216 locates on the first laser chip 202 and the second laser chip 204, and corresponds in position to the p-electrode, whereas the first laser chip 202 and the second laser chip 204 have first electrodes 212, 212', respectively, which function as the n-electrode. In another embodiment, the first laser chip 202 and the second laser chip 204 each have a metal conductive layer. The two metal conductive layers are connected to each other. For example, in the embodiment, the two metal conductive layers are connected and form a common metal conductive layer. The common metal conductive layer is electrically connected to the p-type semiconductor layer of the first laser chip 202 and the p-type semiconductor layer of the second laser chip 204. A portion of the metal common conductive layer is exposed from a trench between first laser chip 202 and second laser chip 204. A conductive structure locates in the trench and electrically connects the common electrode 216 and the common metal conductive layer. The conductive structure and the common electrode 216 are formed by the same process or different processes, and the present disclosure is not limited thereto. Thus, the common electrode 216 are electrically connected to the p-type semiconductor layers of the second laser chip 204 and the first laser chip 202 by the common metal conductive layer, respectively. For the sake of illustration, FIG. 2B schematically shows the connected parts of first laser chip 202 and second laser chip 204, and the connected parts can be the common metal conductive layer mentioned above.

Figure 2C:
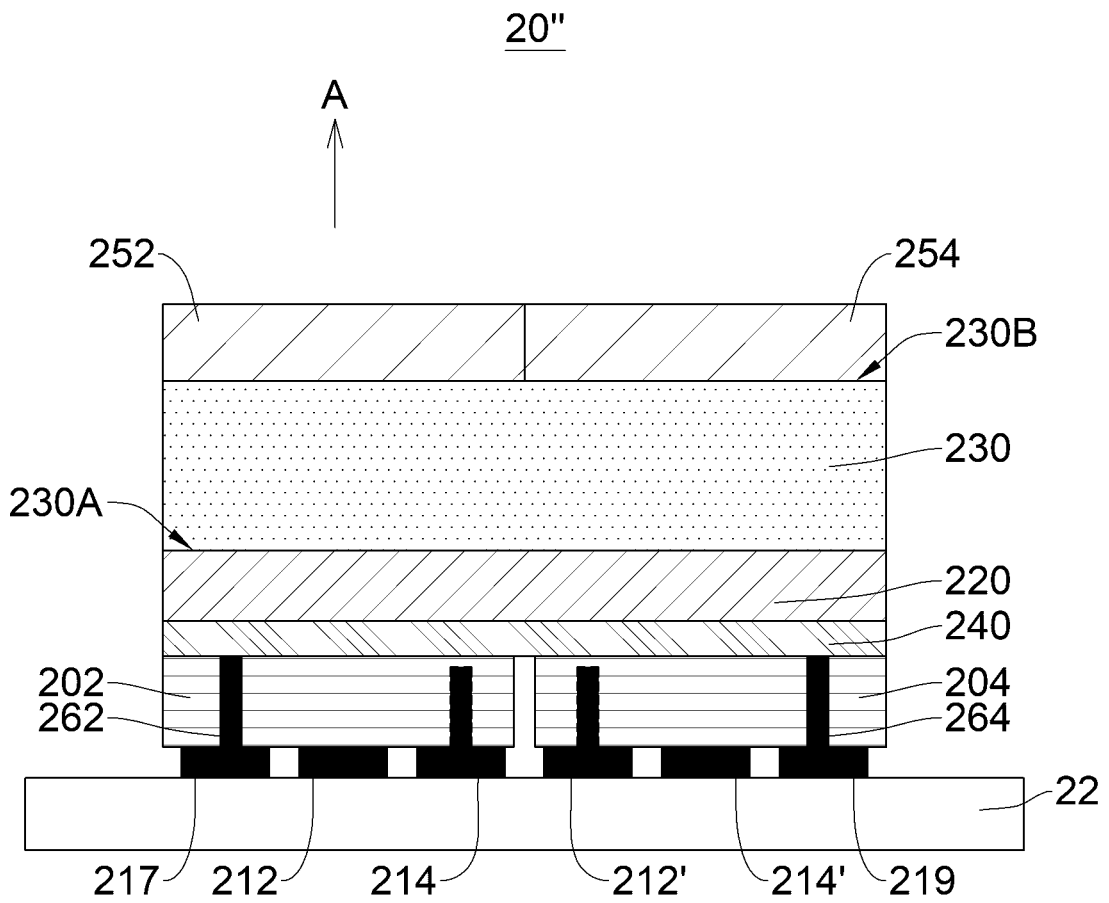
FIG. 2C and FIG. 2D are cross-sectional views of laser package structures in the second embodiment and its variant embodiment of the present disclosure.
Figure 2D:
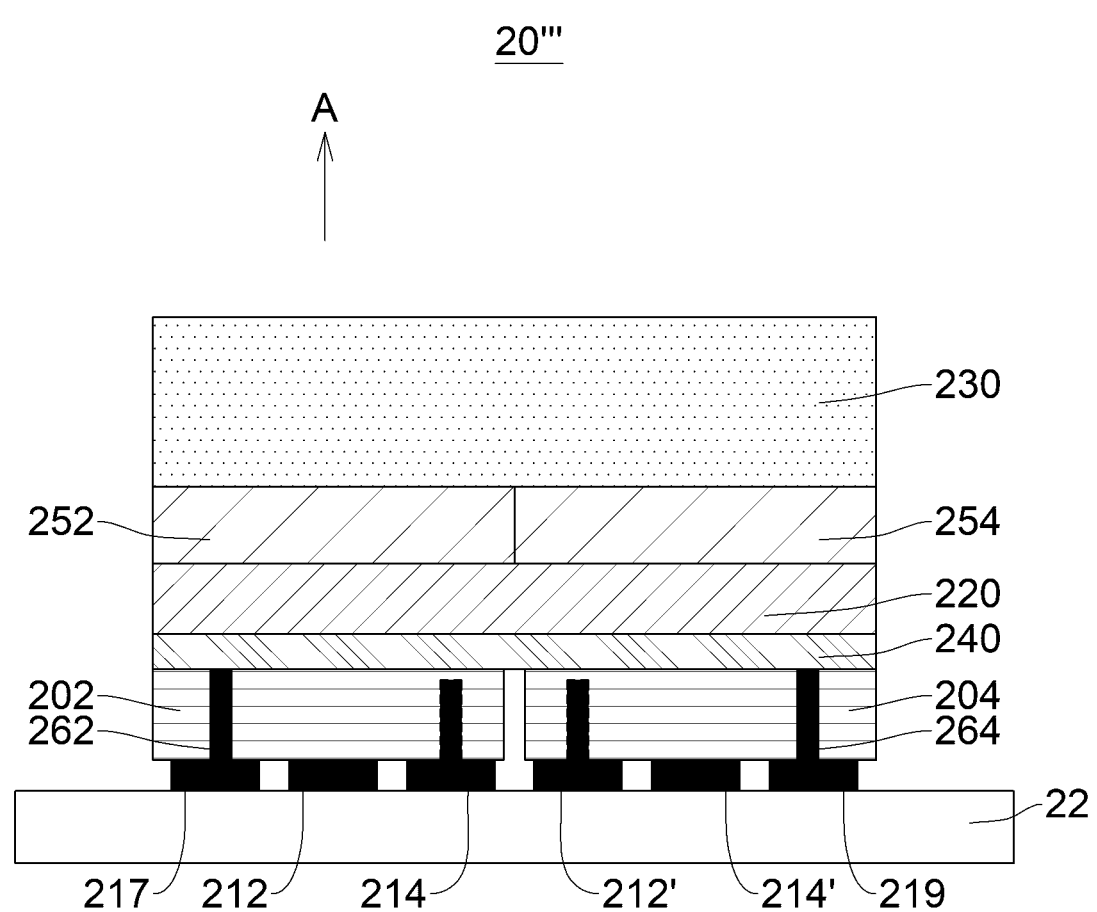

Referring to FIG. 2C and FIG. 2D, cross-sectional views of laser package structures in the second embodiment and its variant embodiment of the present disclosure are shown. FIG. 2C and FIG. 2D show the laser package structure 20" and the laser package structure 20''', respectively. The laser package structure 20" and laser package structure 20''' are substantially similar to the laser package structure 20 and/or the laser package structure 20'. Unlike the laser package structure 20, the adhesive layer 220 in the laser package structure 20" is disposed between the conductive layer 240 and the first transparent substrate 230. Unlike the laser package structure 20", the first optical component 252 and the second optical component 254 in the laser package structure 20''' are disposed between the adhesive layer 220 and the first transparent substrate 230.

The plurality of optical components corresponding in position to the plurality of the laser chips (for example, the first laser chip and the second laser chip) is disposed on the upper or lower surface of the first transparent substrate of the laser package structure or directly formed from the first transparent substrate, so as to attain the output of integrated light forms. Considering the stability and efficiency of the manufacturing process, the optical component can be disposed on the first transparent substrate of the laser chip or disposed on the package structure by a Chip Scale Package (CSP) process, as described below.

Figure 3A:
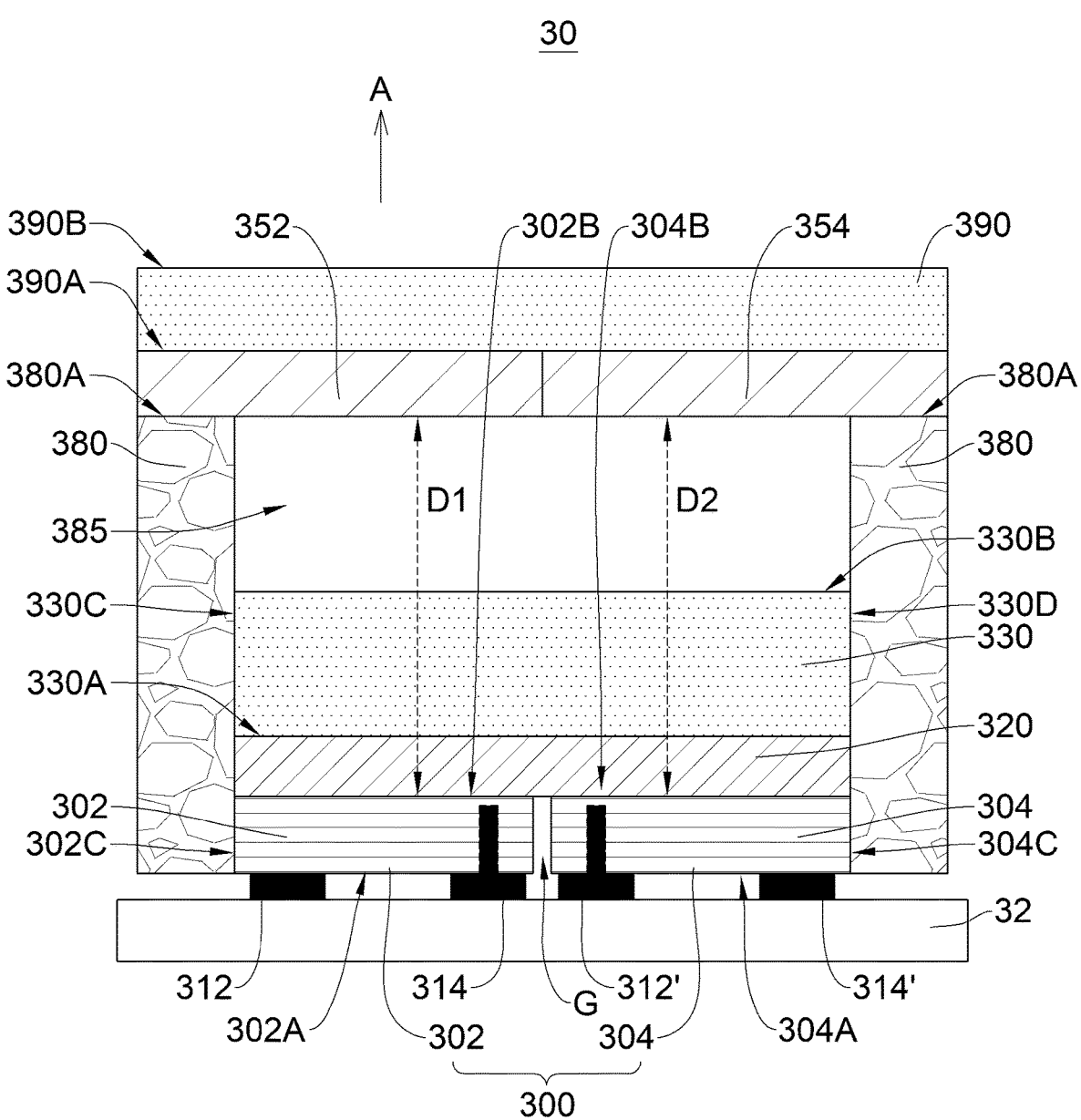
FIG. 3A and FIG. 3B are cross-sectional views of laser package structures in the third embodiment and its variant embodiment of the present disclosure.
Figure 3B:
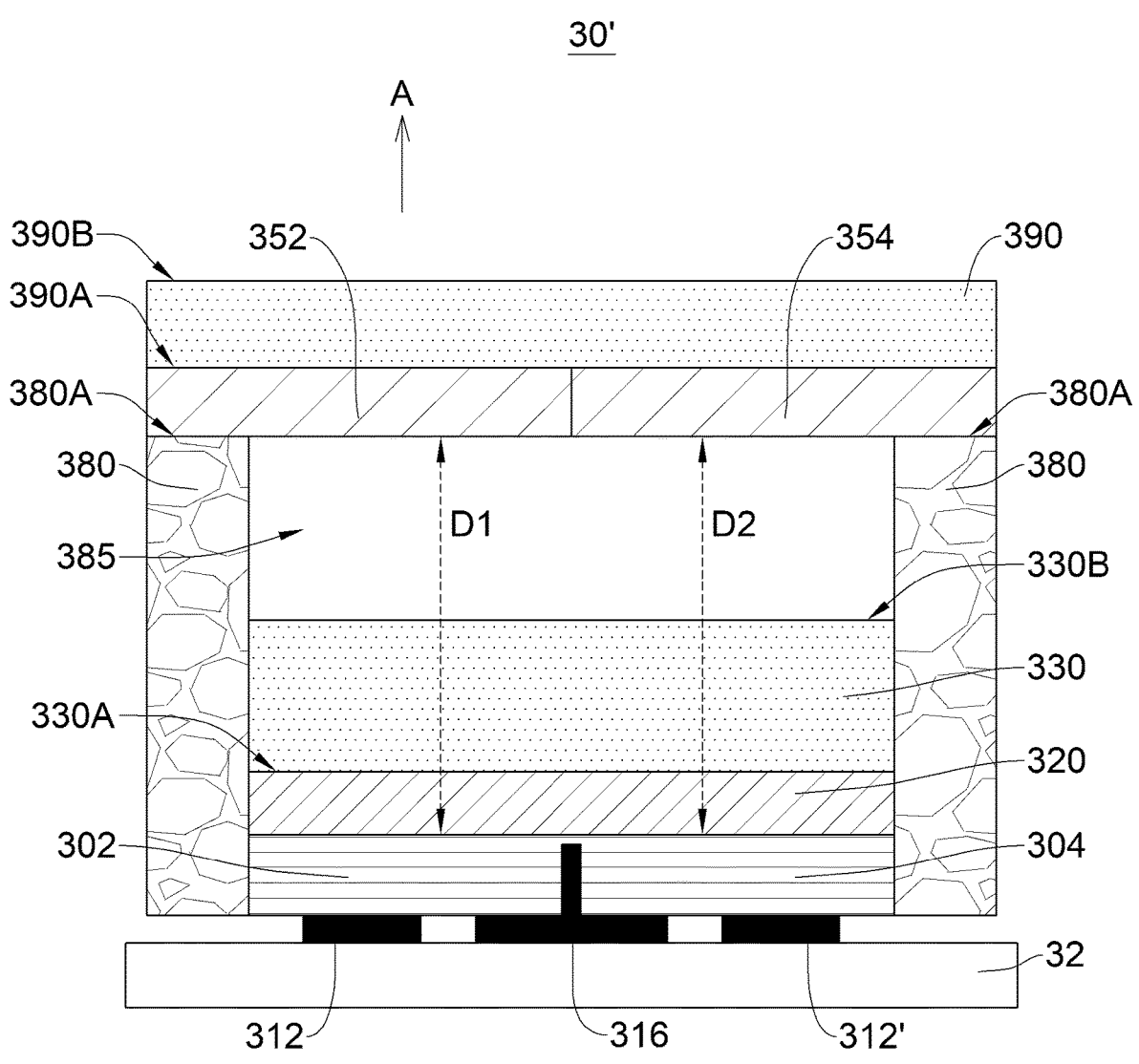

Referring to FIG. 3A and FIG. 3B, there are shown cross-sectional views of laser package structures in the third embodiment and its variant embodiment of the present disclosure. In this embodiment, the laser package structure 30 includes a laser chip structure 300 to emit laser beams. The laser chip structure 300 includes a first laser chip 302 and a second laser component 304 next to each other. The first laser chip 302 and the second laser chip 304 each have a light-exiting surface 302B (the light-exiting directions are indicated by arrow A) and a lower surface 302A opposing the light-exiting surface 302B. Electrode members including first electrode 312, 312' and second electrode 314, 314' are disposed on the lower surfaces 302A, 304A of the first laser chip 302 and the second laser chip 304, respectively, so as to form electrical connections electrically connected to external electrical connections (for example, an external circuit board 32.) The electrodes 312, 314, 312', 314' are similar to electrodes 212, 214, 212', 214' in terms of arrangement, and thus related details of the electrodes 312, 314, 312', 314' are, for the sake of brevity, not described herein. In the embodiment illustrated by FIG. 3A, an gap G is formed between the first laser chip 302 and the second laser chip 304 and is not filled with any other material. In another embodiment, the insulating material is disposed between first laser chip 302 and second laser chip 304 to not only separate but also support first laser chip 302 and second laser chip 304. The insulating material covers the sidewalls of first laser chip 302 and second laser chip 304 only, and thereby the gap G still exists therebetween. The first transparent substrate 330 has a first surface 330A facing the light-exiting surfaces 302B, 304B of the laser chips and a second surface 330B opposing the first surface 330A and facing outward. The first transparent substrate 330 further includes a first side surface 330C between the first surface 330A and the second surface 330B, and a second side surface 330D opposing the first side surface 330C. Since the laser package structure 20 is attained by a Chip Scale Package (CSP) process, the first laser chip 302 includes a third side surface 302C coplanar with the first side surface 330C of the first transparent substrate 330. Besides, the second laser chip 304 includes a fourth side surface 304C coplanar with the second side surface 330D of the first transparent substrate 330.

In this embodiment, the laser package structure 30 further includes a support element (housing/spacer) 380 which surrounds the laser chip structure 300 to form a cavity 385. The support element 380 has an upper surface 380A covered with a second transparent substrate 390. In an embodiment, the support element 380 includes an insulative material, such as resin, ceramic, glass or resin. The second transparent substrate 390 has a bottom surface 390A facing the light-exiting surfaces 302B, 304B of the laser chips 302, 304 and a top surface 390B opposing the bottom surface 390A. In this embodiment, the first optical component 352 and the second optical component 354 are disposed under the bottom surface 390A of the second transparent substrate 390 and correspond in position to the first laser chip 302 and the second laser chip 304, respectively. The distance D1 between the first optical component 352 and the first laser chip 302 and the distance D2 between the second optical component 354 and the second laser chip 304 can be adjusted by changing the height of support element 380.

Similarly, in this embodiment, the first laser chip 302 and the second laser chip 304 can be separate laser chips or can be diced from a common epitaxial wafer according to a specific pitch. By controlling the arrangement of the laser chips, the laser package structure of the present disclosure has integrated light forms. In the embodiment illustrated by FIG. 3A, the first laser chip 302 and the second laser chip 304 are next to each other, and their adjacent sidewalls are formed by wafer dicing according to a specific pitch. In another embodiment, a protective layer is disposed between the first laser chip 302 and the second laser chip 304. The first laser chip 302 and second laser chip 304 share a common electrode 316, so as to form a package structure of a laser device 30' shown in FIG. 3B. The related details of common electrode 316 are similar to those of common electrode 216 shown in FIG. 2B and thus are, for the sake of brevity, not described herein.

Figure 4A:
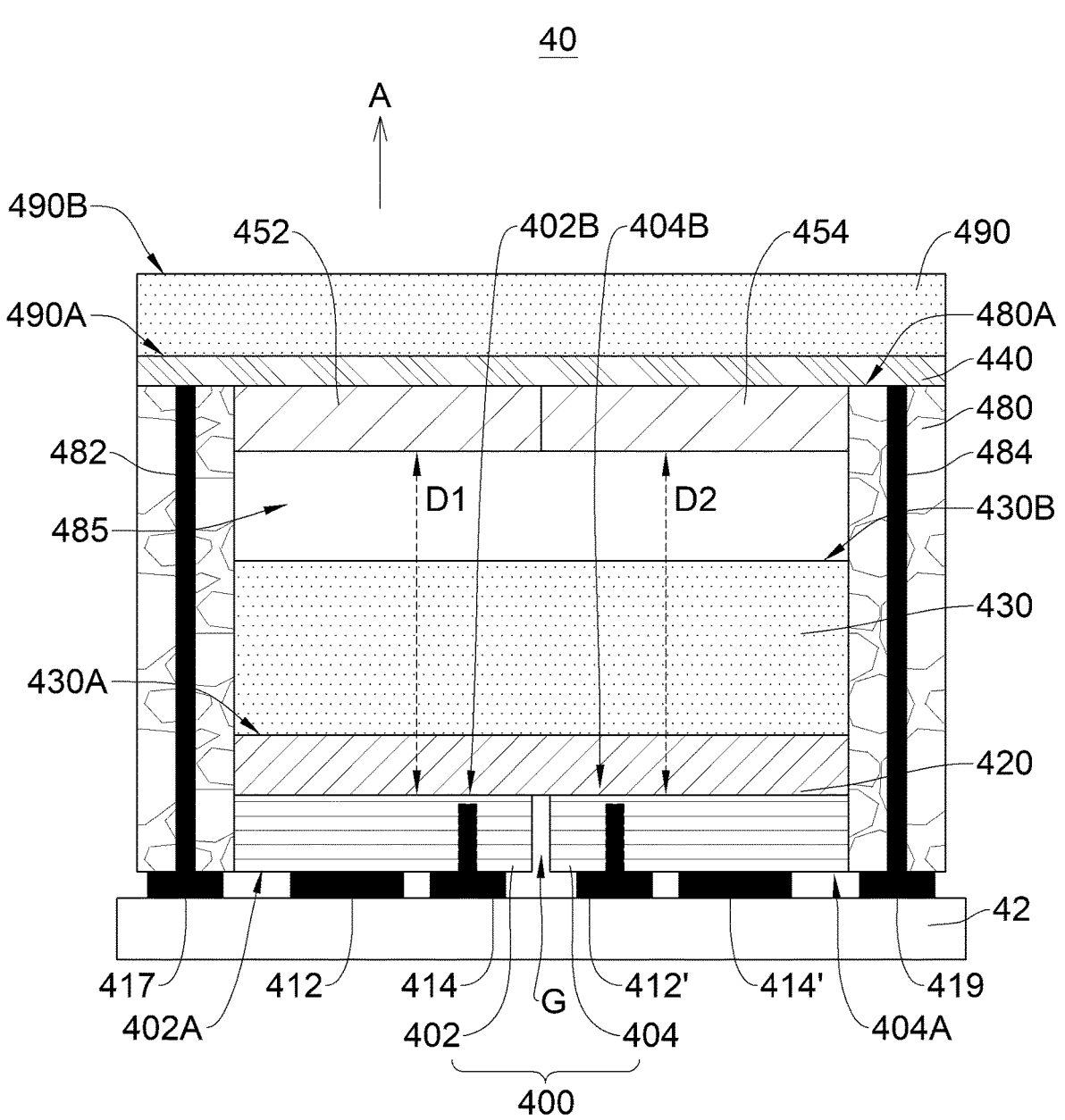
FIG. 4A and FIG. 4B are cross-sectional views of laser package structures in the fourth embodiment and its variant embodiment of the present disclosure.
Figure 4B:
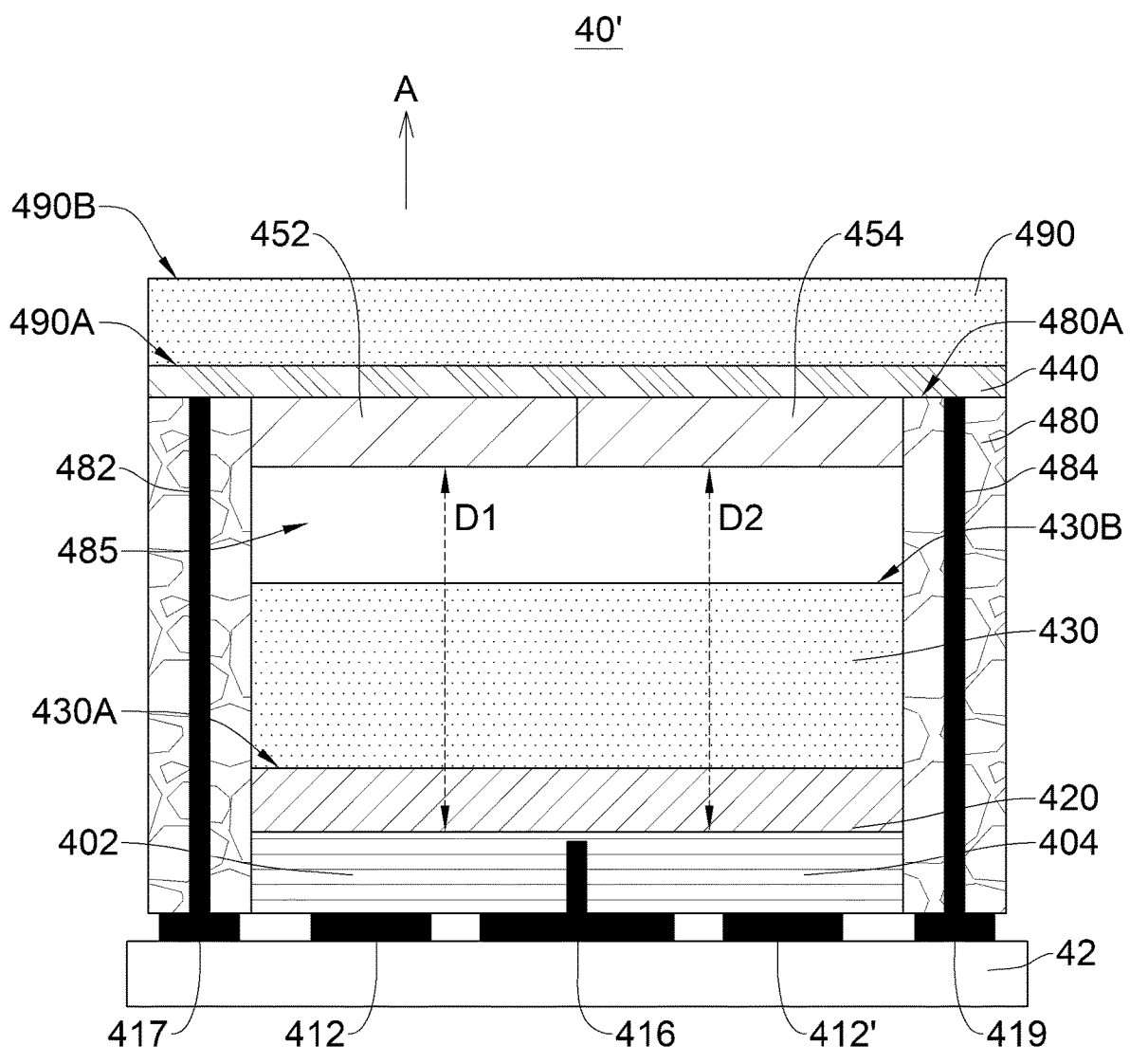

Referring to 4A and FIG. 4B, cross-sectional views of laser package structures in the fourth embodiment and its variant embodiment of the present disclosure are shown. In this embodiment, the laser package component 40 includes a first laser chip 402 and a second laser chip 404 whose lower surfaces 402A, 404A have electrode members each including a first electrodes 412, 414' (for example, n-electrode) and second electrodes 414, 412' (for example, p-electrode) to allow the laser chips 402, 404 to be electrically connected to external electrical connection (for example, an external circuit board 42) and to be jointed to a first transparent substrate 430 by an adhesive layer 420. The electrodes 412, 414, 412', 414' are similar to electrodes 212, 214, 212', 214' in terms of arrangement, and thus related details of electrodes 412, 414, 412', 414' are, for the sake of brevity, not described herein. The first transparent substrate 430 has a first surface 430A and a second surface 430B opposing the first surface 430A. The first surface 430A faces the light-exiting surfaces 402B, 404B of first laser chip 402 and second laser chip 404.

Similarly, in this embodiment, the laser package structure 40 further includes a support element (housing or spacer) 480 which surrounds the laser chip structure 400 to form a cavity 485. The support element 480 has an upper surface 480A disposed on the side of the light-exiting surface 402B, 404B of the laser chips. A second transparent substrate 490 is mounted on upper surface 480A of the support element 480. The second transparent substrate 490 has a bottom surface 490A facing the light-exiting surface 402B, 404B of the laser chips and an upper surface 490B opposing the bottom surface 490A. In this embodiment, the first optical component 452 and the second optical component 454 are disposed on bottom surface 490A of the second transparent substrate 490 and correspond in position to the first laser chip 402 and the second laser chip 404, respectively. In the embodiment, the support element 480 surrounds the first optical component 452 and the second optical component 454.

The laser package structure 40 in this embodiment is structurally similar to the laser package structure 30. However, the distinguishing technical features of the laser package structure 40 are described below. In this embodiment, a conductive layer 440 is disposed between the second transparent substrate 490, the first optical component 452 and the second optical component 454. The conductive layer 440 disposes on the support element 480. The support element 480, which surrounds the laser chips 402, 404 to form cavity 485, includes a first conductive post 482 and a second conductive post 484 penetrating the support element 480, so as to form a conductive support element. The conductive layer 440 is connected to first conductive post 482 and second conductive post 484, and thus the conductive layer 440 is electrically connected to the outside (for example, an external circuit board 42) through the conductive support element. An insulating layer (not shown) surrounds first conductive post 482 or second conductive post 484 to prevent the first conductive post 482 or the second conductive post 484 from electrically connecting wrongly to any constituent elements. More specifically, in the embodiment, the first conductive post 482 and a second conductive post 484 penetrate the support element 480 and electrically connect to the conductive layer 440.

Similarly, in the embodiment illustrated by FIG. 4A, the first laser chip 402 and the second laser chip 404 are next to each other, and their adjacent sidewalls are formed by wafer dicing according to a specific pitch. In this embodiment, the first laser chip 402 and the second laser chip 404 are separated by an gap G. In another embodiment, a protective layer (not shown) is disposed between the first laser chip 402 and the second laser chip 404, and the gap G is fully or not fully filled with the protective layer. Alternatively, the first laser chip 402 and the second laser chip 404 share a common electrode 416 as shown in FIG. 4B. In the embodiment, the conductive layer 440 locates on the second surface 430B of the first transparent substrate 430, and more specifically, the conductive layer 440 locates between the support element 480 and the second transparent substrate 490. Related details of common electrode 416 are similar to those of common electrode 216 shown in FIG. 2B and thus are, for the sake of brevity, not described herein.

Figure 5A:
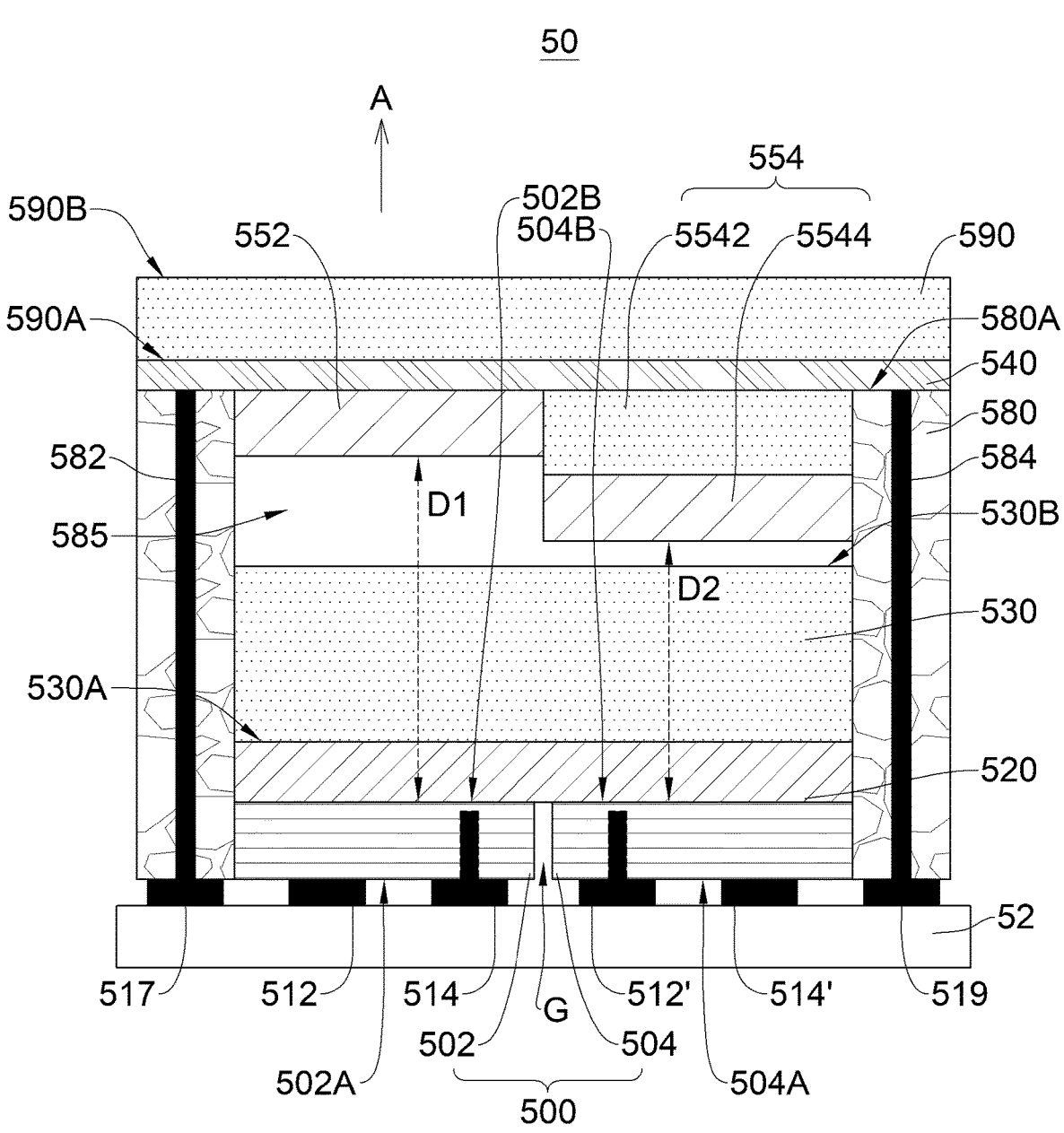
FIG. 5A and FIG. 5B are cross-sectional views of laser package structures in the fifth embodiment and its variant embodiment of the present disclosure.
Figure 5B:
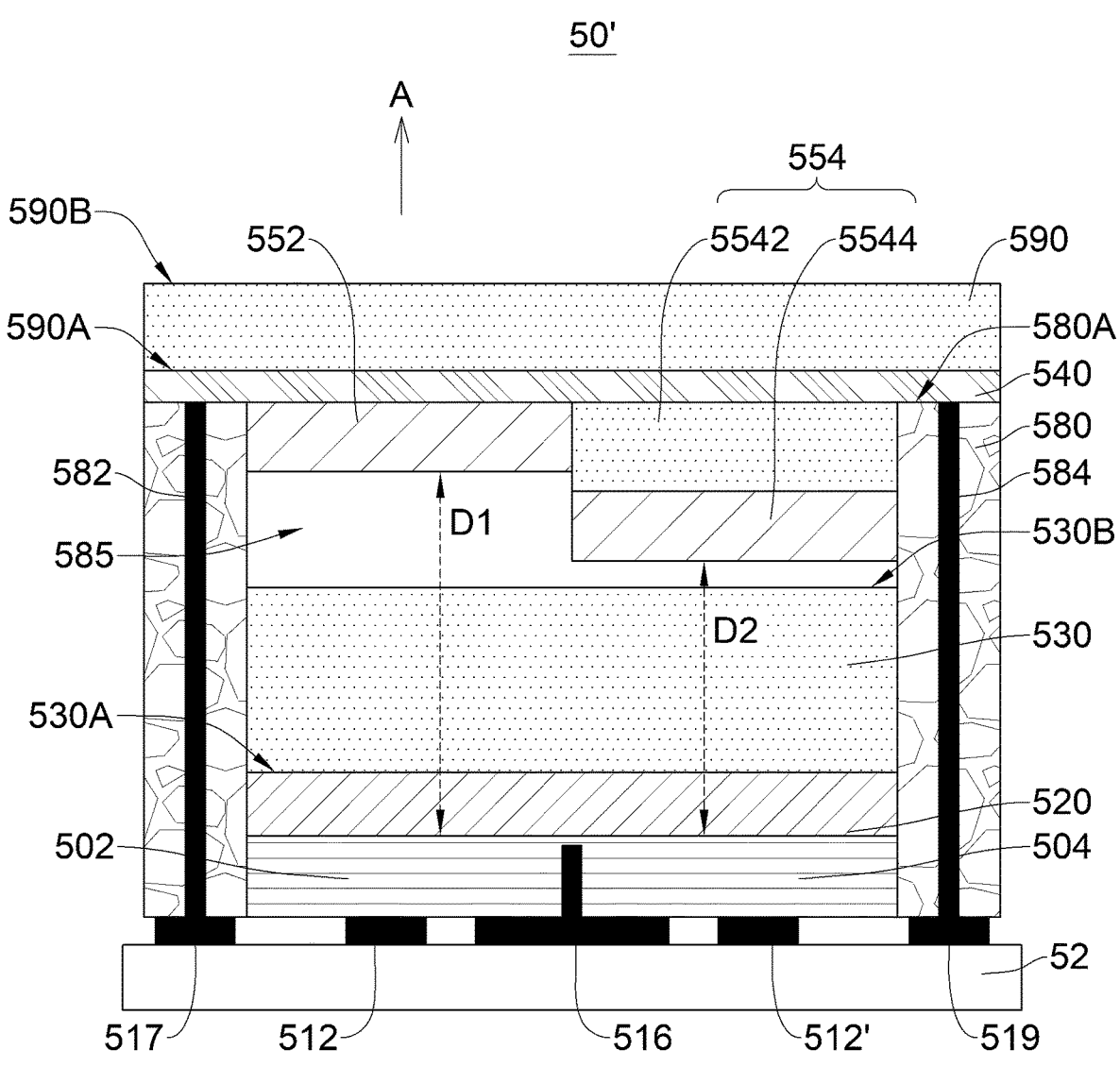

FIG. 5A and FIG. 5B are cross-sectional views of laser package structures in the fifth embodiment and its variant embodiment of the present disclosure. In this embodiment, the laser package component 50 includes a laser chip structure 500 which has a first laser chip 502 and a second laser chip 504. The lower surfaces 502A, 504A of the first laser chip 502 and a second laser chip 504 each have an electrode member including a first electrode 512, 514' (for example, n-electrode) and second electrode 514, 512' (for example, p-electrode), respectively, to electrically connect the laser chips 502, 504 to the outside, respectively (i.e., be connected to an external circuit board 52). The first laser chip 502 and a second laser chip 504 are jointed to a first transparent substrate 530 through an adhesive layer 520. The electrode 512, 514, 512', 514' are similar to the electrode 212, 214, 212', 214' in terms of arrangement, and thus related details of the electrode 512, 514, 512', 514' are, for the sake of brevity, not described herein. The first transparent substrate 530 has a first surface 530A and an opposing second surface 530B. The first surface 530A faces the light-exiting surfaces 502B, 504B of the first laser chip 502 and the second laser chip 504.

Similarly, in this embodiment, the laser package structure 50 further includes a support element (housing/spacer) 580 which surrounds the laser chip structure 500 to form a cavity 585. The support element 580 has an upper surface 580A beside the light-exiting surfaces 502B, 504B of the laser chips and covered with a second transparent substrate 590. The second transparent substrate 590 has bottom surface 590A facing light-exiting surfaces 502B, 504B of the laser chips and a top surface 590B opposing bottom surface 590A. The first optical component 552 and the second optical component 554 are disposed under the bottom surface 590A of the second transparent substrate 590 and correspond in position to the first laser chip 502 and the second laser chip 504, respectively. In this embodiment, a conductive layer 540 is disposed between the second transparent substrate 590, the first optical component 552 and the second optical component 554. The support element 580 includes a first conductive post 582 and a second conductive post 584 penetrating the support element 580. The conductive layer 540 connects the first conductive post 582 and the second conductive post 584, and electrically connected to the outside (for example, an external circuit board 52) through the support element 580. An insulating layer is disposed around the first conductive post 582 or around the second conductive post 584 to prevent the first conductive post 582 or the second conductive post 584 from electrically connecting wrongly to any constituent elements.

The laser package structure 50 in this embodiment is structurally similar to the laser package structure 40. However, the distinguishing technical features of the laser package structure 50 are described below. In this embodiment, the second optical component 554 includes a transparent substrate portion 5542 and an optical component pattern portion 5544 formed on a transparent substrate portion 5542. The transparent substrate portion 5542 is disposed between the second transparent substrate 590 and the optical component pattern portion 5544. By adjusting the thickness of transparent substrate portion 5542, a distance D2 between the second optical component 554 and the second laser chip 504 can be adjusted to render the distance D2 different from a distance D1 between the first optical component 552 and the first laser chip 502. The value of the distance D1 and the distance D2 depends on the functions of the first optical component 552 and the second optical component 554.

In this embodiment, the first optical component 552 is a diffractive optical element (DOE), whereas the second optical component 554 is a microlens array (MLA), whose surfaces have respective pattern portions, and thus they are independent of each other. The first optical component 552 and the second optical component 554 correspond in position to first laser chip 502 and second laser chip 504, respectively. The first distance D1 is related to the focal length of first optical component 552. The second distance D2 is less than the first distance D1 because of the thickness of transparent substrate portion 5542 of second optical component 554. For instance, in an embodiment, the first distance D1 is equal to the focal length of the DOE and must be at least 2.2 mm, whereas the second distance D2 is determined as needed (by adjusting the thickness of transparent substrate 5542) but must be less than first distance D1 and equal to 0.5 mm or more.

Similarly, in the embodiment illustrated by FIG. 5A, the first laser chip 502 and the second laser chip 504 are next to each other, and their adjacent sidewalls are formed by wafer dicing according to a specific pitch. In this embodiment, the first laser chip 502 and the second laser chip 504 are separated by an gap G. In another embodiment, a protective layer (not shown) is disposed between the first laser chip 502 and the second laser chip 504, and the gap G is fully or not fully filled with the protective layer. Alternatively, as shown in FIG. 5B, the first laser chip 502 and the second laser chip 504 share a common electrode 516. The common electrode 516 is similar to the common electrode 216 shown in FIG. 2B and thus is, for the sake of brevity, not described herein.

Figure 6A:
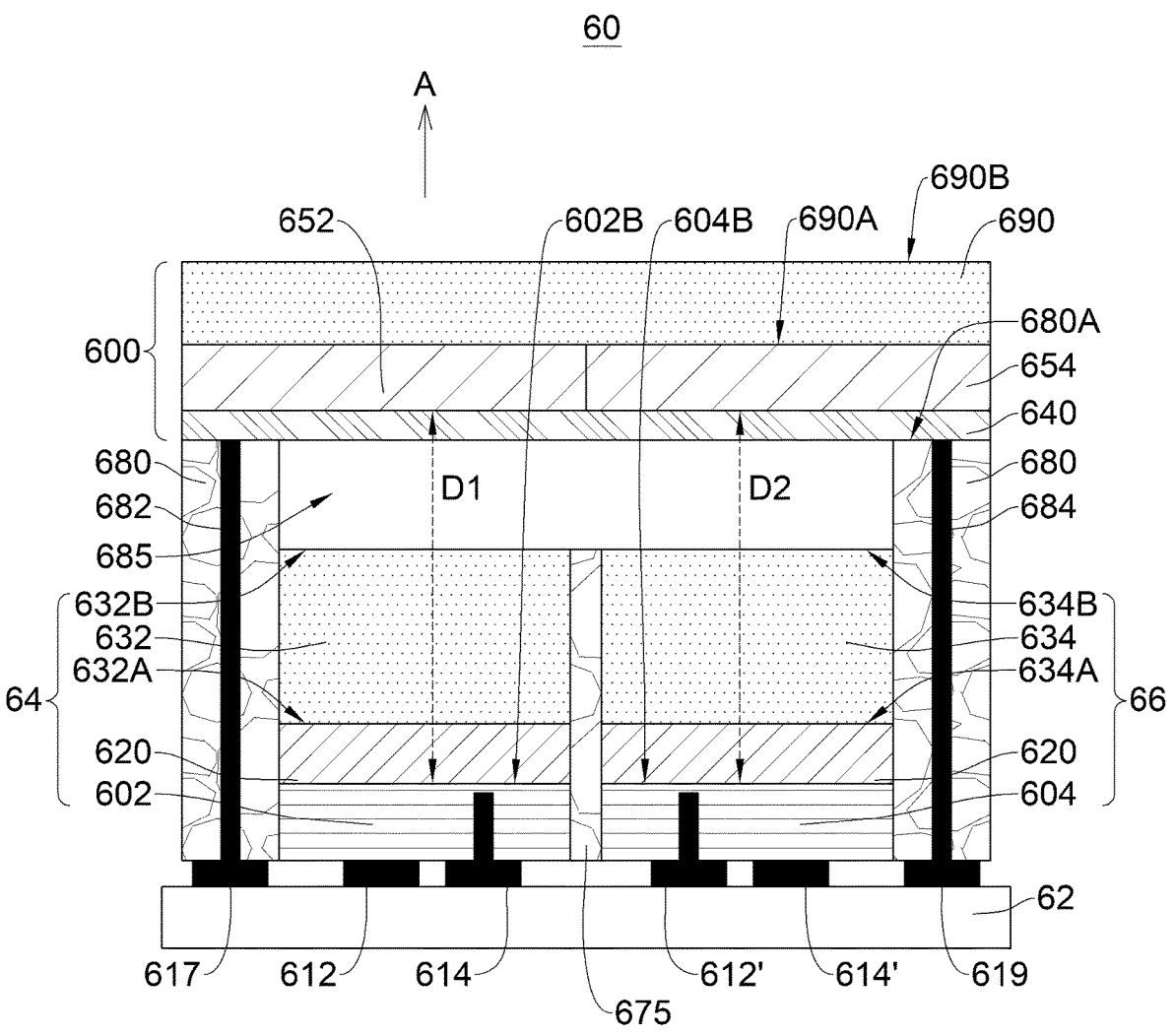
FIG. 6A and FIG. 6B are cross-sectional views of laser package structures in the sixth embodiment and its variant embodiment of the present disclosure.
Figure 6B:
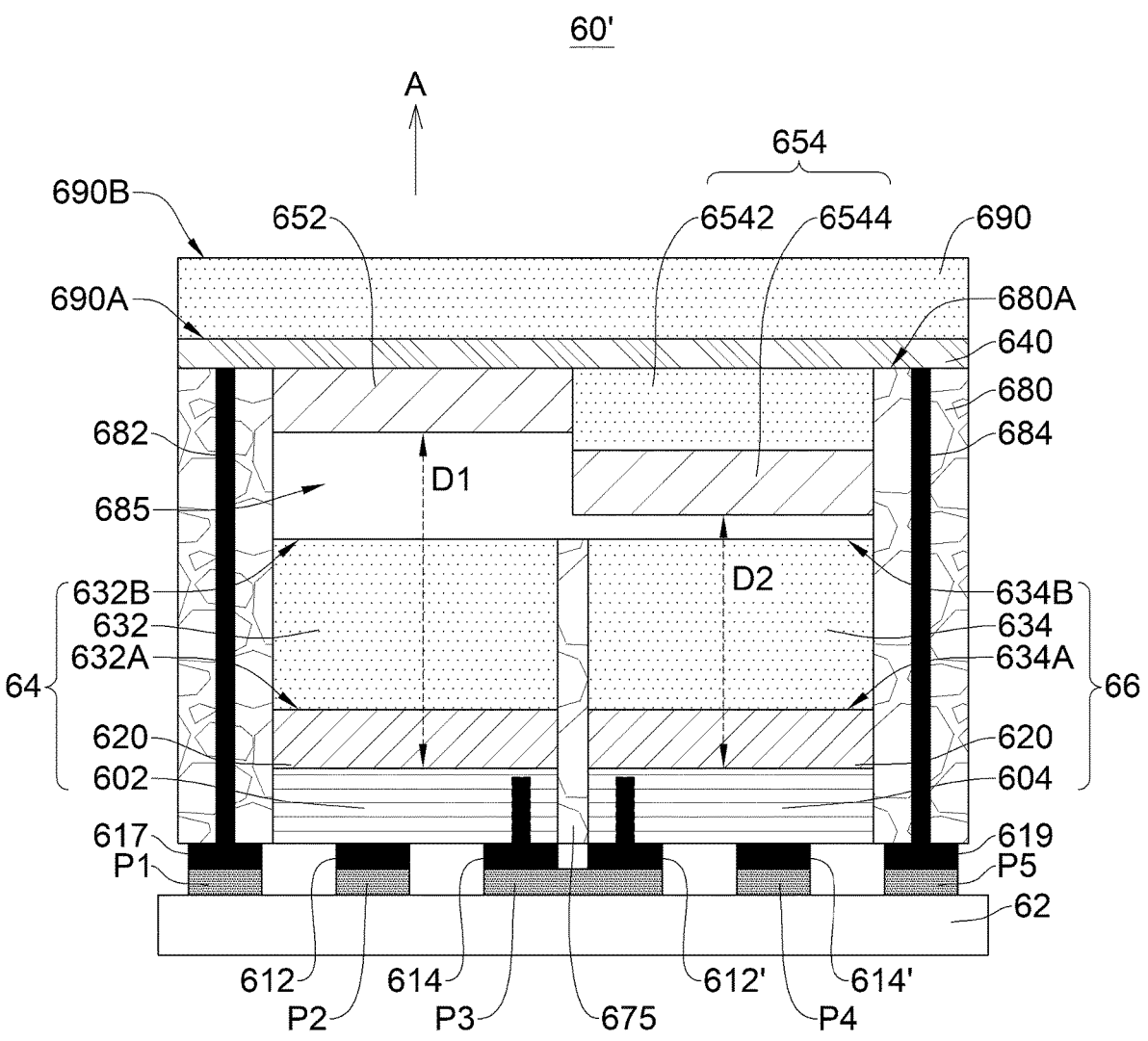

FIG. 6A and FIG. 6B are cross-sectional views of a package structure of a laser device in the sixth embodiment and its variant embodiment of the present disclosure. The distinguishing technical features of laser package structure 60 in this embodiment are described below. In this embodiment, a first laser component 64 and a second laser component 66 are separated by a spacing layer 675, wherein the material of the spacing layer 675 can be, for example, the same as the material of the support 680. As shown in the diagrams, the first laser component 64 and the second laser component 66 each include transparent package substrates 632, 634. The transparent package substrate 632 has a first surface 632A and a second surface 632B opposing the first surface 632A. The transparent package substrate 634 has a first surface 634A and a second surface 634B opposing the first surface 634A. The laser chips 602, 604 emit laser beams and are jointed to transparent package substrates 632, 634, respectively, through an adhesive layer 620. The light-exiting surfaces of laser chips 602, 604 face the first surfaces 632A, 634A. An electrode member including first electrodes 612, 614' and second electrodes 614, 612' is disposed on the lower surfaces 602A, 604A of laser chips 602, 604 to enable the first laser component 64 and the second laser component 66 to be electrically connected to the outside (for example, to be electrically connected to an external circuit board 62.) The electrodes 612, 614, 612', 614' are similar to electrodes 212, 214, 212', 214' in terms of arrangement, and thus related details of the electrodes 612, 614, 612', 614' are, for the sake of brevity, not described herein. The laser package structure 60 includes a support element 680 surrounding the first laser component 64 and the second laser component 66. The support element 680 includes a first conductive post 682 and a second conductive post 684 penetrating the support element 680. The first conductive post 682 and second conductive post 684 are connected to the conductive layer 640 to enable the conductive layer 640 to be electrically connected to the outside (for example, electrically connected to external circuit board 62). In this embodiment, an optical component combination 600 further includes a second transparent substrate 690, which has a bottom surface 690A and a top surface 690B opposing to the bottom surface 690A. The bottom surface 690A faces the light-exiting surfaces 602B, 604B of the first laser component 64 and the second laser component 66. The first optical component 652 and the second optical component 654 correspond in position to first laser component 64 and second laser component 66, respectively. The conductive layer 640 is disposed under first optical component 652 and the second optical component 654 and connected to the external circuit board 62 by a first conductive post 682 and a second conductive post 684 of the support element 680. An insulating layer (not shown) surrounds the first conductive post 682 or the second conductive post 684 to prevent the first conductive post 682 or the second conductive post 684 from electrically connecting wrongly to any constituent elements.

FIG. 6B illustrates a variant of the embodiment illustrated by FIG. 6A. Similarly, in the embodiment illustrated by FIG. 6B, the laser chips are arranged to separate each other by a distance defining the tolerance of arranging the chip during the packaging process, whereas the first laser component 64 and the second laser component 66 are separated by spacing layer 675. In the variant embodiment, the second optical component 654 includes a transparent substrate portion 6542 and an optical component pattern portion 6544 formed on a transparent substrate portion 6542. By adjusting the thickness of transparent substrate portion 6542, a distance D2 between the second optical component 654 and the second laser chip 604 can be adjusted to render the distance D2 different from the distance D1 between the first optical component 652 and the first laser chip 602. The values of the distance D1 and the distance D2 depend on the functions of the first optical component 652 and the second optical component 654.

In this embodiment, in case of a long distance between first laser chip 602 and second laser chip 604 for any package-related reasons, adjacent second electrode 614, 612' can share the same connection pad p3 through the wiring layout on external circuit board 62 to achieve the effect of a common electrode.

In conclusion, the present disclosure provides a package structure of a laser device, allowing integrating at least two optical components differing in functions into one single package structure, so as to attain a laser package structure with integrated light forms in a simple, feasible way.

Furthermore, according to the present disclosure, the laser package structure with integrated light forms has reduced package dimensions, with multiple optical components, such as a diffraction optical element (DOE), a micro lens array, a metalens, or the combination thereof disposed on or below a flip-chip substrate for laser chips, so as to achieve different optical functions of a diffusor, a dot projector or a planar light source in one single package structure in the presence of laser components independently controlled.

In an embodiment, when the optical component is a metalens, the distance (for example, the aforesaid distance D1 or the distance D2) between the optical component and the laser chip is no less than 5 μm but no greater than 200 μm. Preferably, the distance (for example, the distance D1 or the distance D2) between the optical component and the laser chip is no less than 10 μm but no greater than 100 μm. In the aforesaid embodiments, the distance between the optical component and the laser chip is adjusted by adjusting the height of the support element. Alternatively, the optical component is disposed selectively on the first surface or the second surface of the first transparent substrate as needed, so as to place the optical component at an appropriate position without introducing any other components.

A metalens includes a substrate and a fin array formed on the substrate (the substrate is $SiO_x$, $TiO_2$, $SiN_x$, or $Al_2O_3$). The fin array is able to control and adjust the refractive index status of the metalens. Thus, when a light beam passes through different fin arrays of the metalens, identical or different phase differences occur. The design of integrated light forms ensures that all light beams reach a focus at the same time and enhances the imaging effect of the laser chip. By contrast, the conventional laser package structure requires multiple lenses to eliminate errors and thus undesirably increases the overall thickness of the laser package structure. The use of the metalens is effective in reducing the overall thickness of the laser package structure, achieving miniaturization, and attaining precise imaging.

According to the present disclosure, a wafer dicing pitch is adjusted to provide, for example, a two-in-one laser component (e.g., two laser stacks are integrated in one laser chip). The design of a common electrode, coupled with corresponding optical component control, can integrate multiple light form functions, reduce the volume of the package structure, and enhance process reliability.

Figure 7:
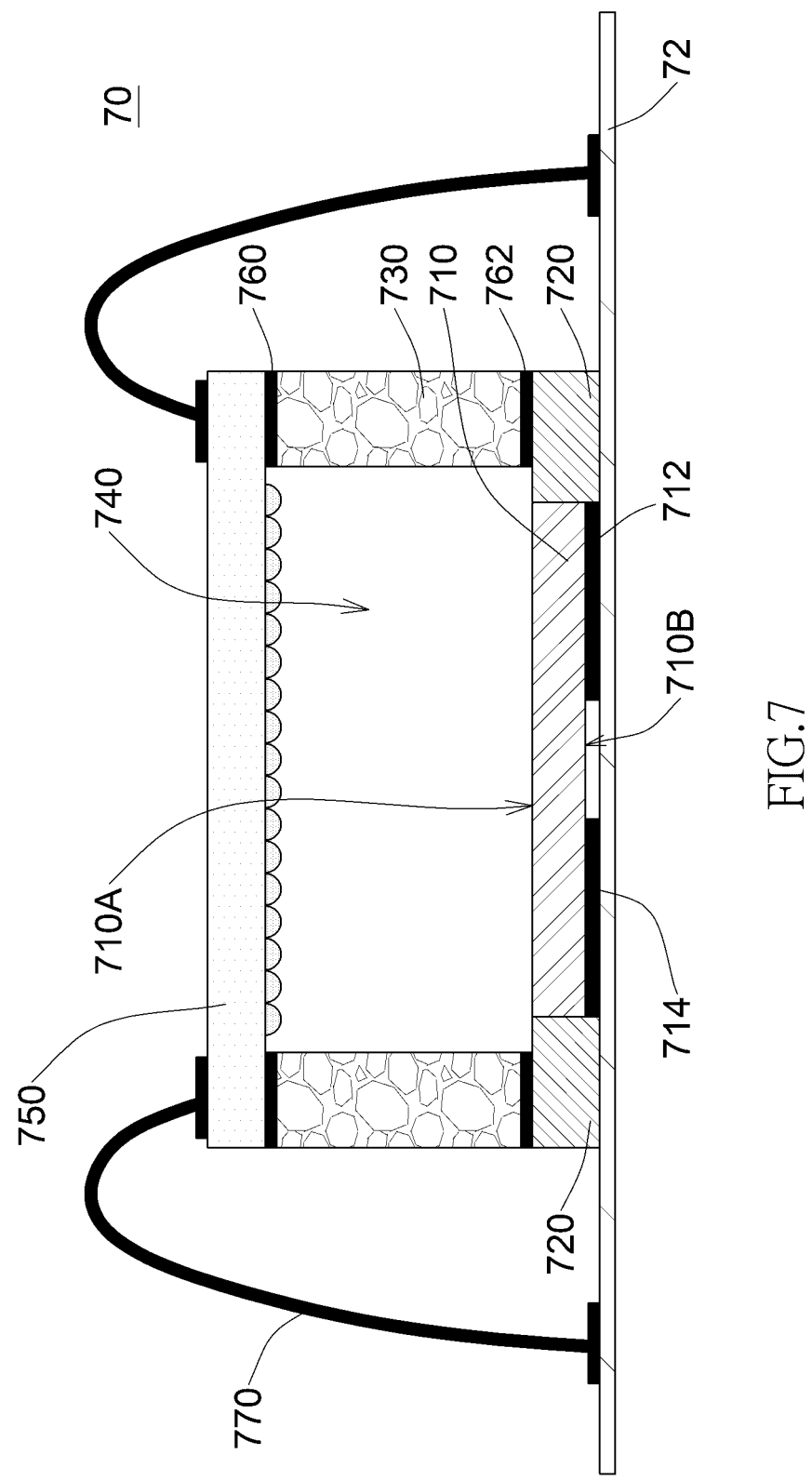
FIG. 7 is a cross-sectional view showing the laser package structure in accordance with the seventh embodiment of the present disclosure.
Figure 15A:
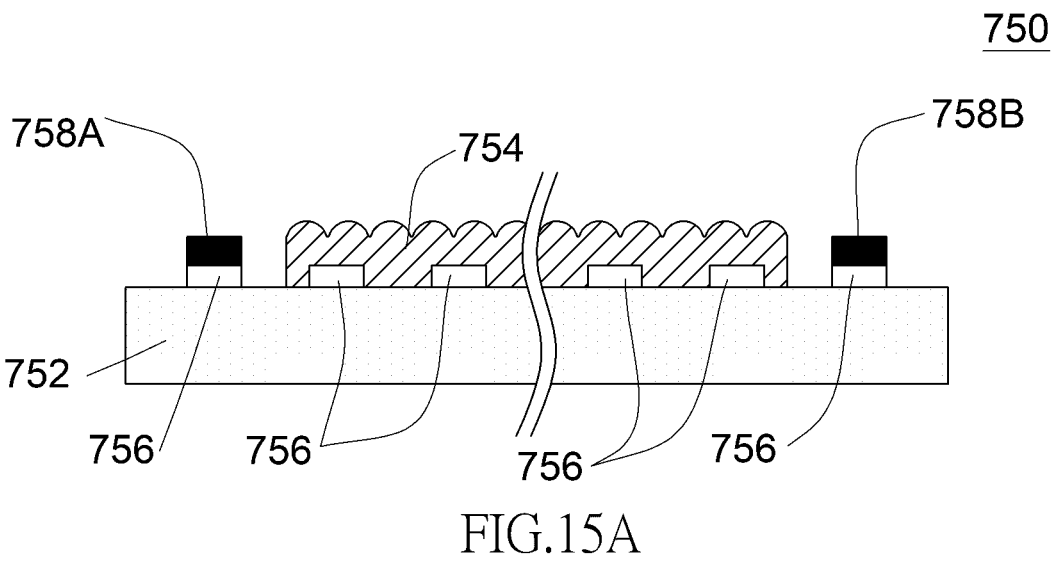
FIG. 15A to FIG. 15G are cross-sectional views and top views showing the optical component of one embodiment of the present disclosure.

Please refer to FIG. 7, which is a cross-sectional view showing the laser package structure according to the seventh embodiment of the present disclosure. The package structure 70 of the present embodiment is a package structure of a laser device attained by the WLP process, and includes a laser chip 710 emitting a laser. The laser chip 710 includes a first conductive structure 712 and a second conductive structure 714 on the first surface 710A thereof, and is enclosed by the encapsulating layer 720 at the four side faces thereof. On the encapsulating layer 720, the spacer 730 is correspondingly provided, by which the laser chip 710 is surrounded and a space is formed. The space serves as a cavity 740 of the package structure 70 when the packaging process is completed. The spacer 730 is covered with an optical component 750. The optical component 750 is provided on the spacer 730, facing toward the second surface 710B of the laser chip 710. The second surface 710B is opposite to the first surface 710A. The optical component 750 includes a microlens array (MLA) or a diffraction optical element (DOE), which transforms the laser emitting from the laser chip 710 to a uniform surface source, a dot-matrix source, or a dot source with irregular distribution. In an embodiment, the optical component 750 can be a transparent substrate provided with optical structure layer, but the invention is not limited to this. The laser chip 710 in the cavity 740 of the package structure 70 is electrically connected to an external circuit board 72 through the first conductive structure 712 and the second conductive structure 714, and the spacer 730 is connected to the optical component 750 and the encapsulating layer 720 with a respective adhesive layer 760, 762. In this embodiment, the adhesive layer 760, 762 is formed by a generally non-conductive adhesive material, which is serving for the spacer 730 to securely connected to the optical component 750 and the encapsulating layer 720 thereunder. In this embodiment, when the laser chip 710 is driven by a current provided from the external circuit 72 through the first conductive structure 712 and the second conductive structure 714, the laser chip 710 may emit the laser, and the laser emitting from the laser chip 710 may pass through the optical component 750. The optical component 750 includes a conductive wire layer (as shown in FIG. 15A). The conductive wire layer is formed by a transparent conductive material such as indium tin oxide (ITO) to avoid the blocking of the light emitting from the laser chip 710. The conductive wire layer is applied for detecting the operation of the optical component 750. When the optical component 750 is normally operating, the conductive wire layer is electrically conductive so that the current may pass therethrough. Otherwise, when the optical component 750 is damaged, the conductive wire layer may be damaged as well so that the resistance thereof may be changed or an open circuit may occur. The external circuit board 72 includes a feedback circuit (not shown) electrically connected to the laser chip 710. The conductive wire layer of the optical component 750 is electrically connected to the feedback circuit on the external circuit board 72 through a wiring structure 770. In an embodiment, the feedback circuit includes a resistance sensor and a breaker. When the optical component 750 is damaged, the conductive wire layer inside the optical component 750 may be also damaged so that the resistance may be changed or an open circuit may occur. The feedback circuit electrically connected to the optical component 750 may detect, by the included resistance sensor, a variation in the resistance of the conductive wire layer of the optical component 750 in time, and stop the laser chip 710 from emitting the laser with the breaker.

Please refer to FIG. 8A to FIG. 8F, which are cross-sectional views showing the structures formed at various stages of the method for manufacturing a package structure of a laser device according to one embodiment of the present disclosure.

Figure 8A:
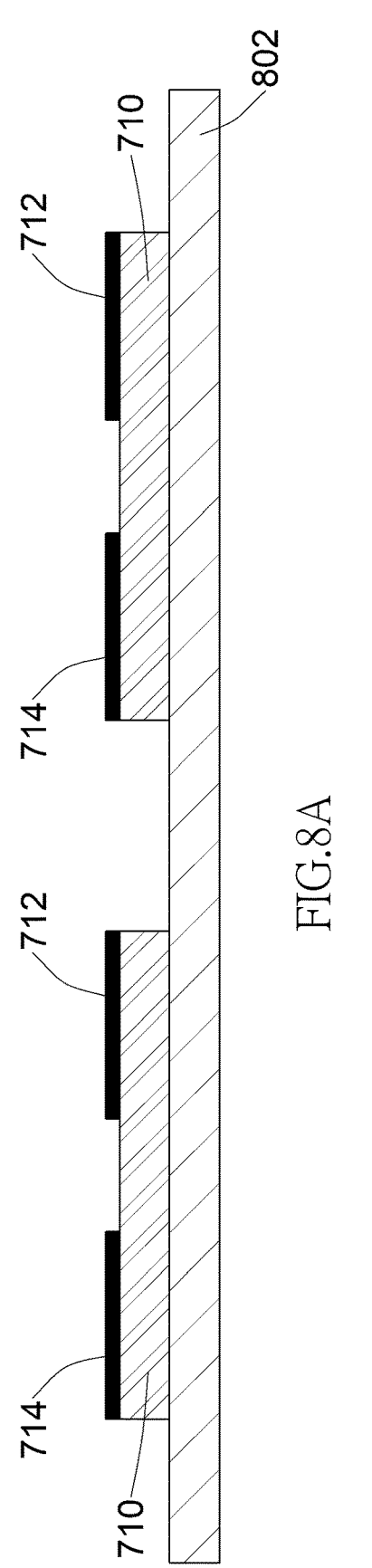
FIG. 8A to FIG. 8F are cross-sectional views showing the structures formed at various stages of the method for manufacturing a package structure of a laser device according to one embodiment of the present disclosure.
Figure 8B:
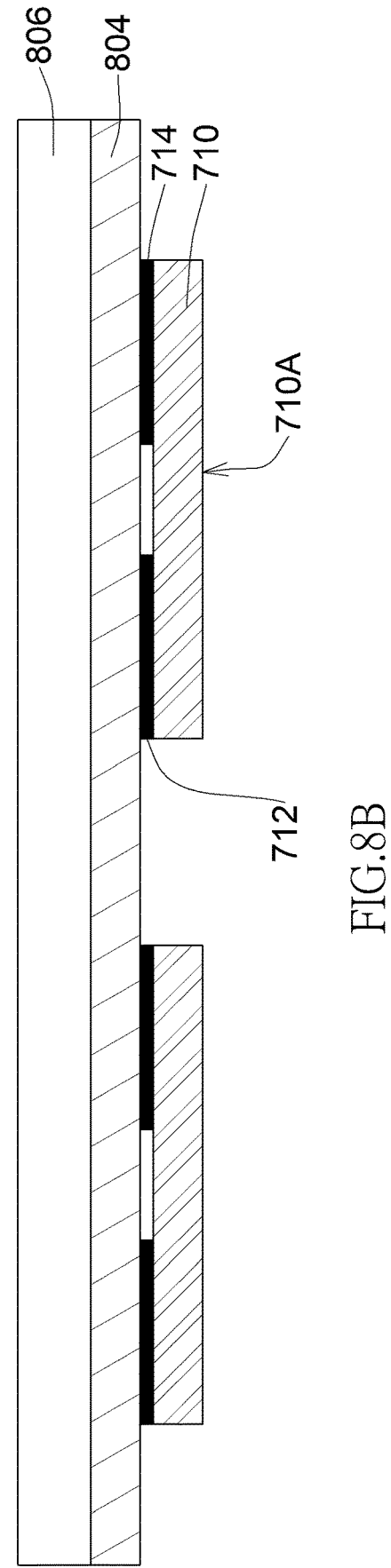

In this embodiment, the chip scale package (CSP) structure of a VCSEL component is attained by the WLP process. First, as shown in FIG. 8A, multiple laser chips 710 are arranged in a tape 802. The respective laser chip 710 is provided with a first conductive structure 712 and a second constructive structure. Then, as shown in FIG. 4B, the arrangement is transferred to be inversely positioned on a glass plate 806 covered with a tape layer 804, and the tape 802 is removed to expose the first surface 710A of the laser chip 710.

Figure 8C:
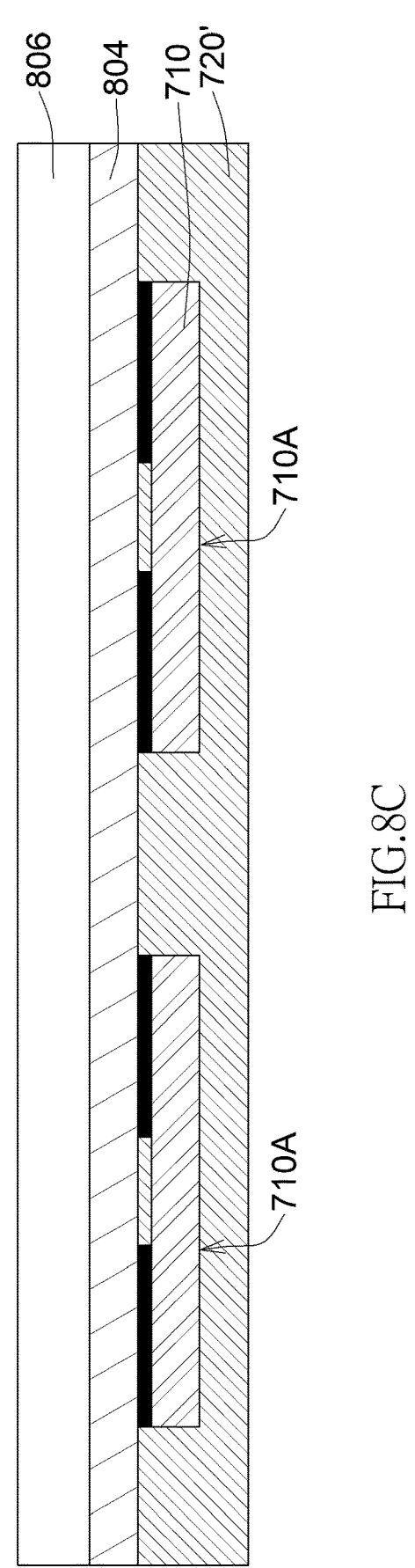
Figure 8D:
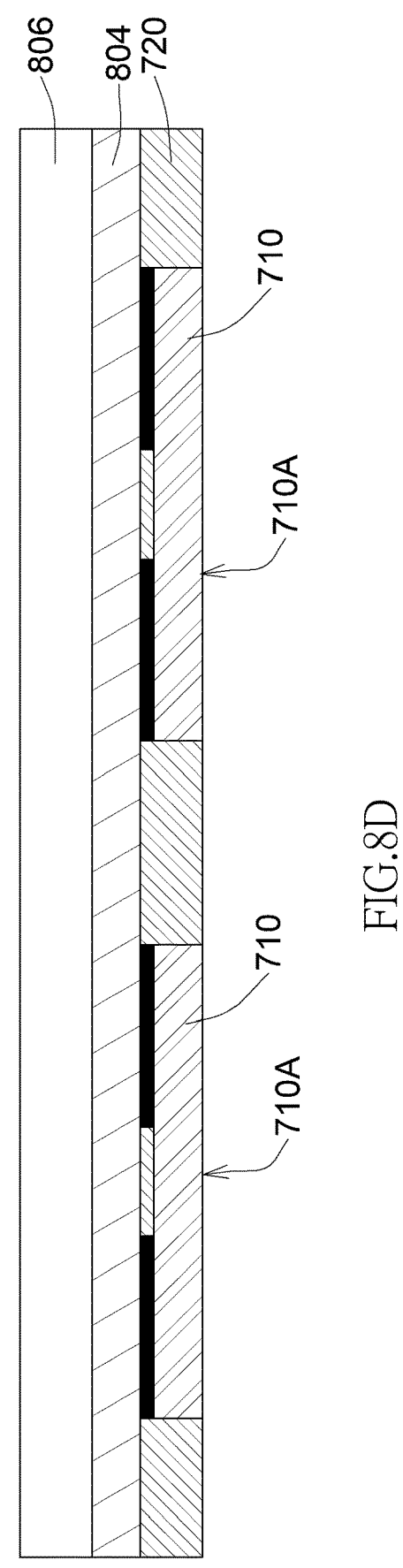

Subsequently, the formed structure is filled with the encapsulating layer 720' by such as brushing to make the respective laser chip 710 be covered with the encapsulating layer 720', as shown in FIG. 8C. Then, the encapsulating layer 720' on the surface of laser chip 710 is removed by such as polishing and/or sandblasting, and thus the structure as shown in FIG. 8D is formed. As shown, after the encapsulating layer 720' is partially removed, the layer 720 enclosing the laser chip 710 at the four side faces thereof is formed, while the layer 720 has a surface coplanar with the surface of the laser chip 710.

Figure 8E:
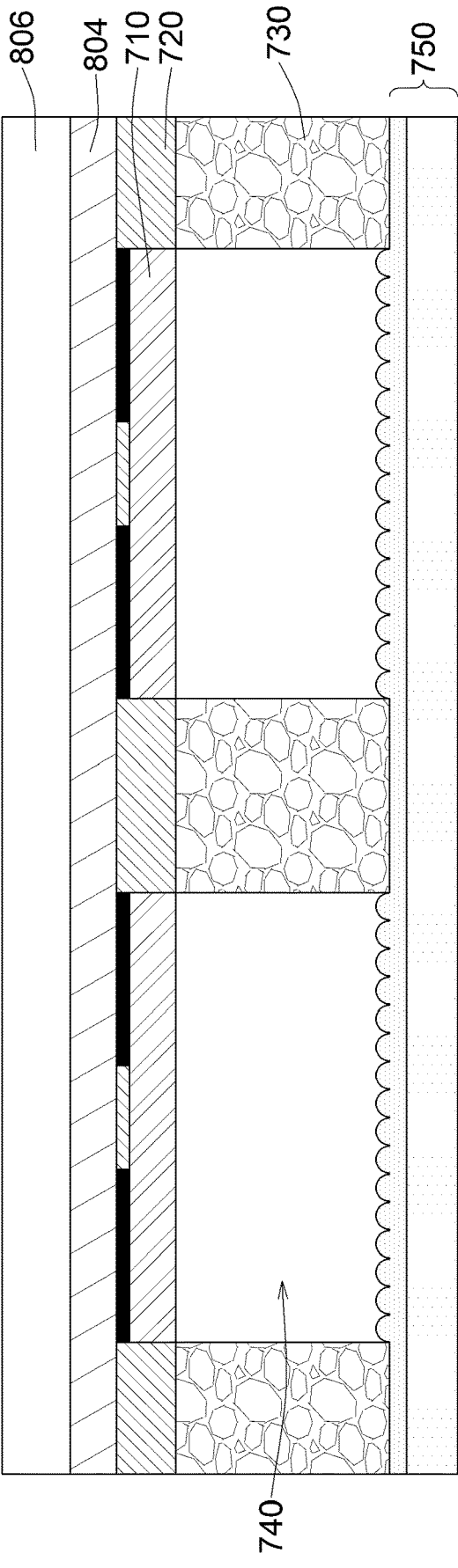

Subsequently, by mean of wafer-bonding, the spacer 730 and the optical component 750 are disposed on the structured as shown in FIG. 8D and connected thereto, to form the structure as shown in FIG. 8E. In this exemplary embodiment, the encapsulating layer 720' is polished to be the layer 720, which is coplanar with the laser chip 710 and enclosing the laser chip 710 at the four side faces. Thereby, the cavity 740 (or the so-called air layer) of the package structure is formed.

Figure 8F:
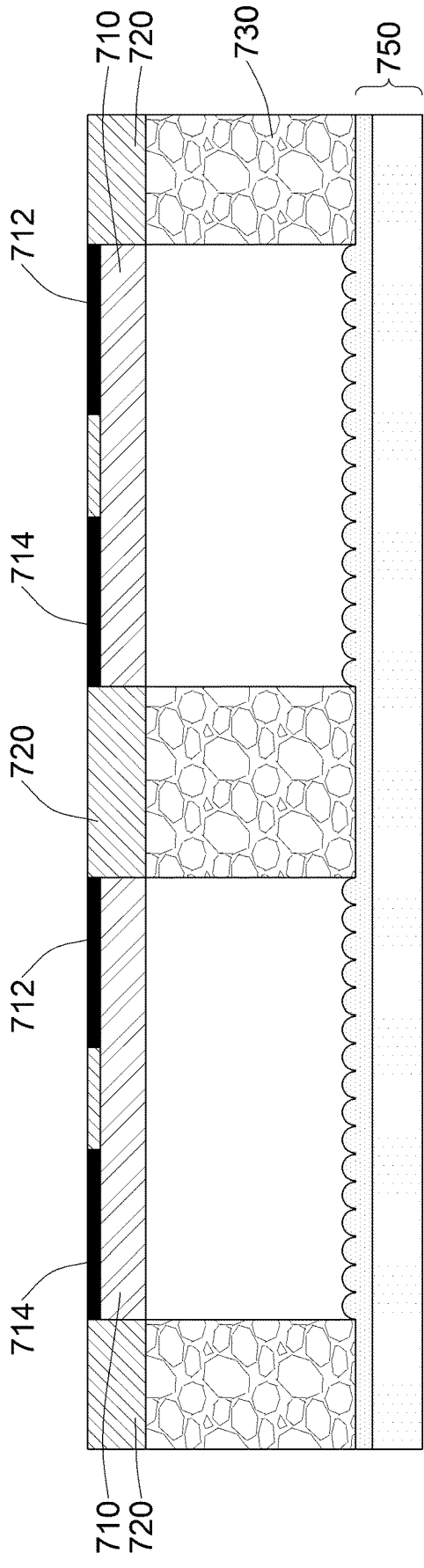

Afterward, the tape layer 804 and the glass plate 806 are removed, forming the structure as shown in FIG. 8F.

Then, the structure as shown in FIG. 8F is singulated into multiple individual structures, so as to form the laser chip package structure 70 of the present disclosure as shown in FIG. 7. The optical component 750 of the package structure 70 is electrically connected to the external circuit board 72 by an external wiring structure 770. The structure as shown in FIG. 7 is thus attained.

Alternatively, when forming the encapsulating layer 720 as shown in FIG. 8D, it is applicable to use the stencil printing to fill the slot or gap between the laser chips 710 with the encapsulating layer 720' to form the layer 720. The stencil is designed to mask the laser chips 710, so as to avoid the encapsulating layer from contacting the upper surface 710A of the laser chip 710.

Figure 9A:
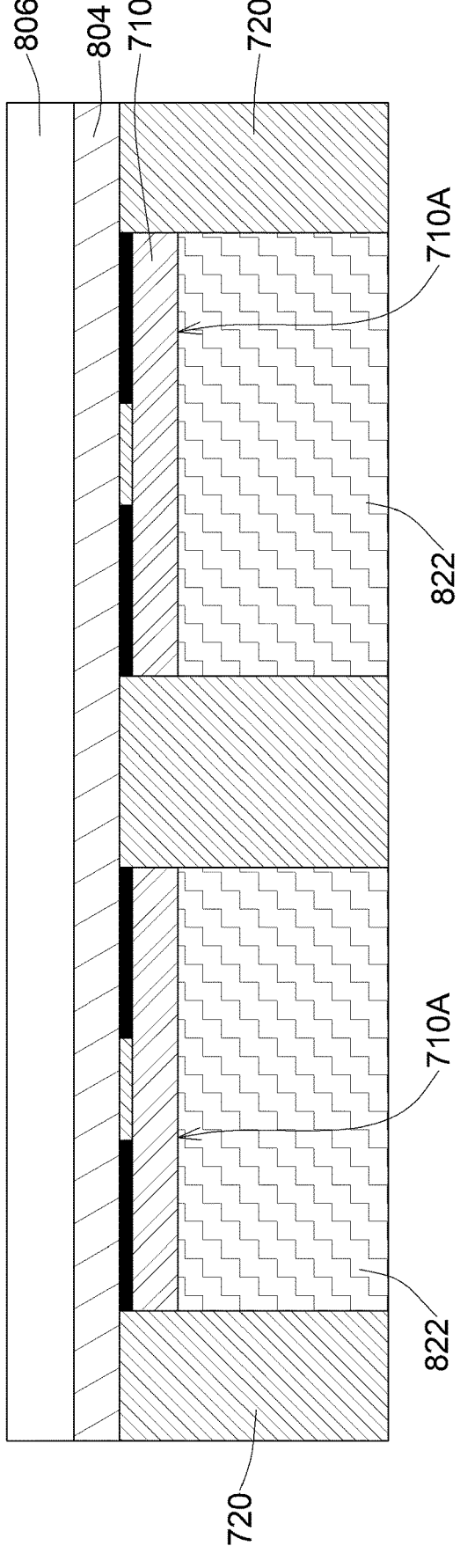
FIG. 9A to FIG. 9C are cross-sectional views showing the structures formed at various stages of the method for manufacturing a package structure of a laser device according to another embodiment of the present disclosure.
Figure 9B:
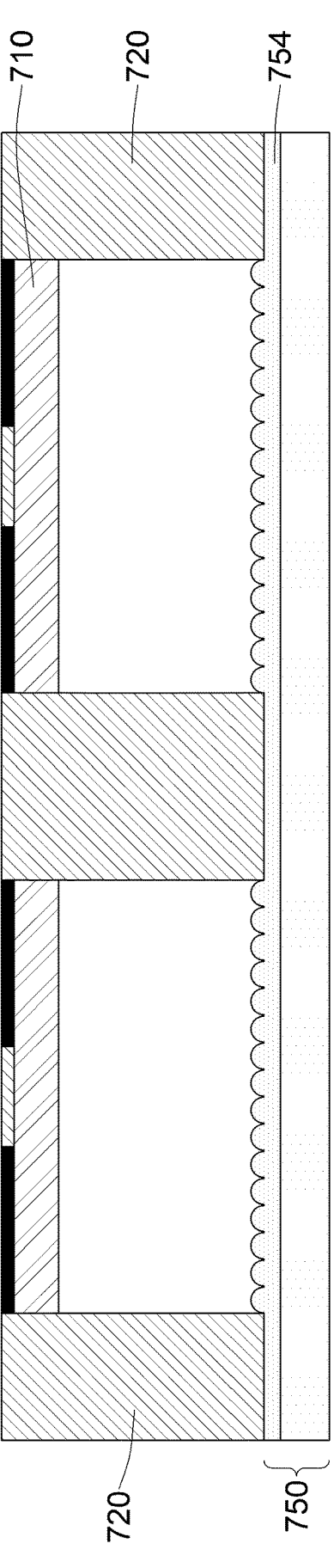
Figure 9C:
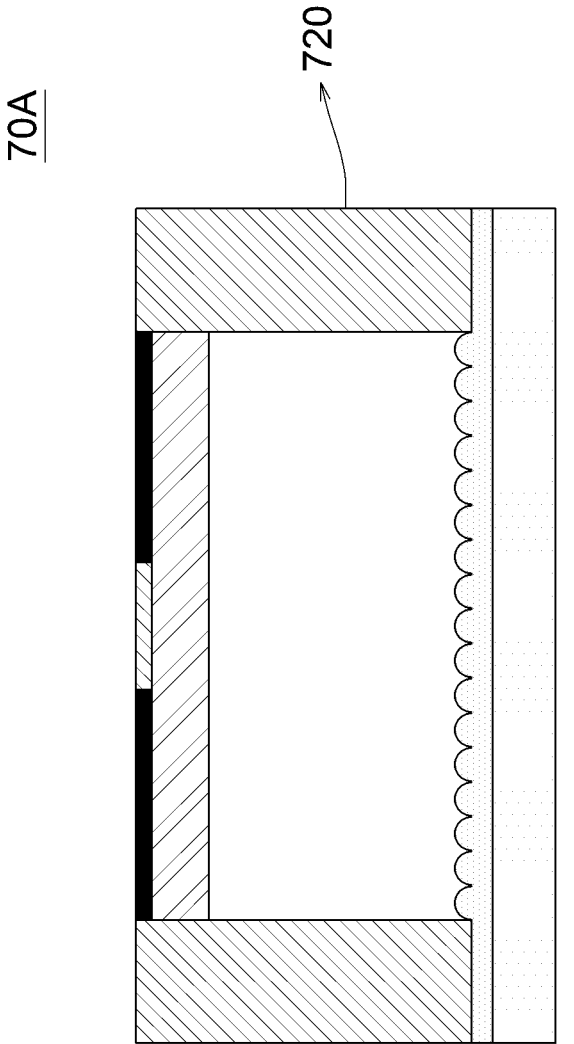

FIG. 9A to FIG. 9C schematically show the method for manufacturing a package structure of a laser device according to another embodiment of the present disclosure. As shown in FIG. 9A, a protection layer (such as a dry film) 822 is disposed on the upper surface 710A of the laser chip 710, and the portions to be filled with encapsulating layer are opened by means of exposure developing, then being filled with the encapsulating layer to form the encapsulating layer 720. Afterward, the overflowed encapsulating layer is removed by polishing. After further removing the protection layer 822, the optical component 750, having a patterned structure layer 754 for optical purpose thereon, is connected to the encapsulating layer 720 by alignment bonding. The tape layer 804 and the glass plate 806 are subsequently removed, to form the structure as shown in FIG. 9B. Then the structure as shown in FIG. 9B is singulated into individual structures to form the laser chip package structure 70A, as shown in FIG. 9C.

Figure 10A:
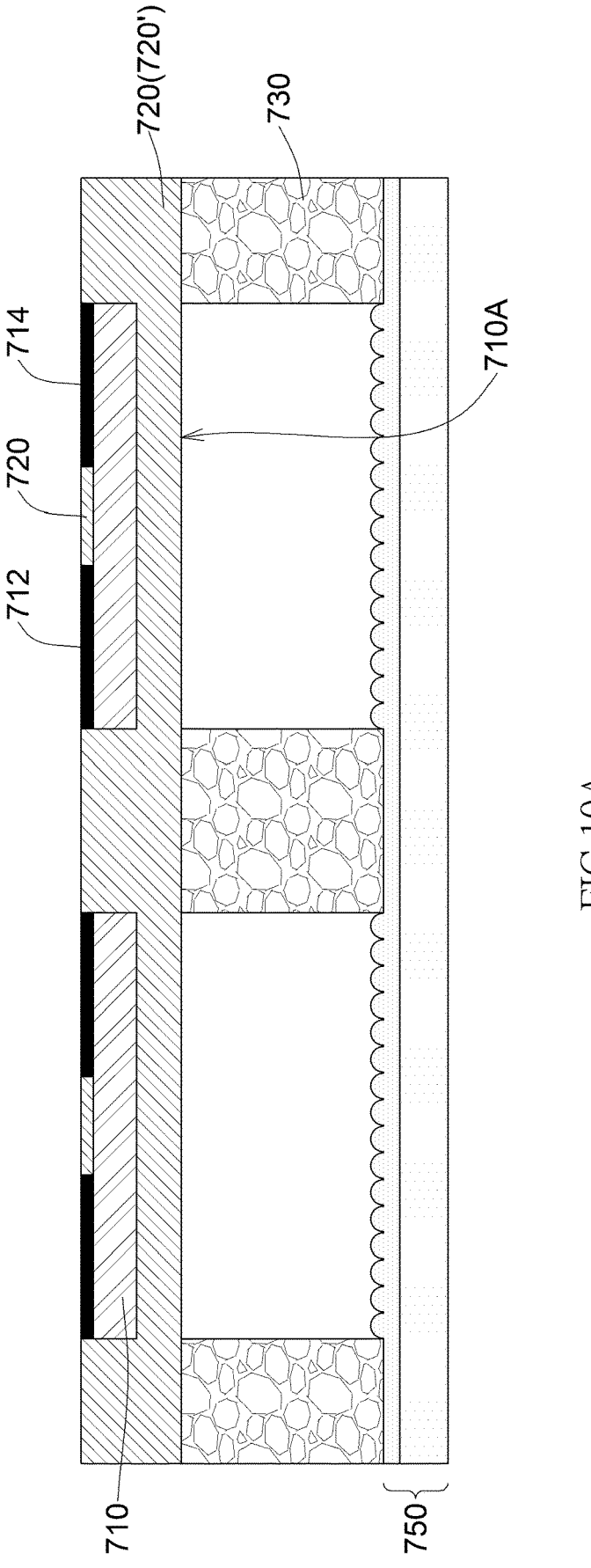
FIG. 10A and FIG. 10B are cross-sectional views showing the structures formed at various stages of the method for manufacturing a package structure of a laser device according to a further embodiment of the present disclosure.
Figure 10B:
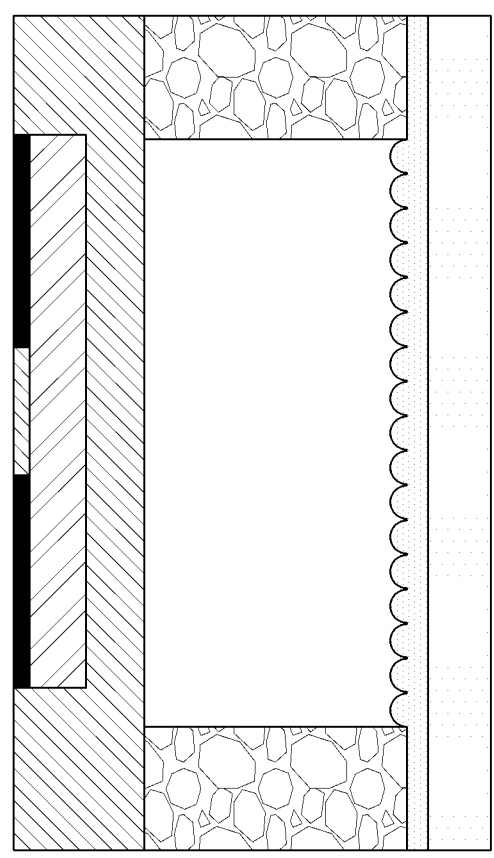

FIG. 10A and FIG. 10B schematically show the method for manufacturing a package structure of a laser device according to a further embodiment of the present disclosure. Following the structure having the encapsulating layer 720' as shown in FIG. 8C, depending on the actual needs, the encapsulating layer 720' over the upper surface 710A of the laser chip 710 is not polished or removed. Instead, the encapsulating layer 720' is reserved for serving as the layer 720. After the spacer 730 and the optical component 750 are connected to the layer 720, and after the tape layer 804 and the glass plate 806 are removed, the structure as shown in FIG. 10A is formed. The formed structure as shown in FIG. 10A is singulated into multiple laser chip package structures 70B, as shown in FIG. 10B.

Figure 11A:
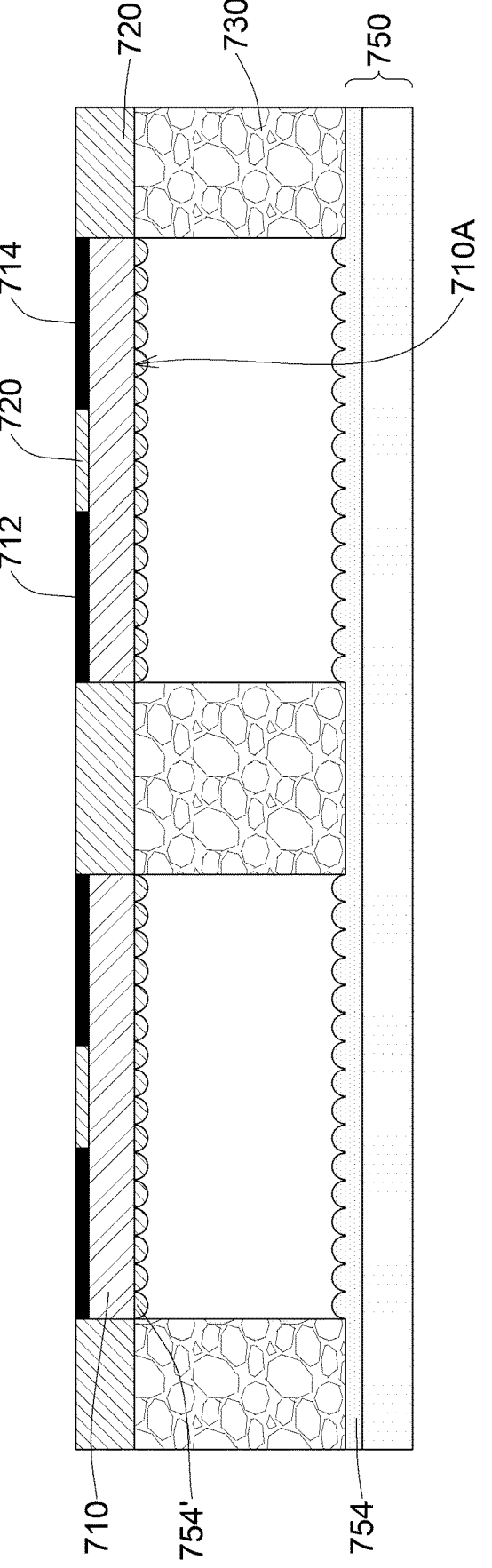
FIG. 11A and FIG. 11B are cross-sectional views showing the structures formed at various stages of the method for manufacturing a package structure of a laser device according to still one further embodiment of the present disclosure.
Figure 11B:
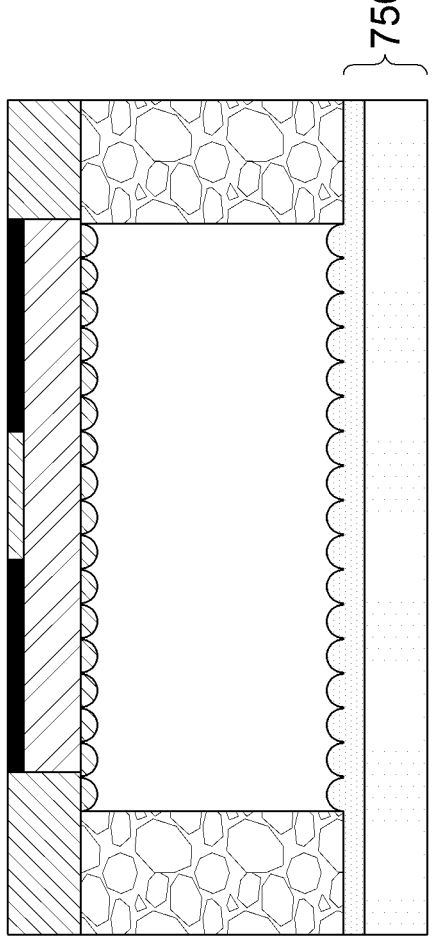

FIG. 11A and FIG. 11B schematically show the method for manufacturing a package structure of a laser device according to still one further embodiment of the present disclosure. Following the structure having the encapsulating layer 720' as shown in FIG. 8C, the encapsulating layer covering the upper surface 710A of the laser chip 70 is patterned to form a patterned structure layer 754' including such as MLA or DOE, which provides functions other than the patterned structure layer 754. For the exemplary illustration, through the patterned structure layer 754', the light emitting from the laser chip 710 can be transformed to a uniform surface source, a dot-matrix source, or a dot source with irregular distribution, as shown in FIG. 11A. Afterward, the formed structure as shown in FIG. 11A is singulated into multiple laser chip package structures 70C, as shown in FIG. 11B.

Figure 12:
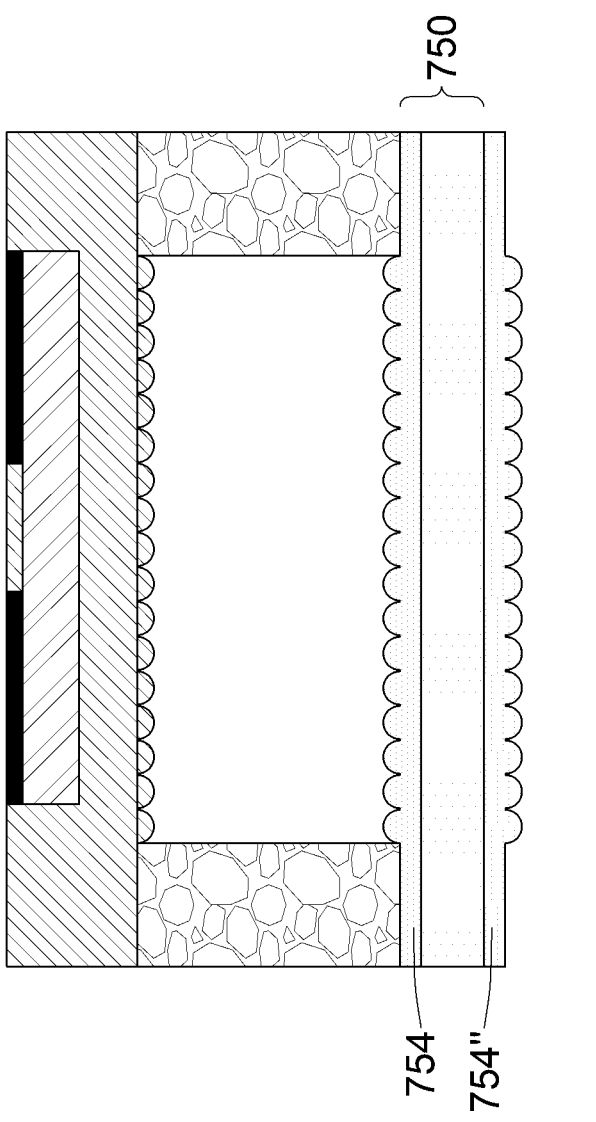
FIG. 12 is a cross-sectional view showing the laser package structure in accordance with the eighth embodiment of the present disclosure.

FIG. 12 is a cross-sectional view showing the laser package structure in accordance with the eighth embodiment of the present disclosure. In this embodiment, a further patterned structure layer 754" is disposed on the outer side surface (the side not having the patterned structure layer 754 thereon) of the optical component 750, to provide the optical functions other than the patterned structure layer 754' and/or the patterned structure layer 754. For the exemplary illustration, through the patterned structure layer 754", the light emitting from the laser chip 710 can be transformed to a uniform surface source, a dot-matrix source, or a dot source with irregular distribution. Afterward, the formed structure is singulated into multiple laser chip package structures 70D, as shown in FIG. 12.

Figure 13A:
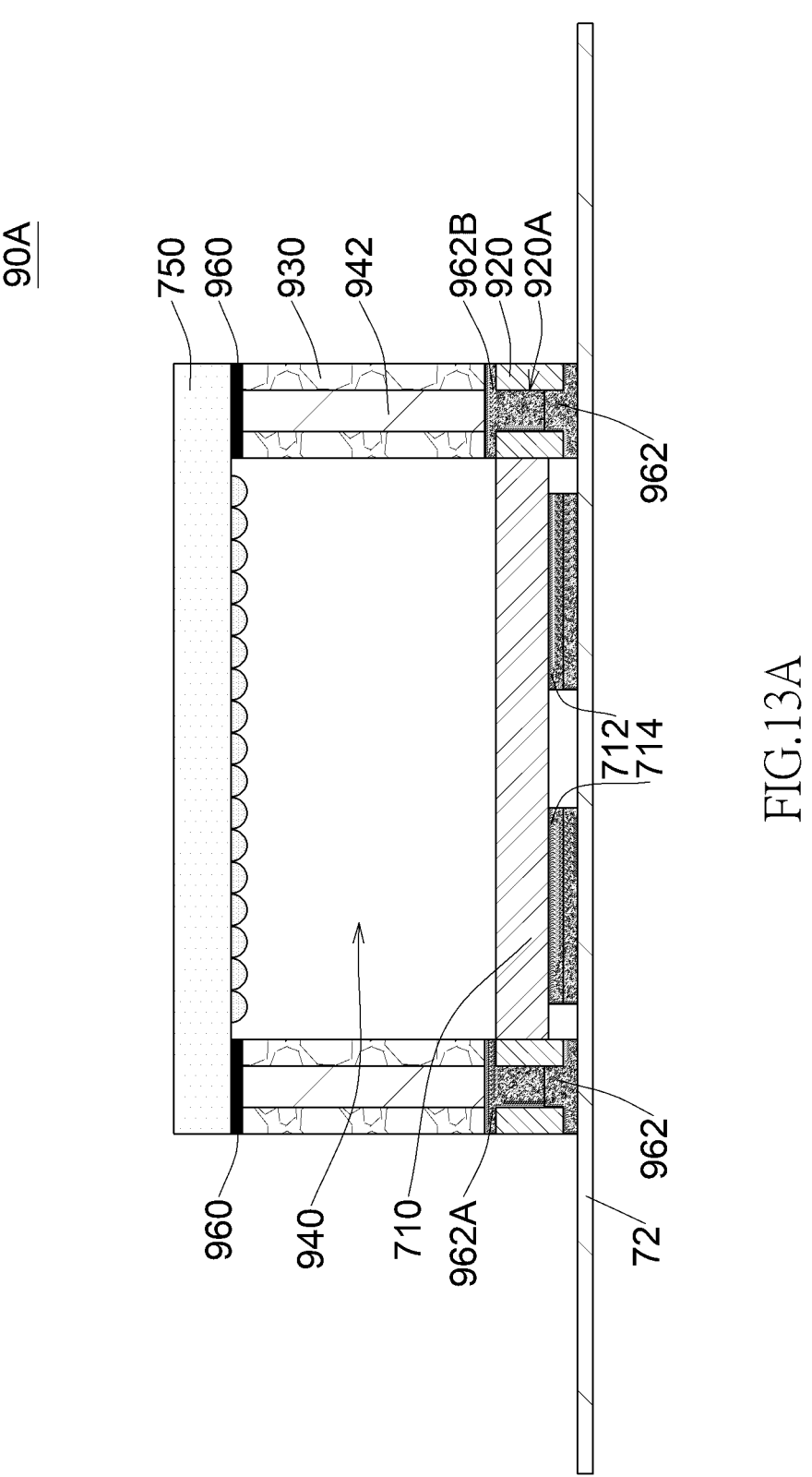
FIG. 13A and FIG. 13B are cross-sectional views showing the laser package structures in accordance with the ninth embodiment and its variant embodiment of the present disclosure.
Figure 13B:
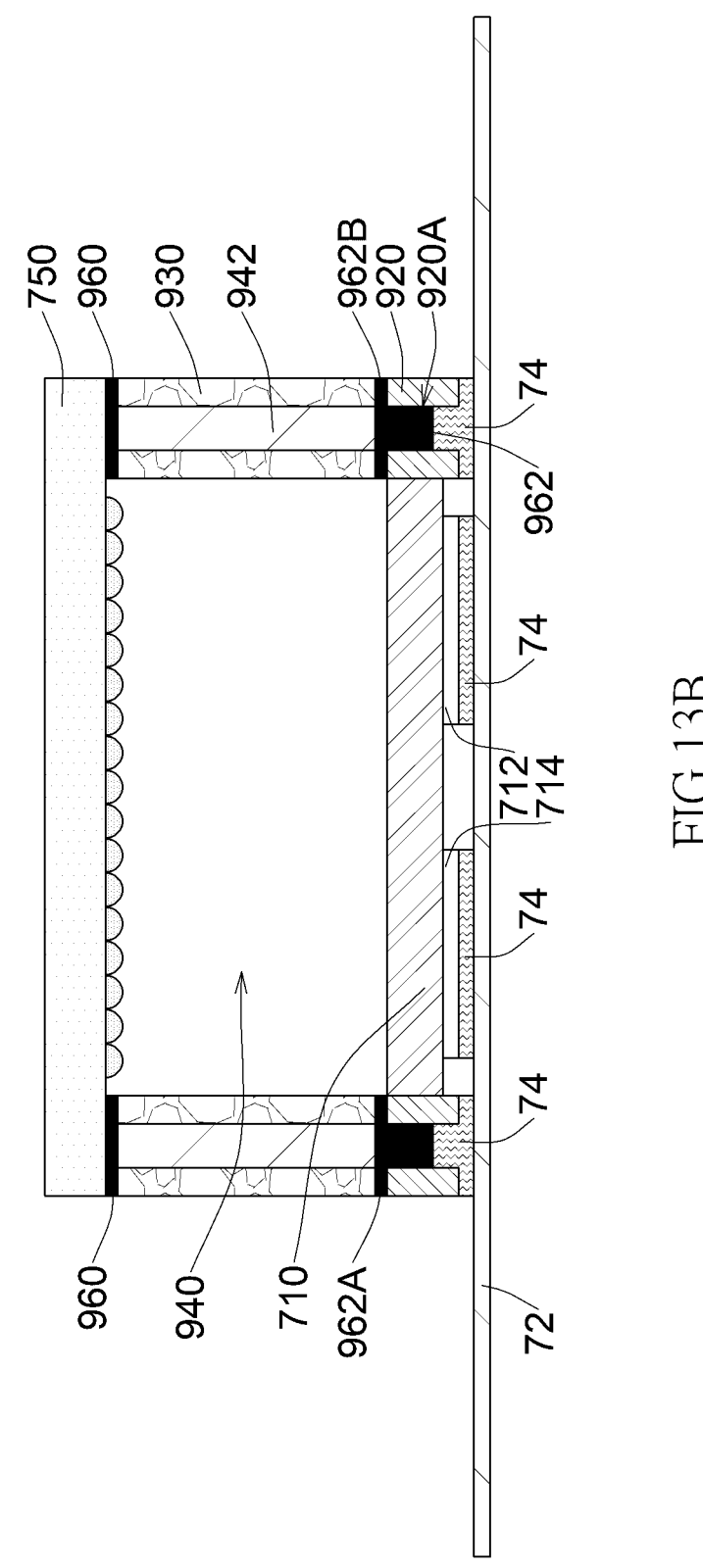
Figure 14A:
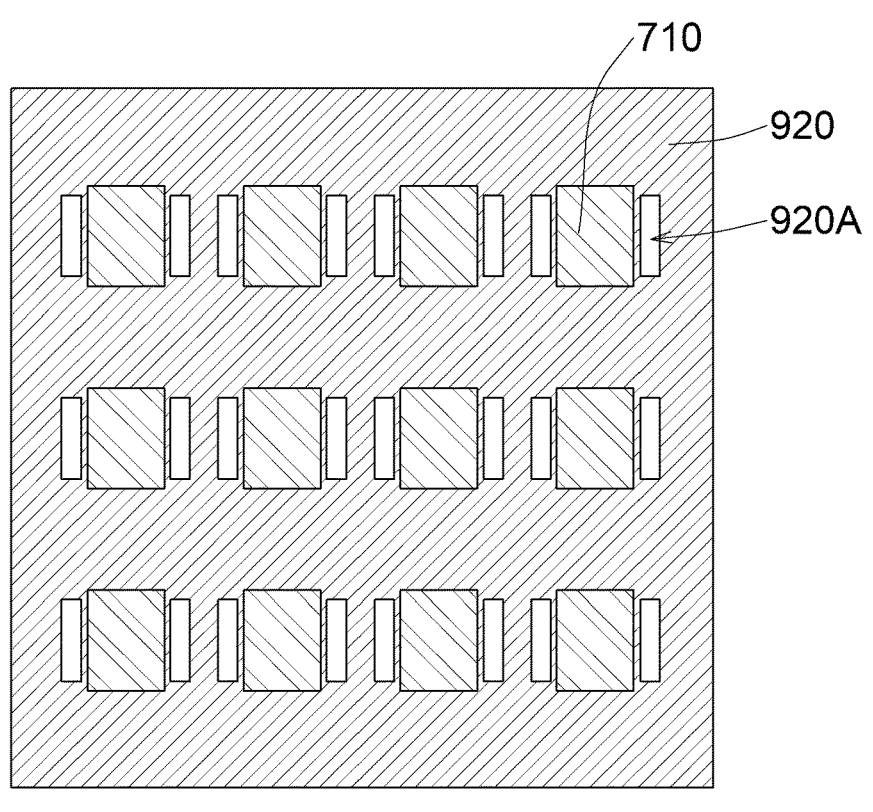
FIG. 14A and FIG. 14B are respectively a top view and a cross-sectional view showing the penetrating portion of the encapsulating layer in accordance with the embodiment of the present disclosure.
Figure 14B:
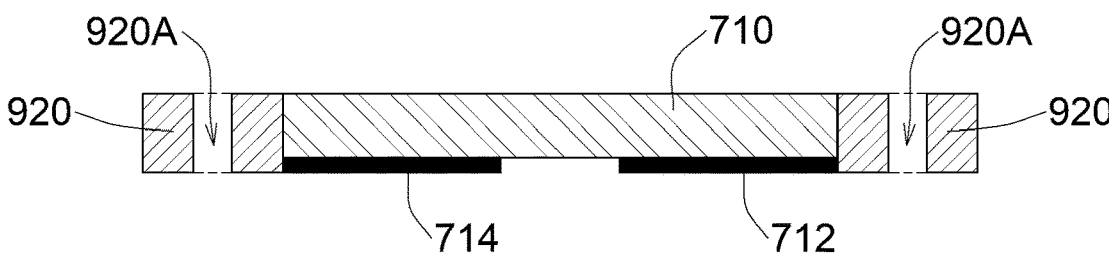

Please refer to FIG. 13A and FIG. 13B. In another embodiment of the present disclosure, the spacer of the package structure may be formed for embedding an electrically conductive structure passing therethrough, so that the spacer is directly provided for electrical conduction. As shown in FIG. 13A and FIG. 13B, which are cross-sectional views showing the laser package structures 90A and 90B in accordance with the ninth embodiment and its variant embodiment of the present disclosure. The package structures 90A and 90B are formed by processes similar to or the same as that for the package structure 70, and have similar construction to the package structure 70. The package structures 90A and 90B are different from the package structure 70 in that, in this embodiment, the spacer 930 enclosing the laser chip 710 and forming the cavity 940 includes an electrically conductive structure 942 passing therethrough. The conductive wire layer of the optical component 750 is connected to the electrically conductive structure 942 by the conductive layer 960. The encapsulating layer 920 is also formed as having a penetrating portion 920A which is corresponding to the electrically conductive structure 942. The penetrating portion 920A is filled with a conductive paste to form the conductive layer 962 that is connected to the conductive structure 942. In this embodiment, the material for the conductive structure 942 and the conductive layers 960, 962A and 962B is selected from the conductive pastes including silver paste, solder paste or SAP (Self Assembly Anisotropic Conductive Paste), or from the metal materials for electroplating such as gold, silver, copper and the alloy of these metals. In this embodiment, the conductive structures 712, 714 of the laser chip 710, and the conductive layers 962A, 962B of the package structure are functioned as positive and negative electrodes, respectively, and are directly connected to the external circuit board 72, forming the package structure 90A as shown in FIG. 13A. Alternatively, the conductive layers 942A, 942B are connected to the external circuit board 72 by an additional solder paste 74, forming the package structure 90B as shown in FIG. 13B. That is, in this embodiment, the optical component 750 of the package structures 90A, 90B are electrically connected to the external circuit board 72 through the conductive layer 960, the conductive structure 942 and the conductive layers 962A, 962B. In the embodiments of FIG. 13A and FIG. 13B, the encapsulating layer 920 has the penetrating portion 920A formed therein, and the position of penetrating portion 920A is corresponding to those of the conductive structure 942 embedded in the spacer 930 and the electrode of the optical component 750. As to the formation of penetrating portion (e.g., the penetrating portion 920A as shown on FIG. 13A and FIG. 13B) in the glue layer, one can adopt the stencil printing to apply the encapsulating layer using the stencil designed as masking the chip and masking the positions corresponding to the electrode of the optical component 750 to avoid the glue from filling therein, forming the penetrating portion 920A of the encapsulating layer. The formed structure is as shown in FIG. 14A (top view) and FIG. 14B (cross-sectional view). After the penetrating portion 920A is filled with the conductive adhesive or paste to form the conductive layer 962, the spacer 930 having the conductive structure 942 and the optical component 750 are connected thereto, to form the laser chip package structures 90A, 90B as shown in FIG. 13A and FIG. 13B. As mentioned, in this embodiment, the optical component 750 of the package structures 90A, 90B are electrically connected to the external circuit board 72 by the conductive structure 942, so that an additional wiring structure to the circuit board is not necessary.

In the present disclosure, referring to the circuit board 22,32, 42, 52, 62, 72 of the foresaid embodiments shown in FIG. 2A to FIG. 13B, the laser chips depicted in those embodiments are carried on the circuit boards 22, 32, 42, 52, 62, 72, therefore, the circuit boards 22, 32, 42, 52, 62, 72 can be regarded as carrier substrates for carrying those laser chips/laser elements.

In the present disclosure, the encapsulating layer and/or conductive adhesive or paste are applicable by means of stencil printing, thereby forming the encapsulating layer and the conductive layer of the package structure, respectively. In such a manner, not only the amount of glue or paste is better controlled, but also the UPH (Units Per Hour) for the process is improved, resulting in a significant decrease in the cost. Besides, since the glue or paste may be pressed to fill in during the stencil printing process, it may be applicable to preserve a certain space around the laser chip 710 for the conductive adhesive or paste (such as solder paste) to fill in. The conductive layer 962 (as shown in FIG. 13A) or the solder paste 74 (as shown in FIG. 13B) may connect to the electrode (not shown) of the external circuit board 72 to form a conducting circuit in a subsequent SMT (Surface Mounting Technology) process.

Figure 15B:
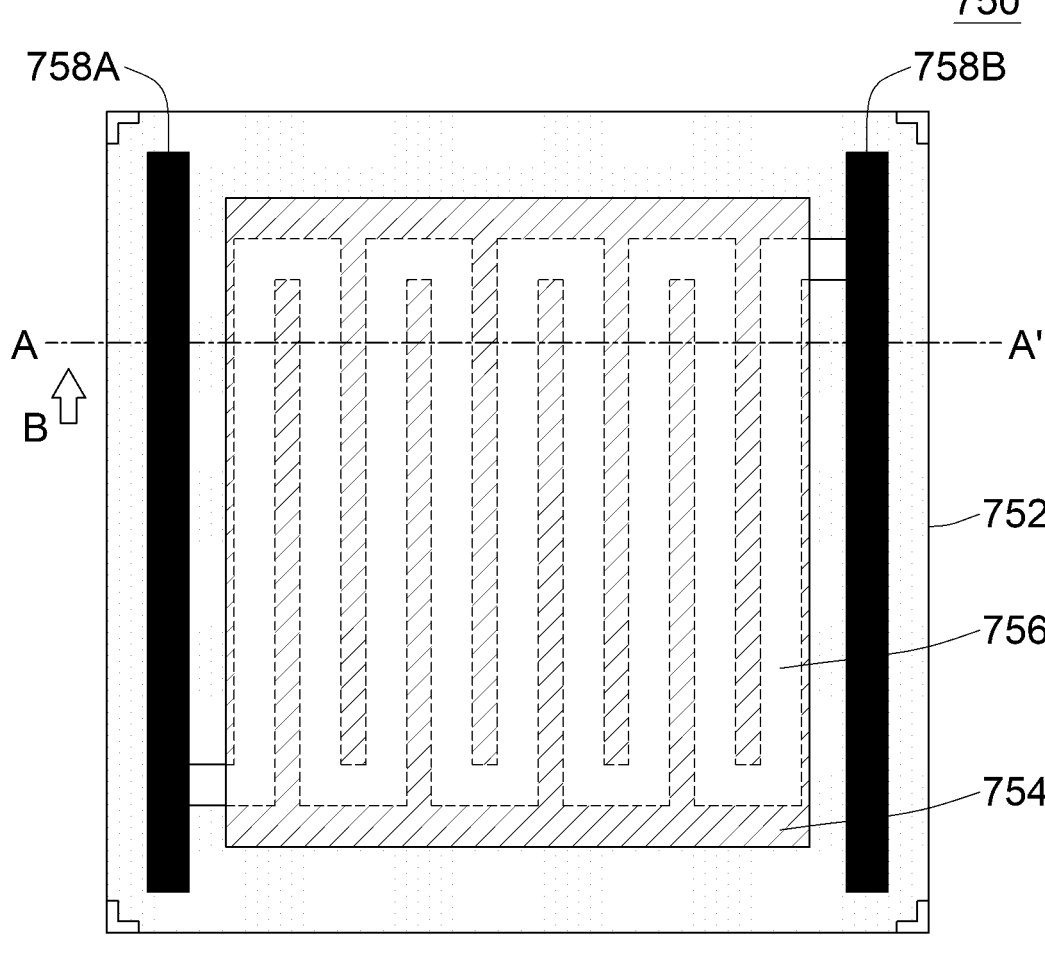

Please refer to FIG. 15A to FIG. 15G, which are cross-sectional views and top views showing the optical component of one embodiment of the present disclosure. Among these figures, FIG. 15A is a cross-sectional view schematically showing the structure in the cross section taken along line A-A' of FIG. 15B, viewing from the direction B. In this embodiment, the optical component 750 includes a base layer 752, a patterned structure layer 754 disposed on the base layer 752 facing toward the laser chip, and a conductive wire layer 756 disposed between the base layer 752 and the patterned structure layer 754. As shown in FIG. 15B, the conductive wire layer 756 is further connected with the first wire portion 758A and the second wire portion 758B in the periphery of the base layer 752, while the first wire portion 758A and the second wire portion 758B are not physically connected to each other, but are electrically connected to each other via the conductive wire layer 756. The first wire portion 758A and the second wire portion 758B are disposed on two opposite sides of the periphery of the base layer 752.

In the embodiment, the material of the base layer 752 can be glass, sapphire, silicon carbide (SiC), polymer, silicon, gallium arsenide (GaAs), etc., or combination thereof, but the invention is not limited to this.

Figure 15C:
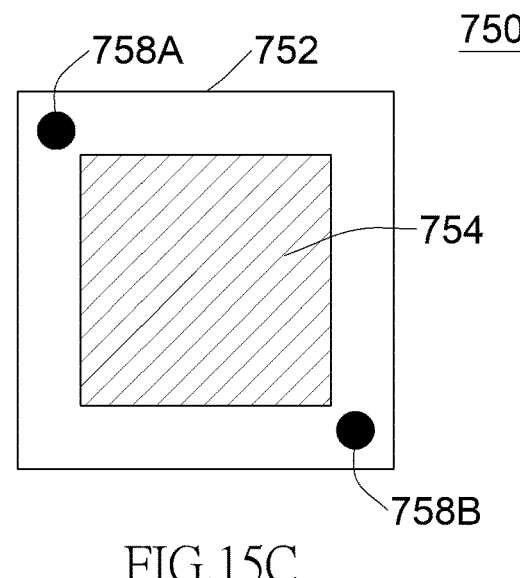
Figure 15D:
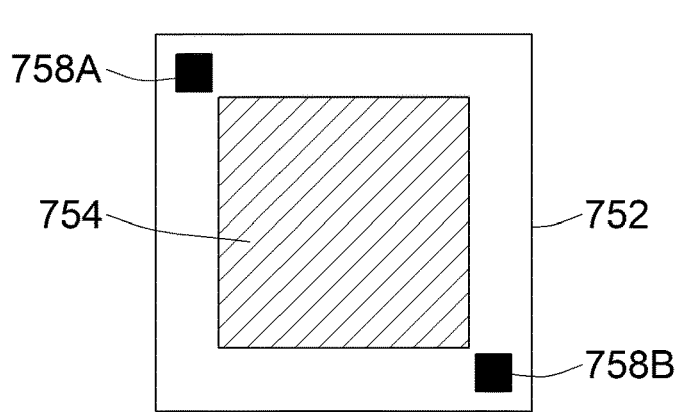
Figure 15E:
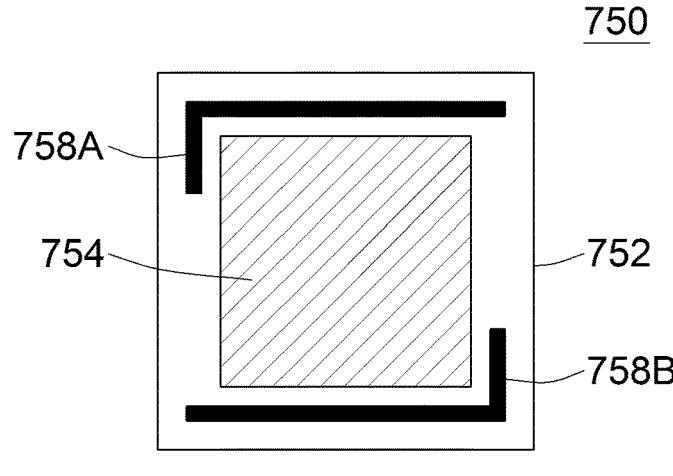
Figure 15F:
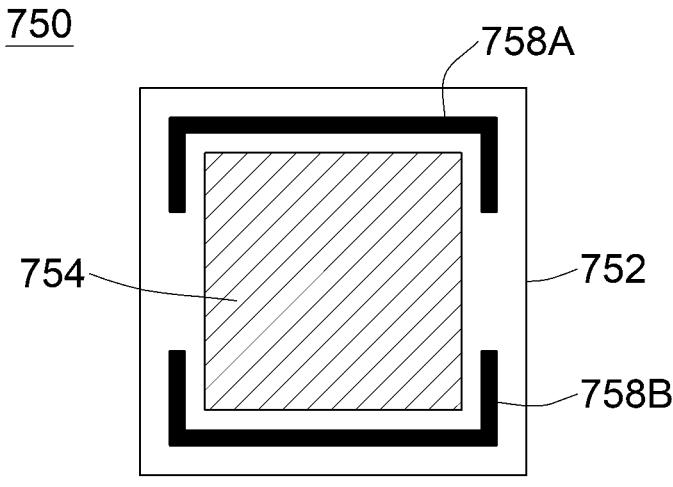
Figure 15G:
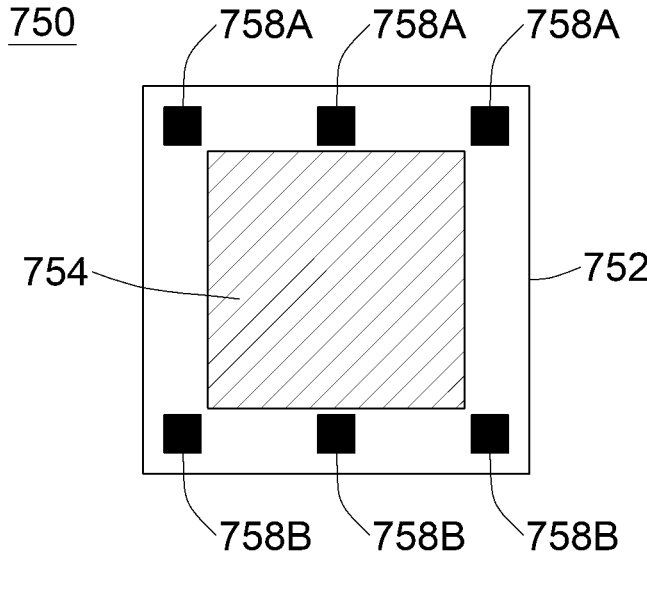

In one embodiment, the first wire portion 758A and the second wire portion 758B are formed by electroplating or by coating the conductive material. The conductive material includes copper, silver, gold, tin and the like. Besides, as shown in FIG. 15B, the first wire portion 758A and the second wire portion 758B are designed as linear (as shown in FIG. 15B), circular (as shown in FIG. 15C), square (as shown in FIG. 15D), L-shaped (as shown in FIG. 15E), U-shaped (as shown in FIG. 15F), or the combination thereof. Further, the amount of the first wire portion 758A and the second wire portion 758B is not limited. That is, multiple first wire portions 758A and multiple second wire portions 758B may be disposed on the opposite sides of the base layer 752, respectively, as shown in FIG. 15G.

In aforesaid embodiments, the optical component 750 includes but not limited to MLAs, ITO glasses having conductive wiring, and DOEs. In one embodiment, the optical component 750 may be a hybrid optical component. That is, the patterned structure layer 754 is provided with various patterns for forming the respective lens structures, such as MLAs and DOEs, to simultaneously transform the laser into different configurations, such as a uniform surface source, a dot-matrix source, or a dot source with irregular distribution.

In the above-mentioned embodiments, the laser chip 710 is a chip of flip chip type. The encapsulating layers 720, 920 and the encapsulating layer 720' are formed by either transparent or opaque materials, such as epoxy or silicon. The spacers 730, 430 are formed by such as glass, ceramics, or plastic by 3D printing or molding. The spacers 730 and 930 are housings or supports, which are respectively arranged on the surface of the layers 720 and 920 and surround the laser chip 710 to form a compartment.

Figure 16:
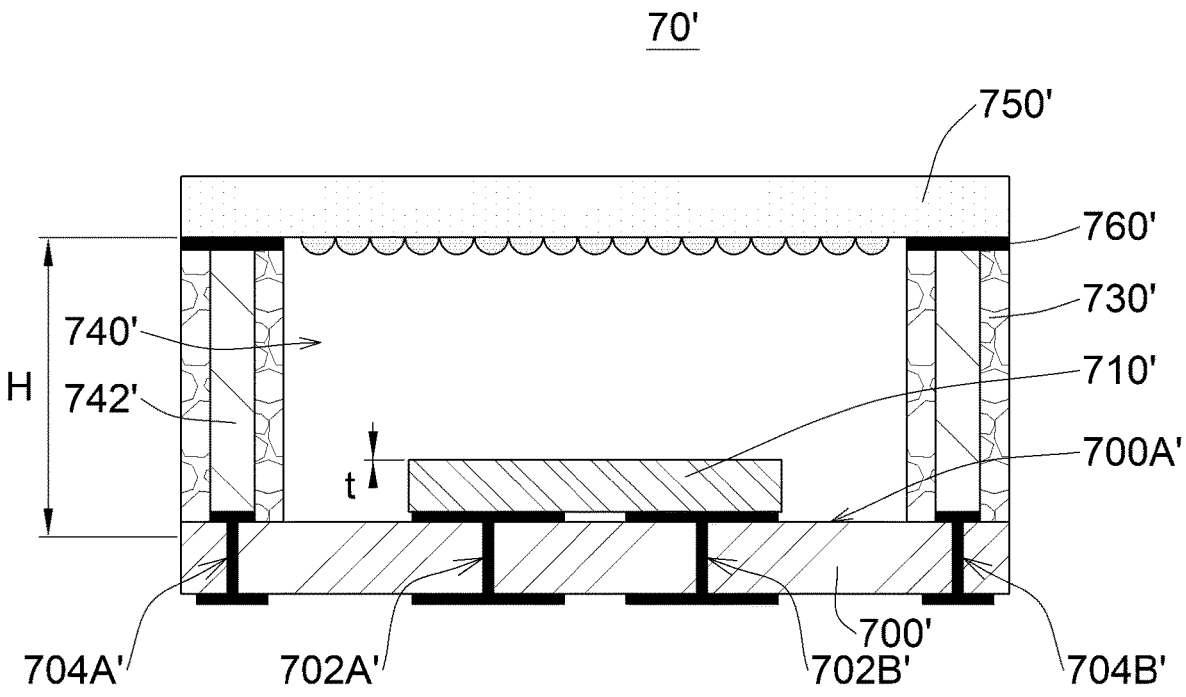
FIG. 16 is a cross-sectional view showing the laser package structure in accordance with the tenth embodiment of the present disclosure.

Please refer to FIG. 16, which is a cross-sectional view showing the laser package structure in accordance with the tenth embodiment of the present disclosure. The package structure 70' of the present disclosure includes a substrate 700' and a laser chip 710' disposed on the first surface 700A' of the substrate 700'. The substrate 700' may be a ceramic substrate. The substrate 700' can have conductive structures therein, for example, the substrate 700 includes the first electrically conductive posts 702A', 702B' and the second electrically conductive posts 704A', 704B' penetrating the substrate 700'. The first conductive posts 702A', 702B' are connected to the laser chip 710', and are functioning as a positive electrode and a negative electrode, respectively, for electrical connection to external. The package structure 70' includes the housing 730', which is disposed on the first surface 700A' and enclosing the laser chip 710'. The height H of the housing 730' is greater than the thickness t of the laser chip 710', so that a cavity 740' is formed. The cavity 740' serves as an air layer of the package structure 70' in which an inert gas or the air may be filled, or may be evacuated. The package structure 70' includes the optical component 750'. The optical component 750' is connected to the housing 730' by the conductive structure 760' that is formed by the conductive paste applied on the housing 730'. In this embodiment, the optical component 750' is an ITO optical component with conductive wiring.

According to the present disclosure, the housing 730' is formed by such as plastic injection molding, cast molding, 3D printing etc., and is formed as having an electrically conductive structure 742' vertically penetrating therethrough. Thereby, the optical component 750' can be connected to the second conductive posts 704A', 704B, which are penetrating the substrate 700', by the conductive structure 742' to form the electrical connection as positive and negative, respectively. The material of the conductive structure 760' may be silver paste, solder paste, SAP, or other conductive materials.

According to the present disclosure, the housing 730' is formed by such as plastic injection molding, cast molding, 3D printing etc. The housing 730' embeds the conductive structure 742', and is applied with the conductive paste, such as silver paste, solder paste or SAP, to adhere the optical component 750'. The optical component 750' is electrically connected to the second conductive posts 704A', 704B' of the underlayer substrate 700' through the conductive structure 760' and the conductive structure 742' embedded in the housing 730'. Alternatively, the housing 730' may be formed by the LDS (Laser Direct Structuring) process, and the circuit layer or the conductive structure 760' may be formed by a metal coating that is formed using electroplating or coating. Thereby the electrical connection to the optical component 750' and to the underlayer substrate 700' is established.

According to the present disclosure, the conductive structure 760' applied on the housing 730' may be formed as one of linear, circular, square, L-shaped, U-shaped or the combination of the foresaid. Besides, the amount of conductive structure disposed on one side of the housing 730' is not limited. That is, there may be multiple conductive structures disposed on the respective side of the housing. The shape (in a top view) of the conductive structure is corresponding to those as shown in FIG. 11B to FIG. 11G.

The optical component 750' has the similar construction to that as shown in FIG. 15A, and is not repeatedly illustrated herein for brevity.

Please refer to FIG. 17A to 17C, and FIG. 18A to FIG. 18D, which are cross-sectional views and top views showing the housings of the respective embodiments of the present disclosure.

Figure 17A:
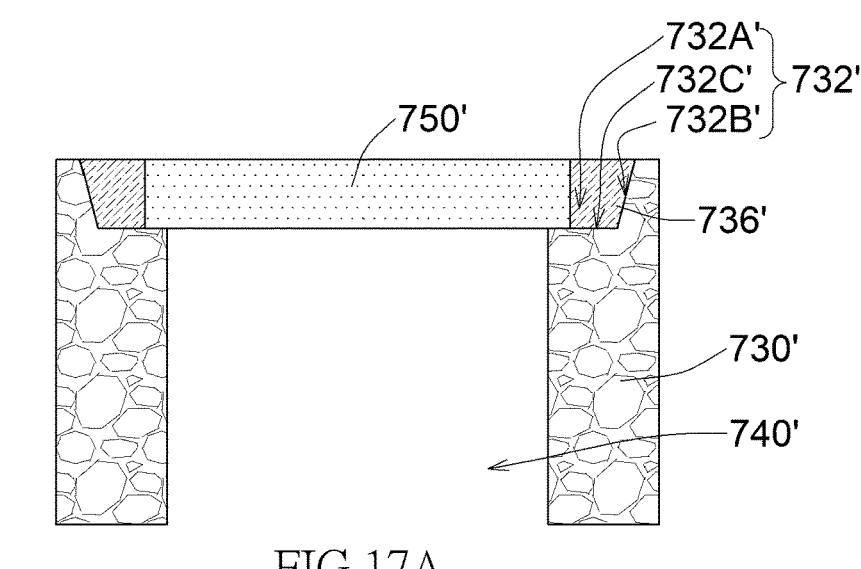
FIG. 17A to FIG. 17C shows the housing in the cross section taken along line A-A' of FIG. 14A.
Figure 17B:
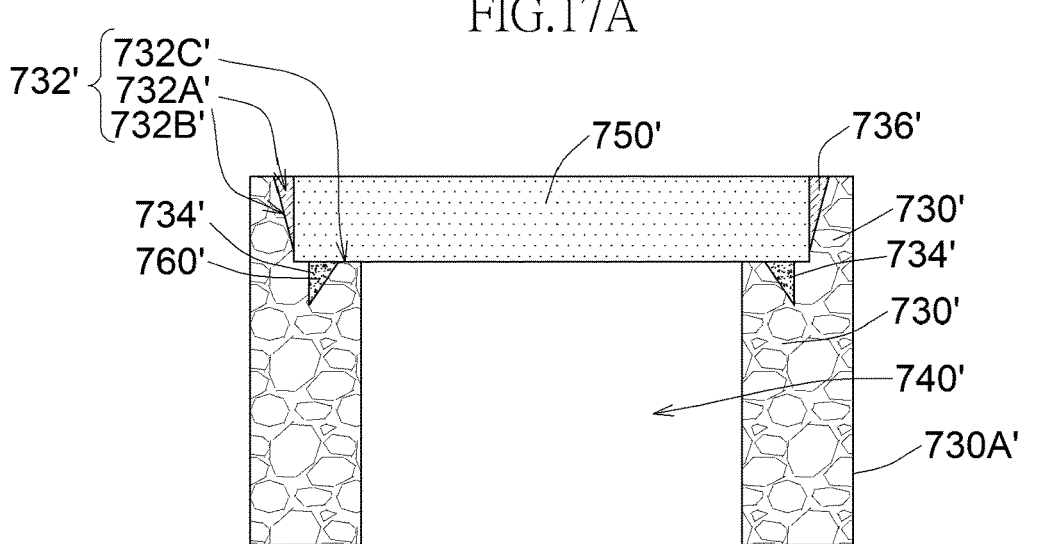

FIG. 17A and FIG. 17B shows the housing of the present disclosure in the cross section taken along line A-A' of FIG. 14A, viewing from the direction B. As shown in FIG. 17A, according to the present disclosure, the housing 730' is a structure formed of four sidewalls enclosing the laser chip, with each sidewall embedding a respective conductive structure (not shown) penetrating therethrough.

As shown in FIG. 17A, the housing 730' has a positioning portion 732' formed on the top side (in relative to the side connected to the underlayer substrate) thereof. The positioning portion 732' serves for containing the optical component 750' and making the optical component 750' be held in position therein. In this embodiment, the positioning portion 732' is formed as a recess having a bottom 732C' for positioning the optical component 750', and an inclined plane 732B' connecting to the bottom 732C' and tapered toward the bottom of the housing 730'. The contour of the positioning portion 732' is corresponding to, and even slightly greater than, the optical component 750'. The gap 732A' between the inclined plane 732B' and the optical component 750' is filled with sealant (the sealing layer 736'). It is advantageous that the inclined plane 732B' helps the sealant (such as the sealing layer 736') to fill in the positioning portion 732' to seal the cavity 740' of the package structure.

In one embodiment, as shown in FIG. 17B, the housing further includes a guide groove 734' formed on the top side of the housing 730' in addition to the positioning portion

732'. The guide groove 734' is formed extending from the bottom 732C' to the bottom of the housing 730' for the filling of conductive adhesive or paste (such as silver paste, solder paste, SAP and the like). The optical component 750' is electrically connected with the conductive structure (not shown) embedded in the housing 730' by the conductive structure 760'. As shown in FIG. 17B, after the optical component 750' is positioned on the bottom 732C' of the positioning portion 732', the gap 732A' formed between the optical component 750' and the inclined plane 732B' of the positioning portion 732' and the guide groove 734' having the conductive paste filled therein are isolated from each other and thus not connecting to each other. In this embodiment, the gap 732A' between the optical component 750' and the inclined plane 732B' is filled with paste or glue, such as transparent paste or glue, thereby forming the sealing layer 736' for sealing the cavity 740' of the package structure.

Figure 17C:
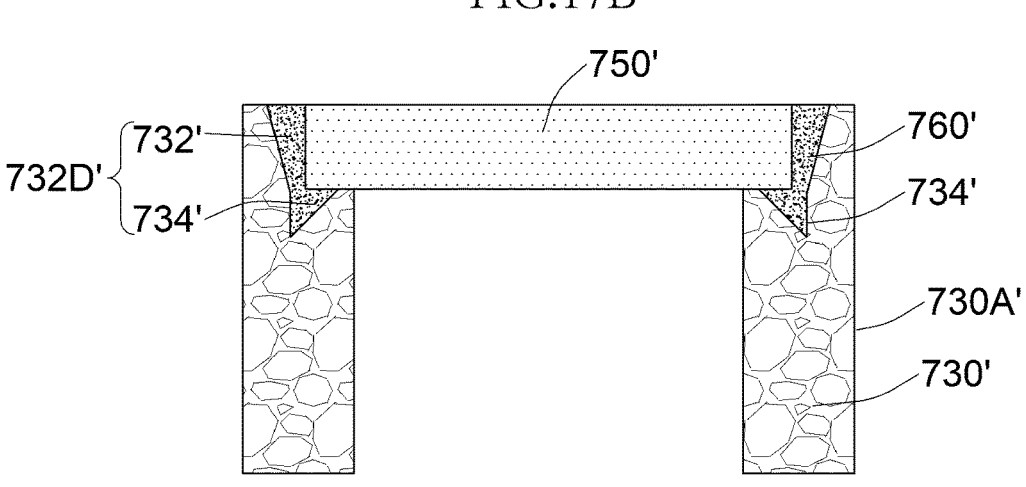

Alternatively, as shown in FIG. 17C, the guide groove 734' and the positioning portion 732' can be designed to forming a connecting space 732D' after the optical component 750' is positioned. In this embodiment, the filling procedure is carried out only one time, and the conductive paste (such as silver paste) is able to be fill in the positioning portion 732' and the guide groove 734' of the housing 730' to form the conductive structure 760'.

Figure 18A:
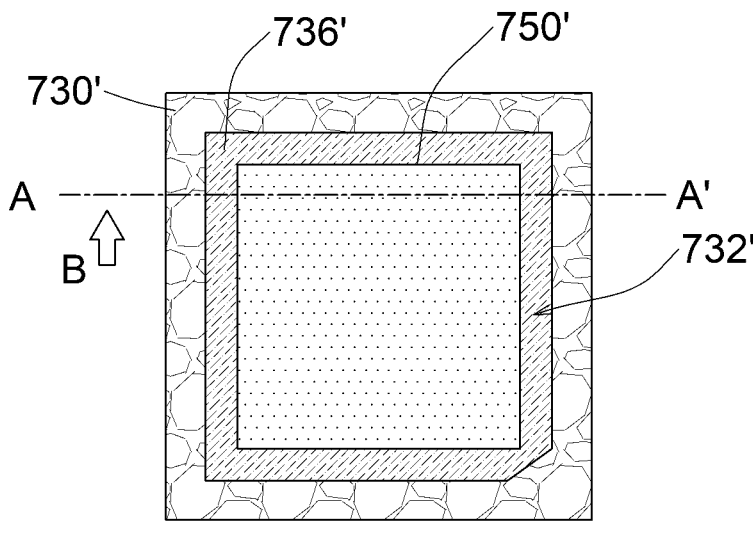
FIG. 18A to FIG. 18D are top views showing the housings of the respective embodiments of the present disclosure.

Please refer to FIG. 18A, which is a top view showing the housing as shown in FIG. 17A and FIG. 17B. In the housing 730' as shown in FIG. 17A, the shape of the positioning portion 732' is corresponding to that of the optical component 750', and the size of the positioning portion 732' is slightly greater than that of the optical component 750' so that a gap 732A' is formed between the optical component 750' and the inclined plane 732B' of the positioning portion 732' for the filling of sealant therein to form the sealing layer 736'. As shown in FIG. 18A, the optical component 750' is positioned in the positioning portion 732' of the housing 730', and the sealing layer 736' is surrounding the optical component 750' to block the moisture and to protect the optical component 750'. Further, for the housing 730' as shown in FIG. 17B, there is a guide groove 734' formed under the positioning portion 732' for the filling of conductive paste to form the conductive structure 760. As shown in FIG. 18A, the optical component 750' is positioned in the positioning portion 732' of the housing 730', shielding the conductive structure 760' in the guide groove 734'. The sealing layer 736' is surrounding the optical component 750' to block the moisture and to protect the optical component 750'.

Figure 18B:
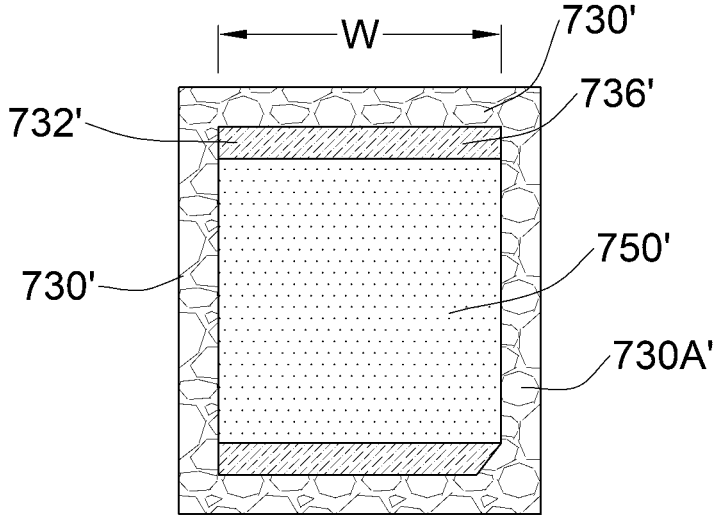
Figure 18C:
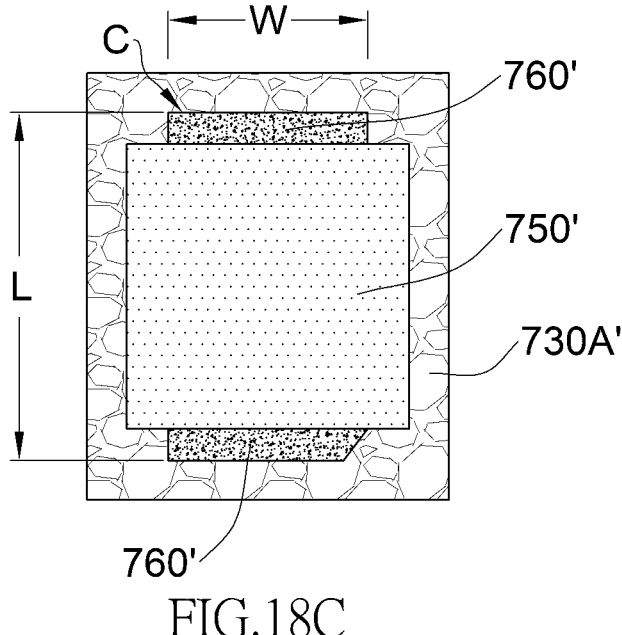
Figure 18D:
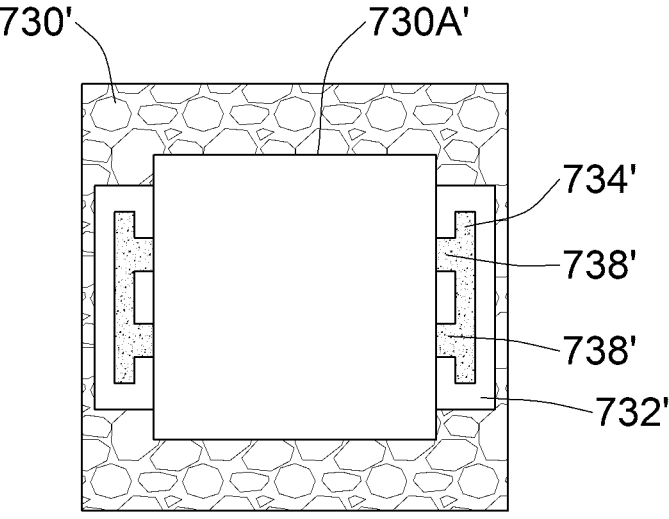

In the present disclosure, the size and configuration of the positioning portion 732' is adjustable as desired, as shown in FIG. 18B to FIG. 18D, showing top views of the housings of the respective embodiments of the present disclosure. For example, the width W of the positioning portion 732' is formed in a manner such that the two sides of the optical component 750' can be directly abutted with the respective two opposite sidewalls of the housing 730' (as shown in FIG. 18B), wherein the conductive paste fills in the guide groove (not shown) under the optical component 750', and the transparent glue fills in the gap formed between the portion of the optical component 750' not abutting with the sidewalls of the housing 730' and the positioning portion 732' to form the sealing layer 736'. Alternatively, as shown in FIG. 18C, the width W of the positioning portion 732' is smaller than the optical component 750', and the length L of the positioning 732' is larger than the optical component 750', so that a space C is formed for the filling of conductive paste to form the conductive structure 760'. The remaining designs for the housing 730' are similar to the above-mentioned embodiments, and are not repeatedly illustrated for brevity.

Moreover, the guide groove of the housing can be well designed for facilitating the brushing process, and for providing the housing with conductive structures of different configurations. FIG. 18D shows a top view of the housing 730' without disposing an optical component 750' thereon. As shown, in addition to the positioning portion 732' and the guide groove 734' for the filling of conductive paste, there are also sub-grooves 738', having a depth slightly less than the guide grooves 734', formed on the respective opposite sides of the housing 730'. The sub-groove 738' is connecting the guide groove 734' and the sidewall 730A'. The sub-groove 738' has a structure which can improve the filling of conductive paste or glue till a deeper portion of the guide groove 734'.

In addition to the plastic housing which is formed by injection molding, cast molding, or 3D printing, and embedding therein an electrically conductive structure for electrical connection, according to the present disclosure, a metallic housing may be used for providing the electrical connection directly. It should be noted that, however, the metallic housing needs to have some broken parts to define the electrically positive and electrically negative portions. The metallic housing itself is a conductive structure that can be connected to the conductive layer or the metal coating of the underlayer substrate, to form the electrical connection.

In view of the above, the present disclosure provides for a laser package structure having a protection mechanism, and a WLP process for attaining such laser package structure. By means of the present disclosure, it is not necessary to adopt an additional photodiode with external circuits to be the protection mechanism. Instead, according to the present disclosure, the housing for supporting the optical component has an electrically conductive structure embedded therein, which is connected to the optical component with electrical properties. In such a manner, the volume of the whole package structure or the module can be significantly reduced, and the risk that the module fails because of the breaking of external wirings can be also decreased. Moreover, by means of the WLP process, the procedures and cost for manufacture can be reduced.

In addition to the above-mentioned features, according to the disclosure, the quality and efficiency of paste-brushing can be enhanced by the guide grooves of various designs or configurations. In particular, for the package structure of the present disclosure, the space and gaps formed between the periphery of the optical component and the housing can be filled with electrically conductive paste, or non-conductive paste as desired, so as to seal the cavity of the package structure and to block the moisture from entering to adversely affect the optical component.

In the laser package structure of the present disclosure, the air layer for separating the optical component from the laser chip is formed by the spacer of a predetermined height, or formed by the filling of encapsulating layer with a predetermined thickness, thereby increasing the flexibility in designing the package structure. Besides, the conductive paste is applied by stencil printing, and the paste (such as the solder paste) overflowed due to the pressure applied when brushing may form the structure for the electrode to connect to the conductive wiring in the SMT process, thereby reducing the complexity in processing.

Figure 19A:
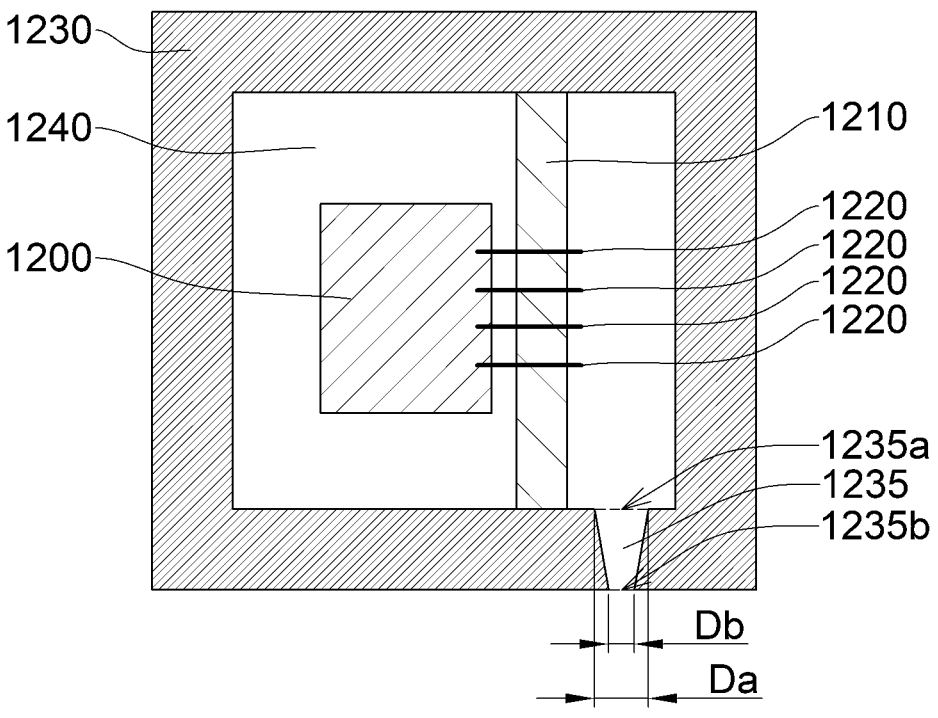
FIG. 19A and FIG. 19B are respectively a atop view and a side view showing the package structure in accordance with the eleventh embodiment of the present disclosure.
Figure 19B:
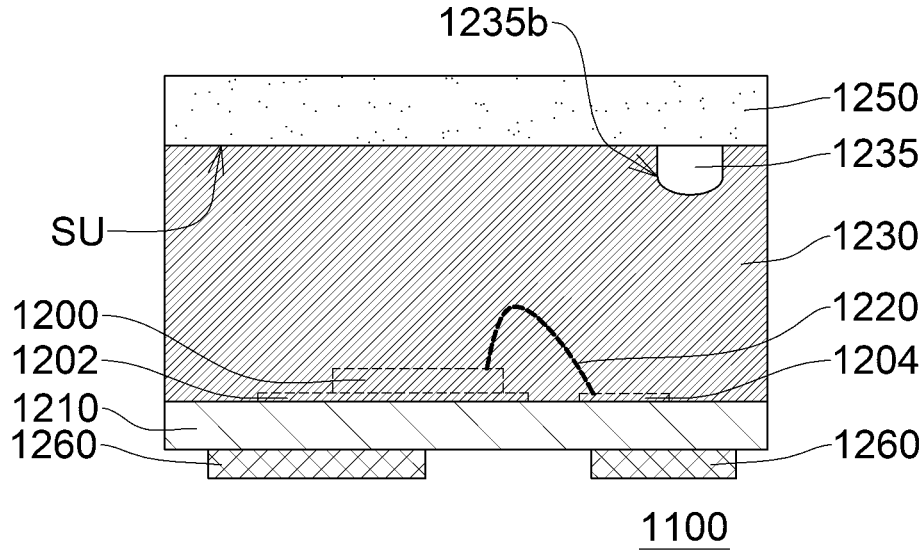

Please refer to FIG. 19A and FIG. 19B, which are respectively a top view and a side view showing the package structure in accordance with the eleventh embodiment of the present disclosure. It should be noted that the optical component 1250 is not shown in FIG. 19A for brevity. The package structure 1100 is a chip scale package (CSP) structure, including a substrate 1210, a chip 1200, a supporter 1230 and an optical component 1250. The substrate 1210 is a carrier substrate for carrying the chip 1200. The substrate 1210 is such as a ceramic substrate. The chip 1200 is such as a laser chip or an image sensor chip, wherein the laser chip is such as a vertical cavity surface emitting laser (VCSEL) chip. In the context of the disclosure, the illustration is provided by taking the laser chip as an example. The laser chip 1200 functions for emitting a laser. The supporter 1230 is disposed on the substrate 1210. The supporter 1230 may be a spacer or a housing, which encloses the laser chip 1200, and is attached to the substrate 1210 by the glue layer (not shown). In this embodiment, the supporter 1230 is an individual structure attached to the substrate 1210 by the glue layer; however, the present disclosure is not limited thereto. As an alternative, the supporter 1230 and the substrate 1210 are integrally formed with the same material. The supporter 1230 encloses the laser chip 1200 and defines an interior, which forms the cavity 1240 of the package structure 1100 after the packaging is completed. The cavity 1240 includes an air layer therein. The supporter 1230 is covered with the optical component 1250. The optical component 1250 is disposed on the supporter 1230, and is facing toward the laser chip 1200. In one embodiment, the optical component 1250 is disposed in an optical path of the laser chip 1200. For example, the optical component 1250 is disposed directly above the laser chip 1200.

In one embodiment, one surface of the laser chip 1200 that is disposed within the cavity 1240 of the package structure 1100 is connected to the substrate 1210 through the first conductive structure 1202, while the other surface of the laser chip 1200 is connected to the second conductive structure 1204 of the substrate 1210 by the wire 1220. The aforesaid two surfaces are opposite to each other. The laser chip 1200 is connected to the substrate 1210 through the first conductive structure 1202 and the second conductive structure 1204, and is further electrically connected to an external circuit board (not shown). The supporter 1230 is attached to the optical component 1250 with the adhesive (not shown) applied on the top thereof. In one embodiment, the optical component 1250 is disposed on an upper surface of the top of the supporter 1230, and the upper surface of the supporter 1230 is fully covered by the optical component 1250 or fully covered by a transparent substrate having optical structure therein. In this embodiment, the adhesive is a non-conductive adhesive, which provides only for the supporter 1230 to be attached and connected to the optical component 1250 and the underlayer substrate 1210, respectively. The package structure 1100 further includes the conductive pads 1260. The conductive pads 1260 are disposed at an outer side of the substrate 1210, and is serving for the subsequent SMT (Surface Mount Technology) process for assembling the package structure 1100.

As shown, in one embodiment of the present disclosure, the supporter 1230 is constructed by four sidewalls, and the laser chip 1200 is surrounded by the four sidewalls. As above-mentioned, it is necessary to proceed the reflow or SMT process when the package structure 1100 is to be assembled to a module, and during the SMT process, the package structure 1100 may be subjected to a relatively high temperature shortly. In order to avoid the air layer in the package structure 1100 from being expanded instantly, thus resulting in the detachment of the optical component 1250 from the supporter 1230, in this embodiment, the supporter 1230 includes the tunnel 1235 formed on at least one of the sidewalls thereof. The tunnel 1235 connects from one side of the sidewall to the opposite side of the sidewall. The tunnel 1235 is open to the cavity 1240, thus forming an inner opening 1235a on the inner surface of the sidewall, and is open to external of the package structure 1100, thus forming an outer opening 1235b. The dimension (e.g., the diameter) Da of the inner opening 1235a is larger than that (Db) of the outer opening 1235b. The cavity 1240 of the package structure 1100 is air-communicated to the external through the tunnel 1235 because of the inner opening 1235a and the outer opening 1235b, which provides for an air escape channel. By means of such air escape channel, the air in the package structure 1100, which is heated and instantly expanding, can escape. In this manner, the optical component 1250 is prevented from falling off due to the impact of the expanding air in the cavity 1240. In another aspect, when the upper surface SU of the supporter 1230 is covered by the optical component 1250, the tunnel 1235 may be covered thereby as well to expose only the inner opening 1235a and the outer opening 1235b, forming an air escape hole for the package structure 1100.

Figure 20A:
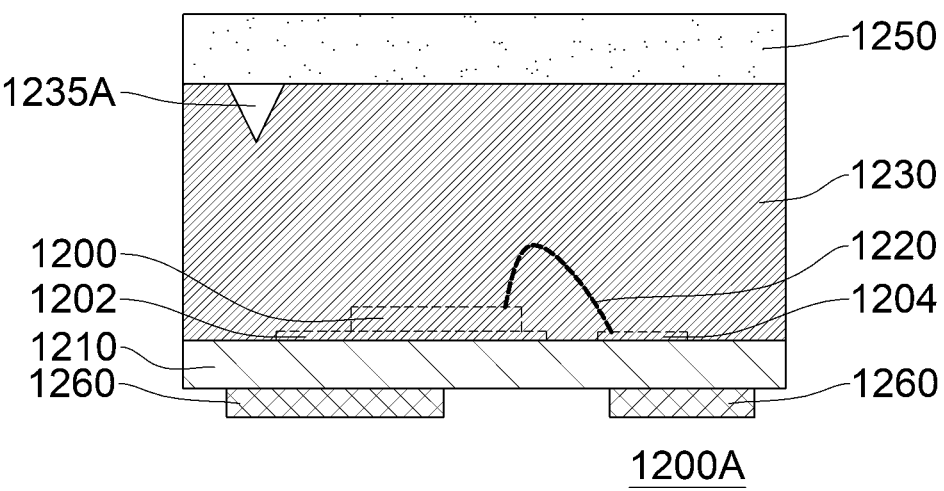
FIG. 20A to FIG. 20D are side views schematically showing the package structures in accordance with the embodiments of the present disclosure.
Figure 20B:
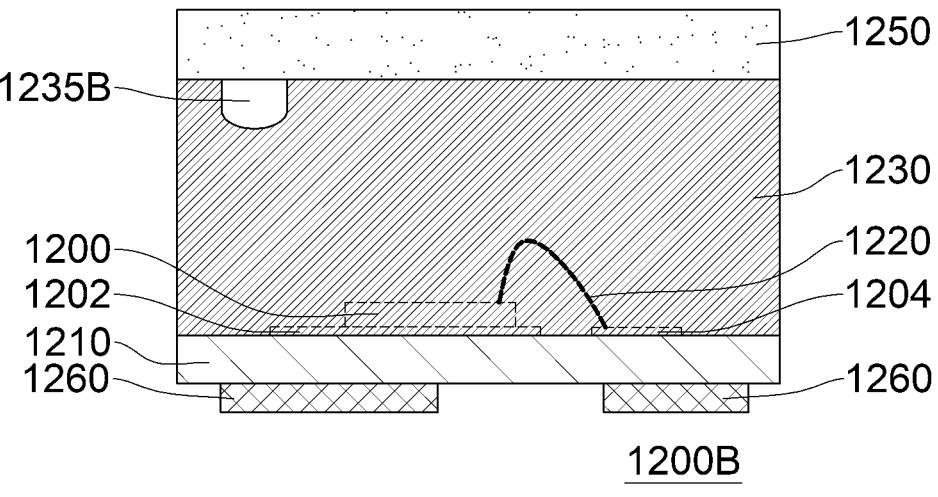
Figure 20C:
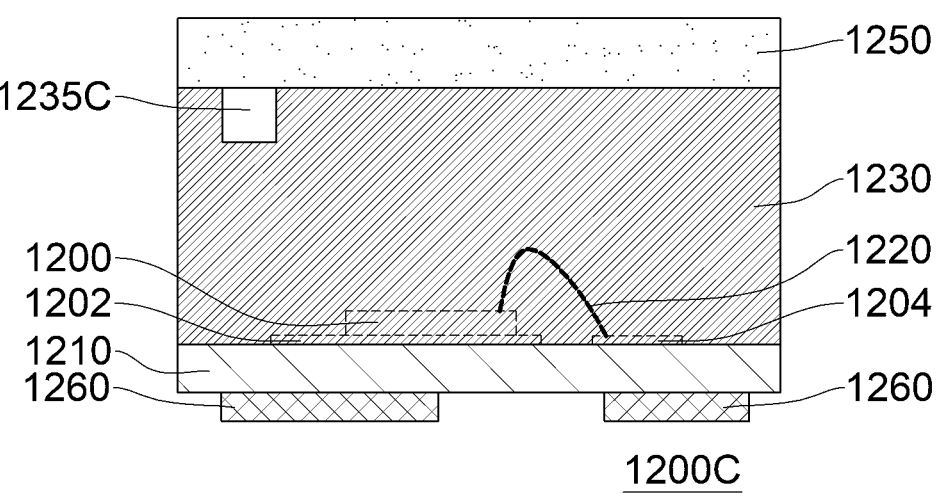
Figure 20D:
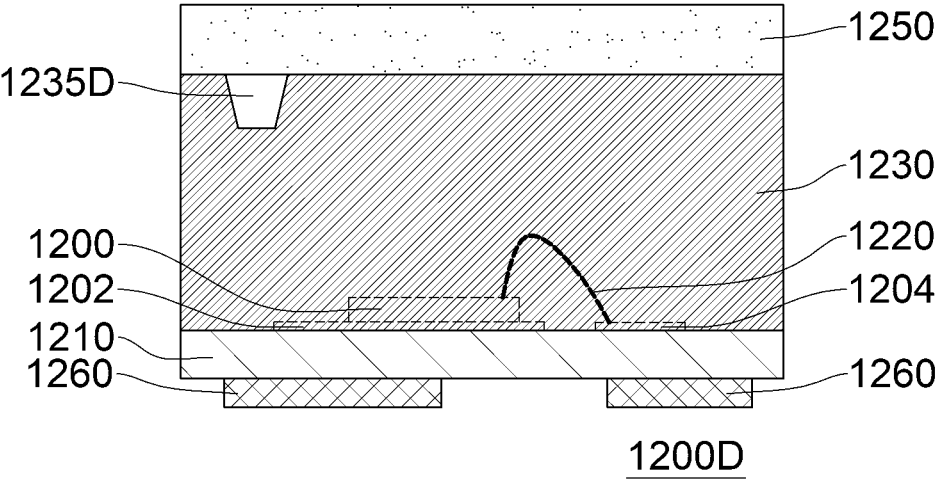

Please refer to FIG. 20A to FIG. 20D, which are side views schematically showing the package structures in accordance with the embodiments of the present disclosure. In these embodiments, the package structures 1200A, 1200B, 1200C,1200D have the same construction as that of the package structure 1100 except for the shape of tunnel as shown in the cross-sectional view. That is, the shape of the opening, including the shape of inner opening and outer opening, can be varied as desired in these embodiments. For example, for the package structure 1200A as shown in FIG. 20A, the cross section of the tunnel 1235A formed on the sidewall of the supporter 1230 has a shape of triangular; for the package structure 1200B as shown in FIG. 20B, the cross section of the tunnel 1235B formed on the sidewall of the supporter 1230 has a shape similar to semicircle; for the package structure 1200C as shown in FIG. 20C, the cross section of the tunnel 1235C formed on the sidewall of the supporter 1230 has a shape of rectangular; and for the package structure 1200D as shown in FIG. 20D, the cross section of the tunnel 1235D formed on the sidewall of the supporter 1230 has a shape of trapezoid.

In the above-mentioned embodiments, by means of the mold design for molding the supporter (e.g., the spacer or housing), the tunnel penetrating the sidewall of the spacer or housing can be formed simultaneously when the spacer or housing is formed by molding. Accordingly, the shape of cross section of the tunnel is not limited to those as shown in FIG. 20A to FIG. 20D. The shape of cross section of the tunnel can be varied by corresponding designs of the mold, and the only consideration is the ease to release the mold after the supporter is formed.

Figure 21A:
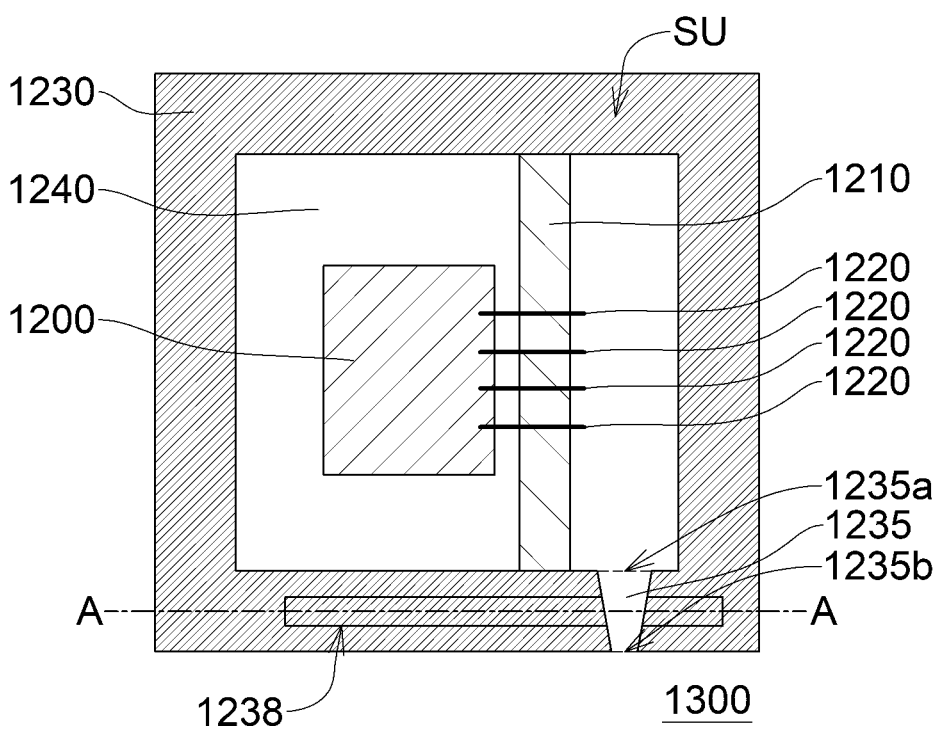
FIG. 21A is a top view showing the package structure in accordance with the twelfth embodiment of the present disclosure.
Figure 21B:
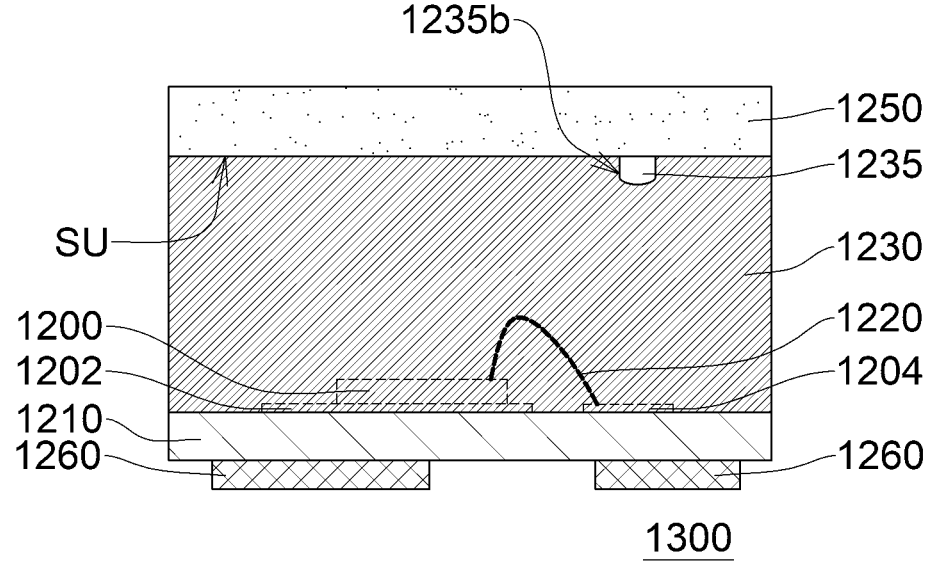
FIG. 21B is a side view of the embodiment shown in FIG. 21A.
Figure 21C:
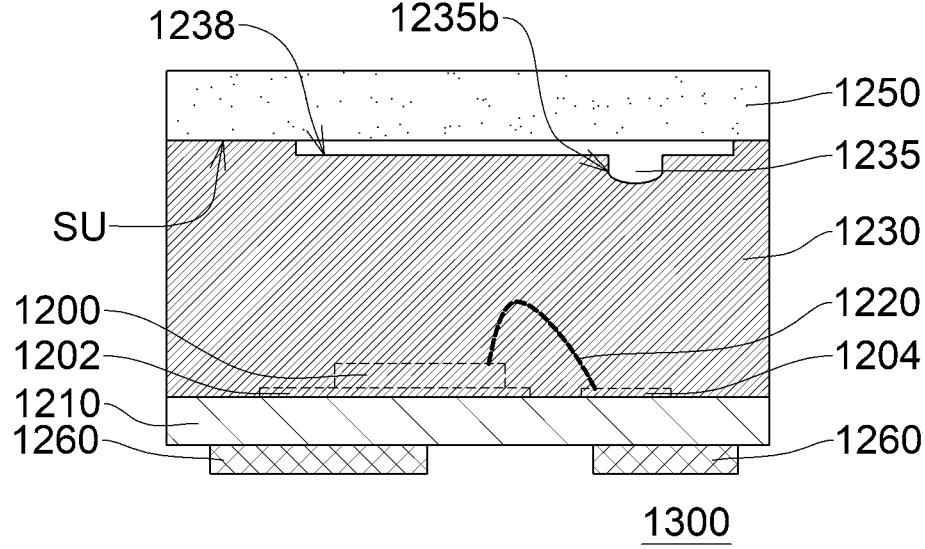
FIG. 21C shows the package structure in the cross section taken along line A-A of FIG. 21A.

Please refer to FIG. 21A to FIG. 21C, in which FIG. 21A is a top view showing the package structure in accordance with the twelfth embodiment of the present disclosure; FIG. 21B is a side view of the embodiment shown in FIG. 21A; and FIG. 21C shows the package structure in the cross section taken along line A-A of FIG. 21A. It should be noted that, the optical component 1250 is not shown in FIG. 21A for brevity.

Similar to the above-mentioned embodiments, the package structure 1300 as shown in FIG. 21A includes the substrate 1210, the chip 1200, the supporter 1230 and the optical component 1250 (shown in FIG. 21B and FIG. 21C). The chip 1200 is such as a laser chip or an image sensor chip, wherein the laser chip is such as a vertical cavity surface emitting laser (VCSEL) chip. In the context of the disclosure, the illustration is provided by taking the laser chip as an example. The laser chip 1200 functions for emitting a laser. The supporter 1230 is disposed on the substrate 1210. The supporter 1230 may be a spacer or a housing, which encloses the laser chip 1200, and is attached to the substrate 1210 by the glue layer (not shown). The supporter 1230 is attached to the substrate 1210 by the glue layer, while the present disclosure is not limited thereto. The supporter 1230 encloses the laser chip 1200, thus forming the cavity 1240. In this embodiment, the supporter 1230 is constructed by four sidewalls, forming an upper surface SU thereof. The laser chip 1200 is surrounded by the four sidewalls. The upper surface SU of the supporter 1230 is covered by the optical component 1250. The optical component 1250 is disposed on the supporter 1230 and is facing toward the laser chip 1200. In one embodiment, the optical component 1250 is disposed in an optical path of the laser chip 1200, and is attached to the supporter 1230 by the adhesive (not shown) applied to the top of the supporter 1230.

The difference between the embodiment as shown in FIG. 21A to FIG. 21C and the above-mentioned ones is that, in this embodiment, the tunnel 1235 is formed as exposing to the upper surface SU of the supporter 1230. In more specific, the optical component 1250 is attached to the top of the supporter 1230 by the adhesive applied to the top of the supporter 1230, and in this embodiment, the supporter 1230 further includes a recessed groove 1238 on the top of at least one sidewall thereof, for containing the excess adhesive so as to avoid the adhesive from entering the tunnel 1235. The supporter 1230 may include multiple grooves formed thereon, and these grooves can be isolated from each other, or can be communicated to each other, or can be communicated to the tunnel 1235. In this embodiment, the tunnel 1235 is formed on the sidewall having a groove 1238 formed therein, and is open to the upper surface SU of the supporter 1230. This upper surface SU of the supporter 1230 is covered by the optical component 1250, thus forming the package structure 1300 as shown in FIG. 21B and FIG. 21C. In this manner, the overflowing of adhesive when applying the adhesive to the supporter is avoided. Moreover, the air in the package structure 1300, which is heated and instantly expanding, can escape, so that the optical component 1250 is prevented from falling off due to the impact of the expanding air in the cavity 1240.

In the above-mentioned embodiments, the configuration of tunnel is for the purpose of escaping the air that is heated and instantly expanding when the package structure is heated during the reflow or SMT process or during the operation of chip. The tunnel is serving as an air escape channel for causing the heated and expanding air to escape from the package structure to the external, so as to prevent the optical component from poor attaching to or even falling off from the supporter due to the impact of the expanding air. Accordingly, in this embodiment, the tunnel is formed to penetrate the sidewall of the supporter, and to be open to the cavity of the package structure and to the external of the package structure. That is, the tunnel forms an inner opening on the side of sidewall facing toward the cavity, and an outer opening on the side of sidewall facing toward the external of the package structure. According to the embodiments of the present disclosure, the inner opening and the outer opening of the tunnel can be of the same or different dimensions (e.g., diameters).

Figure 22A:
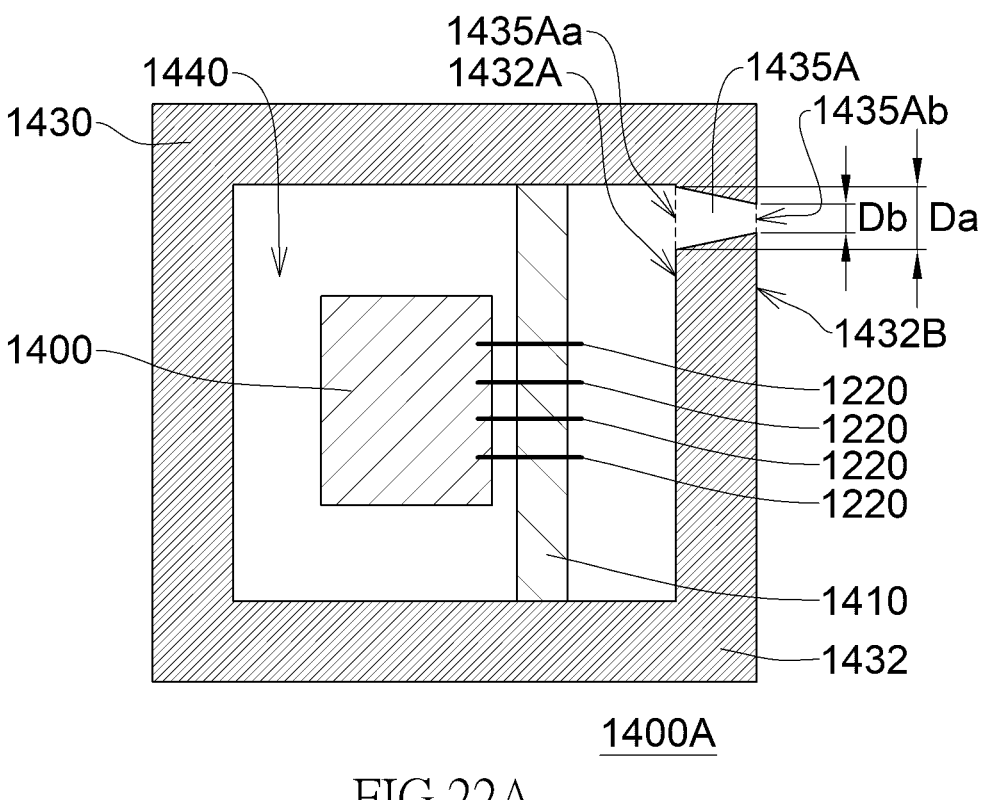
FIG. 22A to FIG. 22C are top views showing the package structures according to the embodiments of the present disclosure.
Figure 22B:
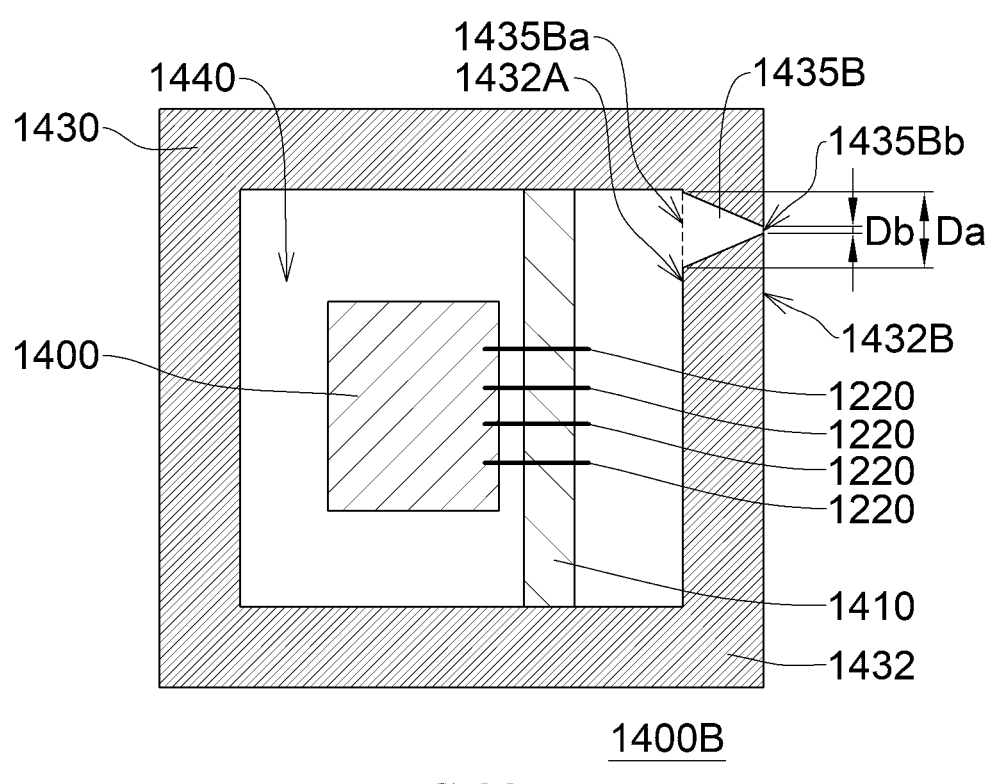
Figure 22C:
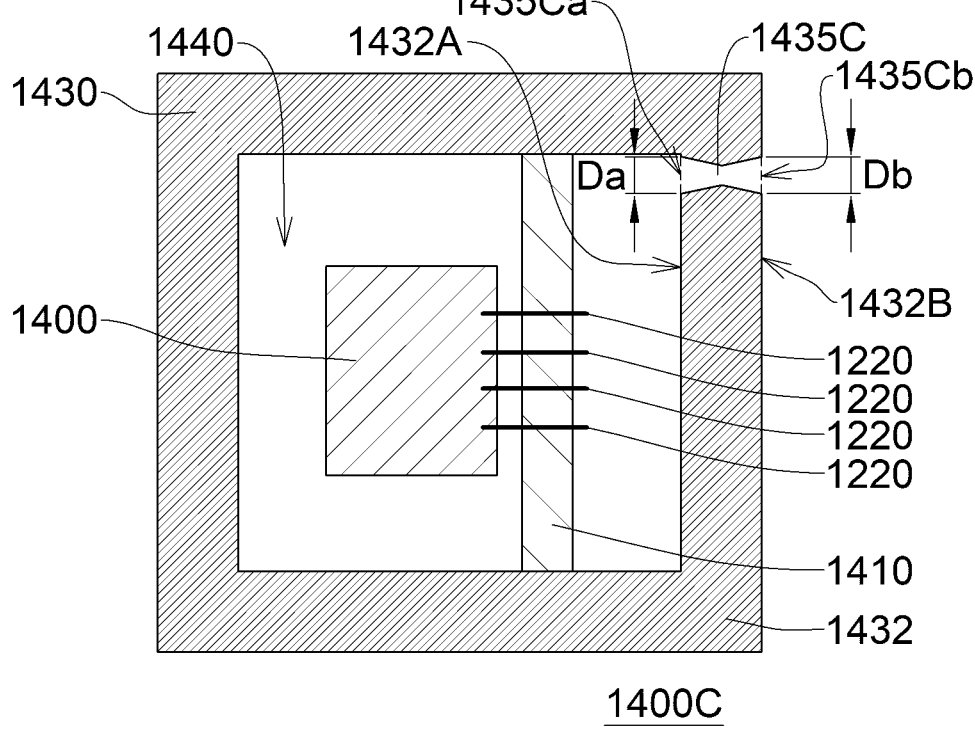

Please refer to FIG. 22A to FIG. 22C for more details, which are top views showing the package structures according to the embodiments of the present disclosure. The package structures 1400A, 1400B, 1400C have the same construction to those of the package structures 1100, 1200A to 1200D, 1300. However, in this embodiment, the dimension such as the diameter of the inner opening and the outer opening of the tunnel of the package structure can be varied. For example, in the package structure 1400A as shown in FIG. 22A, the supporter 1430 is disposed on the substrate 1410 and is enclosing the chip 1400. The tunnel 1435A formed on the sidewall 1432 of the supporter 1430 is open to the cavity 1440 at the inner opening 1435Aa, and is open to the external of the package structure 1400A at the outer opening 1435Ab. As shown, the tunnel 1435A has an aperture decreasing along the side 1432A proximal to the cavity 1440 toward the side 1432B proximal to the external of the package structure 1400A. That is, the inner opening 1435Aa has a diameter Da larger than the diameter Db of the outer opening 1435Ab. In such a manner, the dimension of the inner opening 1435Aa is enlarged, thus improving the efficiency of causing the heated and expanding air to escape from the package structure 1400A. On the other hand, the dimension of the outer opening 1435Ab is reduced, thus preventing the moisture from entering the package structure 1400A through the tunnel 1435A when the package structure is singulated for forming the individual unit of package structure.

In the package structure 1400B as shown in FIG. 22B, the tunnel 1435B has an aperture decreasing along the side 1432A proximal to the cavity 1440 toward the side 1432B proximal to the external of the package structure 1400A, with a higher decreasing rate. That is, the inner opening 1435Ba has a diameter Da larger than the diameter Db of the outer opening 1435Bb, and the diameter Db of the outer opening 1435B is even more reduced to prevent the moisture from entering. Moreover, according to the present disclosure, it is possible that the tunnel has an aperture first decreasing and then increasing from the side 1432A proximal to the cavity 1440 toward the side 1432B proximal to the external of the package structure, forming the package structure 1400C as shown in FIG. 22C. That is, the tunnel 1435C formed on the sidewall of the supporter 1430 has an aperture first decreasing and then increasing from the side 1432A proximal to the cavity 1440 and along the direction from the inner side 1432A to the outer side 1432B. In one embodiment, the diameter Da of the inner opening 1435Ca is equal to the diameter Db of the outer opening 1435Cb.

As above-mentioned, in the above embodiments of the present disclosure, by means of the mold design for molding the supporter (e.g., the spacer or housing), the tunnel penetrating the sidewall of the spacer or housing can be formed simultaneously when the spacer or housing is formed by molding. In one embodiment, multiple supporters, e.g., the supporter as above-mentioned, are formed on the substrate by molding, while the multiple supporters are separated from each other. Then the substrate is singulated by dicing, thus forming the individual package structures as mentioned above. In another embodiment, multiple package structures, e.g., the package structure as mentioned above, are formed by molding. These package structures are connected to each other. Then the supporters along with the substrate are singulated by dicing, thus forming the individual package structures as mentioned above.

Figure 23:
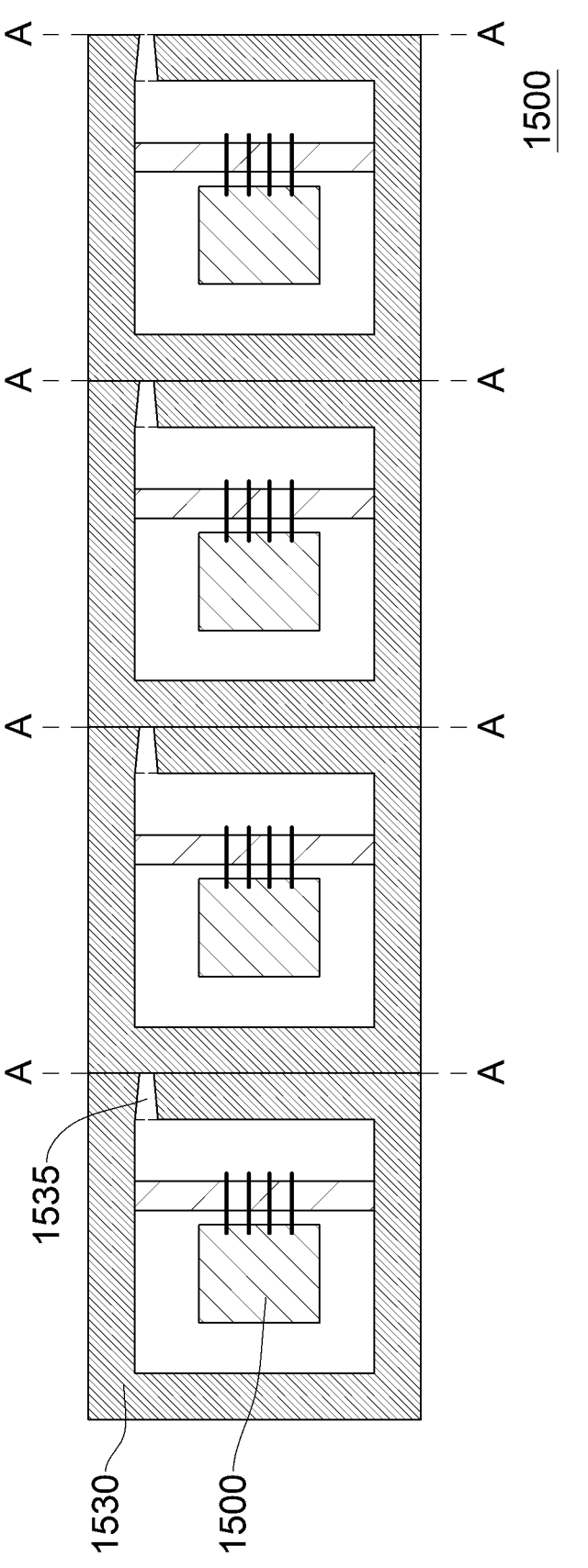
FIG. 23 is a top view showing the package structure at the packaging stage of the embodiment of the present disclosure.

Please refer to FIG. 23, which is a top view showing the package structure at the packaging stage of the embodiment of the present disclosure. As shown in FIG. 23, the tunnel 1535 is formed in the respective supporter 1530 of the packaging structure 1500' during the molding process. By properly selecting the position of dicing line A-A in the dicing process, the packaging structure 1500' can be diced at a proper position to form an outer opening of a desired aperture for the tunnel 1535, thus forming the individual package structure as respectively shown in FIG. 19A and FIG. 19B, FIG. 20A to FIG. 20D, FIG. 21A to FIG. 21C and FIG. 22A to FIG. 22C. Thereby, the packaging process for the laser chip can be simplified, and the efficiency thereof can be improved.

Figure 24:
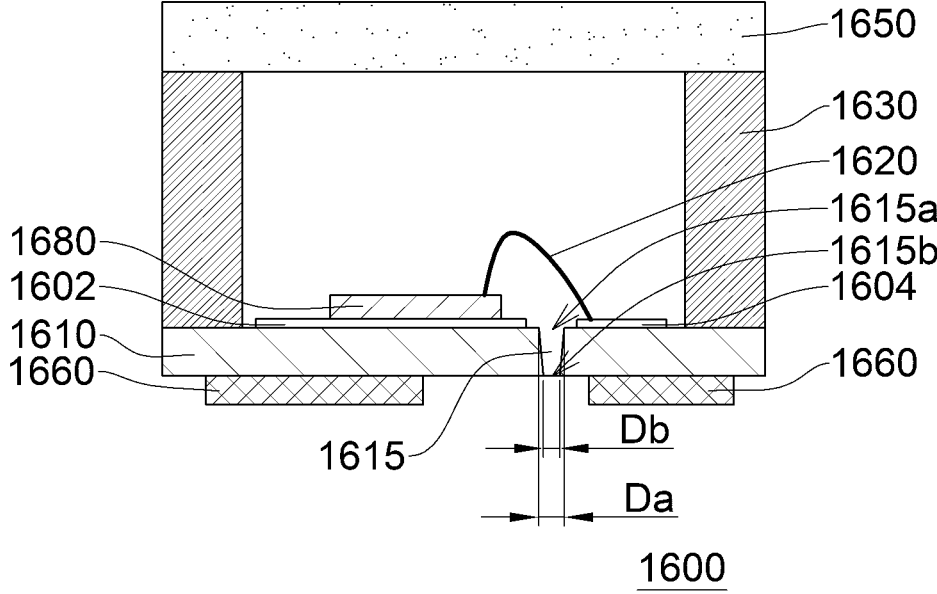
FIG. 24 is a cross-sectional view showing the package structure in accordance the twelfth embodiment of the present disclosure.

Based on the above illustration, the tunnel is formed on one of the sidewalls of the supporter; however, the present disclosure is not limited thereto. Please refer to FIG. 24, which is a cross-sectional view showing the package structure in accordance the twelfth embodiment of the present disclosure. The package structure 1600A in this embodiment includes a substrate 1610, a laser chip 1680, a supporter 1630 and an optical component 1650. The laser chip 1680 functions for emitting a laser. The supporter 1630 is disposed on the substrate 1610, and is attached to the substrate 1610 by, but not limited to, the glue layer (not shown). The laser chip 1680 is enclosed by the supporter 1630, thus forming an interior space. This interior space forms the cavity 1640 in the package structure 1600A after the packaging process is completed. The supporter 1630 is covered by the optical component 1650. The optical component 1650 is disposed on the supporter 1630, and is facing to the laser chip 1680. In one embodiment, the optical component 1650 is disposed in the optical path of the laser chip 1680. The laser chip 1680 disposed in the cavity 1640 of the package structure 1600A is connected to the conductive substrate 1610 through the first conductive structure 1602. The laser chip 1680 is connected to the second conductive structure 1604 by the wire 1620, and is further connected to the substrate 1610, and further electrically connected to an external circuit board (not shown), through the second conductive structure 1604. The supporter 1630 may be a spacer or a housing, and is attached to the optical component 1650 by the adhesive applied to the top thereof. In this embodiment, the adhesive is a non-conductive adhesive, which provides only for the supporter 1630 to be attached and connected to the optical component 1650 and the underlayer substrate 1610, respectively. The package structure 1600A further includes the conductive pads 1660. The conductive pads 1660 are disposed at an outer side of the substrate 1610, and are serving for the subsequent SMT (Surface Mount Technology) process for assembling the package structure 1600A.

The difference between this embodiment and the above-mentioned embodiments is that, in the package structure 1600A of this embodiment, the tunnel 1615 is formed in the substrate 1610 on which the chip 1680 is disposed, rather than in the sidewall of the supporter 1630. The tunnel 1615 penetrates the substrate 1610, forming an inner opening 1615a on the side proximal to the cavity 1640, and forming an outer opening 1615b on the side distal to the cavity 1640 (i.e., the side proximal to the external of the package structure 1600A). In this embodiment, the tunnel 1615 may be formed by laser drilling. Similarly, the inner opening 1615a and the outer opening 1615b of the tunnel 1615 may be formed as having the shape and dimension as those in the above-mentioned embodiments, so as to cause the heated and expanding air in the cavity 1640 to escape from the package structure 1600A, and to prevent the moisture from entering the package structure 1600A as well. In this embodiment, the tunnel 1615 is formed at a position avoiding the contact connecting the chip 1680 to the first conductive structure 1602, and avoiding the contact connecting the wire 1620 to the second conductive structure 1604.

Further, due to the fact that the packaging structure (such as the packaging structure 1500') may be generally covered with a film (not shown) at the bottom of the substrate when being subjected to the dicing process to form the individual package structure, in case that the tunnel 1615 is formed in the substrate 1610 according to this embodiment, the tunnel 1615 may be covered by the film, thus avoiding the moisture from entering to the cavity 1640 through the tunnel 1615 in the dicing process. In other words, it improves the flexibility in design in regards of the shape and the dimension of the outer opening 1615*b*, when forming the tunnel 1615 in the substrate 1610 based on the present process.

Accordingly, the present disclosure provides for a package structure. By means of the mold design for molding the supporter (e.g., the housing), the tunnel penetrating the sidewall of the housing can be formed simultaneously when the spacer or housing is formed by molding. Such tunnel serves for an air escape channel or hole for the heated and expanding air in the air layer to escape from the package structure.

For the package structure according to the present disclosure, considering that the air in the air layer of the package structure may be heated shortly and expanding instantly during the SMT process, the aperture of the tunnel (i.e., air escape channel) is thus designed as decreasing with the thickness of the sidewall it is penetrating, from the inner side toward the outer side, forming a relatively larger inner opening and a relatively smaller outer opening for the tunnel. By forming an inner opening of an increased diameter on the side proximal to the cavity of the package structure, the air can escape rapidly. By forming an outer opening of a reduced diameter on the side proximal to the external, the moisture can be avoided from entering the package structure in the singulation (e.g., dicing) process.

Furthermore, for the package structure of the present disclosure, the tunnel can be formed at any position around the package structure as desired. In other words, the tunnel can be formed on any one sidewall of the supporter, or formed in the substrate, and the amount of tunnel as formed is not limited. According the present disclosure, the contour, cross-sectional shape, position, and dimension of the tunnel can be varied, depending on the actual need for the package structure (e.g., the dimension of the package structure). These modifications and variations are not going beyond the scope of the present disclosure.

Figure 25A:
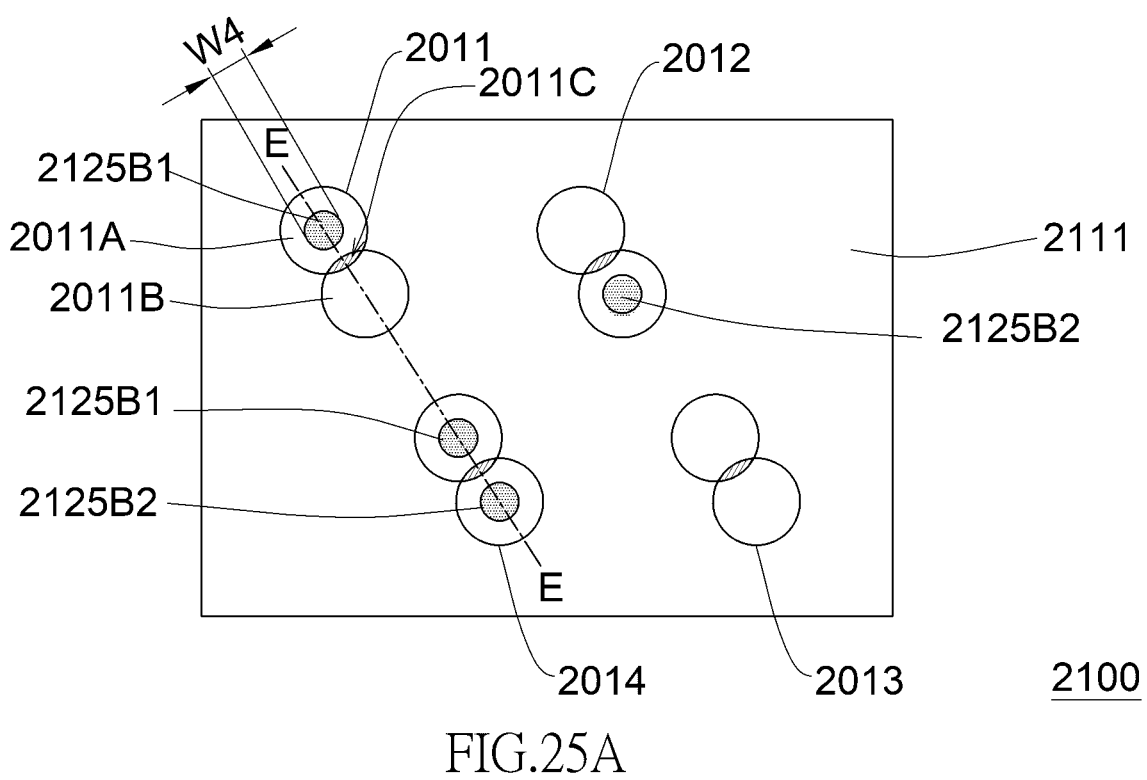
Figure 25B:
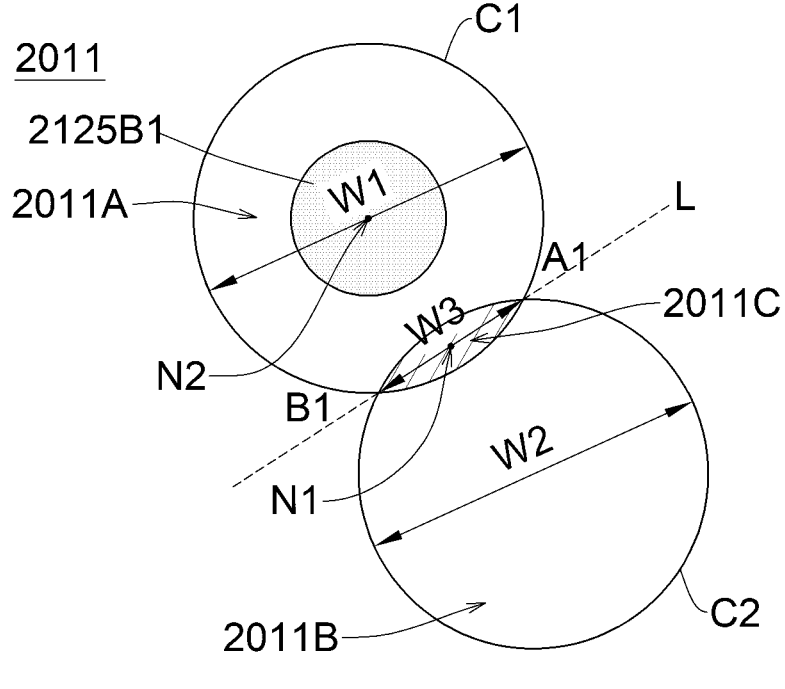
Figure 25C:
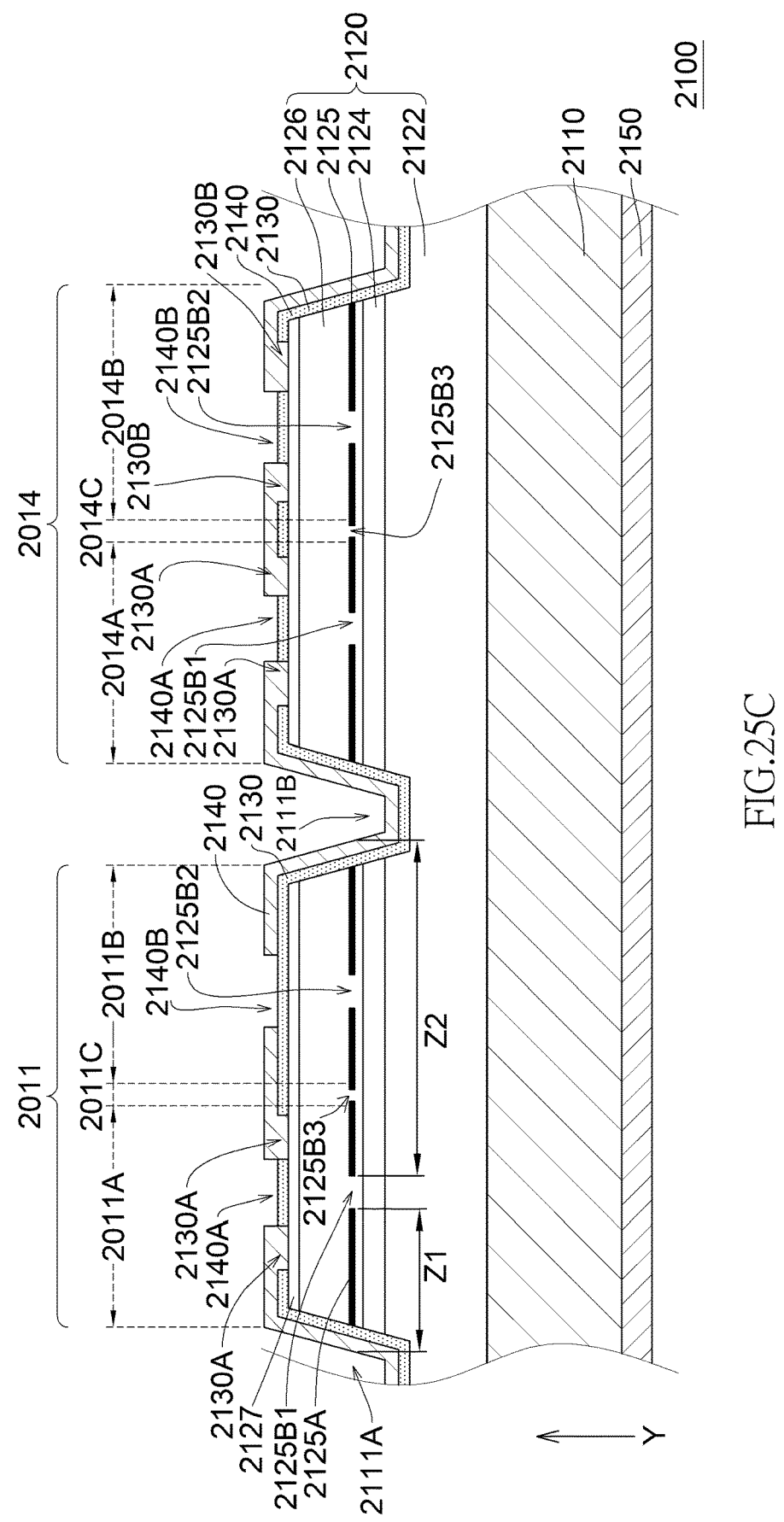

Please refer to FIG. 25A to FIG. 25C, which are schematic views showing the semiconductor laser element 2100 in accordance with an embodiment of the present disclosure. FIG. 25A and FIG. 25B are top views showing the semiconductor laser element 2100. FIG. 25A schematically shows a portion of the array of light emitting units of the semiconductor laser element 2100, while some layers thereof are not shown for brevity. FIG. 25B is an enlarged view of FIG. 25A, which schematically shows one light emitting unit 2011 of the array of light emitting units. FIG. 25C is a cross-sectional view showing the semiconductor laser element 2100 in the cross section taken along line E-E of FIG. 25A.

The semiconductor laser element 2100 of this disclosure is a vertical cavity surface emitting laser (VCSEL) element. As shown in FIG. 25A to FIG. 25C, the semiconductor laser element 2100 of this disclosure includes an element substrate 2110, a trench structure 2111, and the array of light emitting units formed on the element substrate 2110. The array of light emitting units includes plural light emitting units (only four light emitting units 2011, 2012, 2013, 2014 are shown in FIG. 25A for exemplary illustration) which are arranged regularly. Each light emitting unit is spaced from the other one with a predetermined distance. In more specific, the active structures of the respective light emitting units are not mutually connected. In the embodiment, the element substrate 2110 can be, for example, a growth substrate for epitaxial stack of a laser element, i.e., a wafer for growing epitaxial stack of a semiconductor laser, but the invention is not limited to this. In an embodiment, the element substrate 2110 can be a carrier substrate for carrying the laser element.

As shown in the top view of FIG. 25A, each of the light emitting units 2011 to 2014 is of similar or the same shape with each other. Further, each one of the light emitting units 2011 to 2014 may respectively include a certain amount of light emitting zones (e.g., one, two, or more than two light emitting zones), or may include no light emitting zones. For example, as shown in FIG. 25A, the light emitting unit 2013 includes no light emitting zone, each of the light emitting units 2011, 2012 includes one light emitting zone (i.e., only showing one bright spot when being powered), and the light emitting unit 2014 includes two light emitting zones (i.e., showing two bright spots when being powered). In the present disclosure, the light emitting zone is corresponding to an enabled aperture for light-emitting of the semiconductor laser element. In other words, the light emitting zone is defined as the region in which the light is emitting out of the light emitting unit, and will show as a bright spot when the semiconductor laser element 2100 is powered.

FIG. 25B is an enlarged view showing one of the light emitting unit (e.g., the light emitting unit 2100) as shown in FIG. 25A. As shown in FIG. 25B, the light emitting unit 2011 includes a first region 2011A of a first width, a second region 2011B of a second width, and a third region 2011C of a third width, located between the first region 2011A and the second region 2011B. The first width of the first region 2011A has a maximum of W1 (hereafter, "the first maximum width W1"). The second width of the second region 2011B has a maximum of W2 (hereafter, "the second maximum width W2"). The third width of the third region 2011C has a maximum of W3 (hereafter, "the third maximum width W3"). In this embodiment, the third maximum width W3 is less than the first maximum width W1, and less than the second maximum width W2.

In more specific, as shown in FIG. 25B, each light emitting unit 2011 includes at least two sub-units C1, C2 that are overlapping, and the overlapping portion is defined as the third region (e.g., the third region 2011C of the light emitting unit 2011), while the non-overlapping portions of the respective sub-units C1 and C2 are defined as the first region and the second region (e.g., the first region 2011A and the second region 2011B of the light emitting unit 2011). According to the present disclosure, the shapes of the respective two sub-units C1, C2 may be the same or different, and/or the areas of the respective two sub-units C1, C2 may be the same or different. Moreover, in the present disclosure, the so-called "two sub-units C1, C2 that are overlapping" means that the two sub-unites may be overlapping each other at one certain point (e.g., two tangential circular sub-units that are contacting at one point), overlapping along a line (a straight line or a curve), or overlapping on a face. That is, the contour of the overlapping portion (i.e., the third region) may be point-like, linear or face-like. Due to the presence of overlapping portion, the light emitting unit shows a substantially non-circular shape. For example, as shown in FIG. 25B, each of the light emitting units (e.g., the light emitting unit 11) includes two circular sub-units C1, C2 of identical areas, which are overlapping each other with a certain portion, thus giving the light emitting unit an alphabet "8"-like shaped contour. The third region 2011C is exactly the portion formed by the overlapping of the two circular sub-units C1, C2 (i.e., the portion marked in slash in FIG. 25B), while the first and the second regions 2011A, 2011B are the respective portions of the two sub-units C1, C2 that exclude the overlapping portion (i.e., the third region 11C), and show the crescent-like contour.

In this embodiment, the light emitting zone is disposed in the first region 2011A and/or the second region 2011B, respectively, but not in the third region 2011C (e.g., the light emitting units 2011, 2012 and 2014 as shown in FIG. 25A), depending on the design of epitaxial structure of the semiconductor laser element (which is described in more details in the following). In this embodiment, as shown in FIG. 25A, the light emitting zone of the light emitting unit 2011 is disposed in only the first region 2011A, the light emitting zone of the light emitting unit 2012 is disposed in only the second region (corresponding to the location of the second region 2011B of the light emitting unit 2011 as shown in FIG. 25B), and the light emitting zone of the light emitting unit 2014 is disposed in the first region, the second region thereof (corresponding to the respective locations of the first region 2011A and the second region 2011B of the light emitting unit 2011 as shown in FIG. 25B), while the light emitting unit 2013 contains no light emitting zone therein.

Alternatively, each of the light emitting units includes two sub-units C1 and C2 that are overlapping each other and are connected to each other at the two points A1 and B1. As shown, the line L passes the two points A1 and B1. As above-mentioned, according to the present disclosure, the two sub-units may be of the same, or different shapes, and the two sub-units may be of the same, or different areas. In the present disclosure, the amount of light emitting zones of each light emitting unit is not limited. Further, the light emitting zones of each light emitting unit may be disposed on the same side of the line L, or on different sides of the line L. In other words, in the vertical direction of the semiconductor laser element 2100 of the present disclosure (e.g., the direction Y as shown in FIG. 25C), the line L is not passing the light emitting zone. For example, as shown in FIG. 1A, the light emitting unit 2011 and/or the light emitting unit 2012 includes only one light emitting zone, and such light emitting zone is disposed on one of the two sides of the line L. The light emitting unit 2014 includes two light emitting zones, each being disposed on the respective two opposite sides of the line L. In this embodiment, the third maximum width W3 is equal to the length of the line L (i.e., the straight distance between the point A1 and the point B1).

As shown in FIG. 25A and FIG. 25C, in the present disclosure, each light emitting unit of the array of light emitting units of the semiconductor laser element 2100 is separated from the other one by the trench structure 2111, and includes an epitaxial structure 2120, an insulating layer 2130, and a first electrode layer 2140 that are disposed on one side of the element substrate 2110 in order, and includes a second electrode layer 2150 disposed on the other side (i.e., the back side) of the element substrate 2110. The epitaxial structure 2120 is a stacking layer structure including a first semiconductor structure 2122 on the element substrate 2110, an active structure 2124 on the first semiconductor structure 2122, and a second semiconductor structure 2126 and a contact layer 2127 on the active structure 2124. The first semiconductor structure 2122 is of p-type conductivity, and the second semiconductor structure 2126 is of n-type conductivity. Alternatively, the first semiconductor structure 2122 is of n-type conductivity, and the second semiconductor structure 2126 is of p-type conductivity. The contact layer 2127 is of the same type as the second semiconductor structure 2126. The first semiconductor structure 2122, the second semiconductor structure 2126 and the contact layer 2127 are doped with dopants to show the p-type conductivity or the n-type conductivity. The dopants may include carbon, magnesium, zinc, silicon, tellurium, or beryllium.

In the light emitting unit 2011, the insulating layer 2130 is disposed on the epitaxial structure 2120, and is patterned, forming the opening 2130A thereof. The first electrode layer 2140 is disposed on the insulating layer 2130A, and is patterned, forming two openings 2140A, 2140B. The contact layer 2127 is exposed through the opening 130A, and thus contacting the first electrode layer 2140. The concentration of dopants in the contact layer 2127 is higher than, or equal to, $5 \times 10^{18}$, thereby forming the ohmic contact with the first electrode layer 2140. Moreover, the insulating layer 2130 is exposed through the openings 2140A, 2140B of the first electrode layer 2140. When viewing from the top of the semiconductor laser element 2100 (not shown), the opening 2130A is of an annular shape, the openings 2140A, 2140B are of substantially circular shape, and the current-conducting regions 2125B1, 2125B2, 2125B3 are of substantially circular shape.

The semiconductor laser element 2100 in this embodiment optionally includes a first current-confining structure 2125, which may be disposed between the active structure 2124 and the first semiconductor structure 2122, or between the active structure 2124 and the second semiconductor structure 2126. As shown in FIG. 25C, the first current-confining layer 2125 is disposed the active structure 2124 and the second semiconductor structure 2126, and includes a current-blocking region 2125A and a current-conducting region 2125B1, 2125B2, 2125B3 defined and surrounded by the current-blocking region 2125A. The current-blocking region 2125A functions for blocking the current from passing therethrough, while the current-conducting region 2125B1, 2125B2, 2125B3 allows the injecting current to pass therethrough. The location of the current-conducting region 2125B1 is corresponding to the opening 2140A of the first electrode layer 2140, and the location of the current-conducting region 2125B2 is corresponding to the opening 2140B of the first electrode layer 2140. The current-conducting region 2125B1, 2125B2 has an aperture size equal to or smaller than the respective opening 2140A, 2140B. Further, the current-conducting region 2125B1 defined and surrounded by the current-blocking region 2125A of the first current-confining structure 2125 is disposed in the first region 2011A, while the current-conducting region 2125B2 is disposed in the second region 2011B and the current-conducting region 2125B3 is disposed in the third region 2011C.

In accordance with the present disclosure, the first region 2011A, the second region 2011B and the third region 2011C of each light emitting unit as shown in FIG. 25B are all formed based on the common epitaxial structure 2120 (as shown in FIG. 25C). However, the current injected to the semiconductor laser element 2100 is allowed to pass through some portions of the epitaxial structure 2120, and such portions of the epitaxial structure 2120 may emit the light, thus forming the light emitting zones. In other words, in a single light emitting unit, the epitaxial structures 2120 of the respective first region 2011A, second region 2011B and third region 2011C are commonly connected, meaning that the second semiconductor structure 2126, the active structure 2124 and the first semiconductor structure 2122 are physically connected to each other among the first region 2011A, the second region 2011B and the third region 2011C. However, the epitaxial structure of each light emitting unit (such as the light emitting unit 2011 to 2014) is not commonly connected to that of another light emitting unit, and is isolated by the trench structure 2111. That is, the epitaxial structures of different light emitting units are partially connected to each other, and partially non-connected to each other. In more specific, as shown in FIG. 25C, the trench structure 2111 may include the first trench region 2111A, the second trench region 2111B and the third trench region 2111C, which are disposed between the light emitting unit 2011 and the light emitting unit 2014. Therefore, the second semiconductor structure 2126, the active structure 2124 and a portion of the first semiconductor structure 2122 of the respective light emitting units 2011 and 2014 are not connected to each other, while the first semiconductor structures 2122 of the respective light emitting units 2011, 2014 are partially connected. As shown in FIG. 25A, the first trench region 2111A, the second trench region 2111B and the third trench region 2111C are communicated to each other.

When the light emitting unit is formed as having only one light emitting zone (such as the light emitting units 2011 and 2012), the opening 2130A of the insulating layer 2130 may be limited to be disposed in only the first region 2011A by patterning the insulating layer 2130. When the first electrode layer 2140 and the second electrode layer 2150 are connected to an external power to be supplied with the current injected through the opening 2130A into the epitaxial structure 2120, the current may substantially, and even all, pass through the first current-conducting region 2125B1 because the current paths for the current-conducting regions 2125B2, 2125B3 are longer than that for the current-conducting region 2125B1. Accordingly, the light emitting from the light emitting unit 2011 may be substantially, and even all, emitting from the opening 2140A, forming one bright spot. In such a case, the light emitting unit 2011 is provided with substantially one light emitting zone, and such light emitting zone is disposed as corresponding to the current-conducting region 2125B1, or is disposed in the first region 2011A. Moreover, even though a relatively small amount of current may pass through the current-conducting region 2125B3 to make the epitaxial emit the light, the light still fails to emit out of the light emitting unit 2011 because of the absorption or blocking by the first electrode layer 2140, and no light-emitting zone is formed thereby. That means, the third region 2011C shows no bright spot therein. The opening 2140B of the electrode layer 2140 is disposed correspondingly to the second current-conducting region 2125B2, and thus there may be a relatively small amount of current emitting out of the light emitting unit 2011, forming the light emitting zone. In a far-field diffraction pattern (FFD pattern), the ratio of light intensity of the second region 2011B to the first region 2011A is less than 0.1.

As shown in FIG. 25A and FIG. 25C, the light emitting unit 2014 is formed as having two light-emitting zones, which are disposed in the first region 2011A and the second region 2011B, respectively. The insulating layer 2130 of the light emitting unit 2014 is disposed on the epitaxial structure 2120, and is patterned as having two openings 2130A, 2130B therein. The first electrode layer 2140 is disposed on the insulating layer 2130, and is patterned as forming two openings 2140A, 2140B therein. The first electrode layer 2140 is exposed to the contact layer 2127 through the openings 2130A, 2130B, thus contacting and forming an ohmic contact with the contact layer 2127. Moreover, a portion of the insulating layer 2130 is exposed through the openings 2140A, 2140B of the first electrode layer 2140.

As above-mentioned, the light emitting unit 2014 may optionally include the first current-confining structure 2125. The first current-confining structure 2125 includes the current-blocking region 2125A, and the current-conducting regions 2125B1, 2125B2, 2125B3 that are surrounded and defined by the current-blocking region 2125A. In this embodiment, the current-conducting region 2125B1 is disposed correspondingly to the opening 2140A of the first electrode layer 2140, and the current-conducting region 2125B2 is disposed correspondingly to the opening 2140B of the first electrode layer 2140. The aperture sizes of the current-conducting regions 2125B1, 2125B2 are equal to or smaller than the respective openings 2140A, 2140B. When viewing from the top of the semiconductor laser element 2100, the openings 2130A, 2130B are of an annular shape, the openings 2140A, 2140B are of substantially circular shape, and the current-conducting regions 2125B1, 2125B2, 2125B3 are of substantially circular shape.

In this embodiment, the insulating layer 2130 is correspondingly covered by the first electrode layer 2140, such that when the first electrode layer 2140 and the second electrode layer 2150 are connected to an external power to be fed with the current from the openings 2130A, 2130B into the epitaxial structure 2120, the light emitting from the light emitting unit 2014 may be emitting out through the openings 2140A, 2140B when the current is passing through the current-conducting regions 2125B1, 2125B2, showing two bright spots. These two bright spots are located in the first region 2014A, 2014B, respectively. Moreover, it is clear that the first electrode layer 2140 forms no opening on the location corresponding to the current-conducting region 2125B3. In such a case, even though a relatively small amount of current may pass through the current-conducting region 2125B3 to enable the epitaxial structure to emit the light, there is still no light emitting zone formed because the light may be absorbed or blocked by the first electrode layer 2140 from emitting out of the light emitting unit 2014. That is, the third region 2014C of the light emitting unit 2014 shows no bright spot therein. Further, in the FFD pattern, the light intensity of the second region 2014B of the light emitting unit 2014 is substantially equal to the first region 2014A, and the ratio thereof is ranged from 0.9 to 1.1.

The light emitting unit 2011 as above-mentioned may further include a second current-confining structure for blocking the lateral flow of current (or "the lateral current"), so as to avoid the current from passing through the current-conducting regions 2125B3 and 212bB2. The details will be given in the following.

Figure 26A:
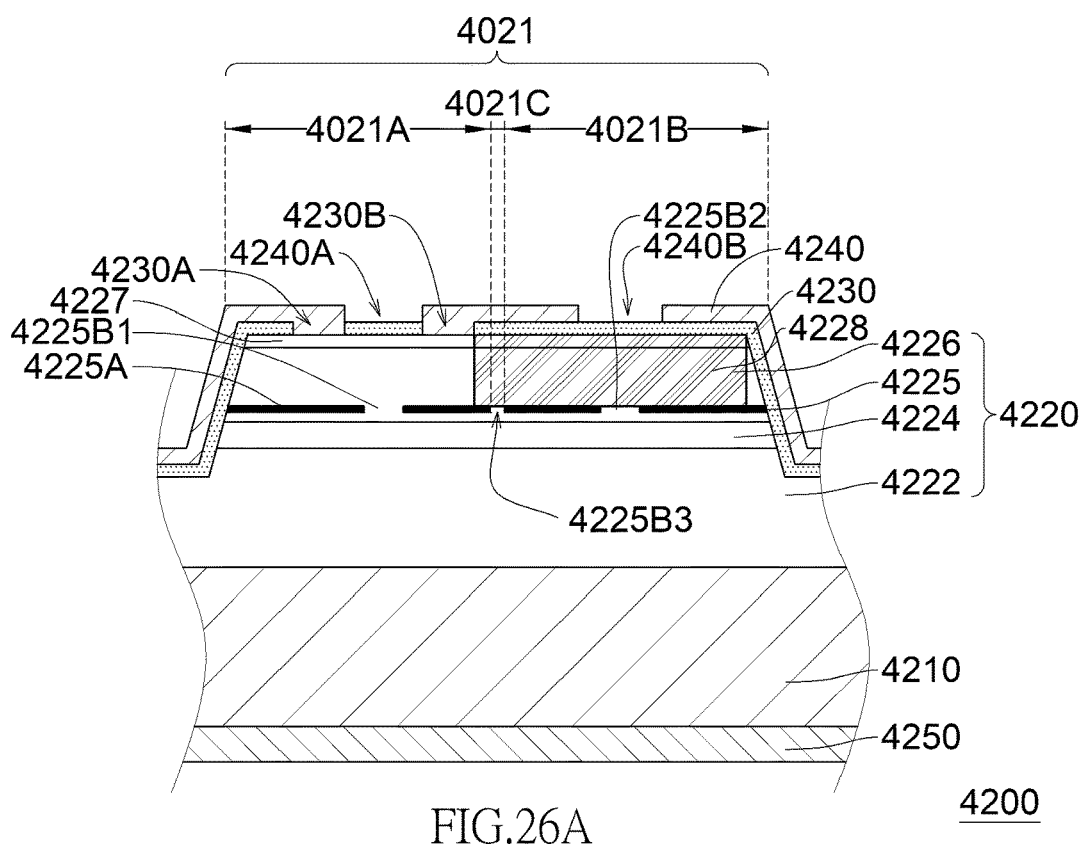
FIG. 26A to FIG. 26C are cross-sectional views showing a part of structure of the light emitting unit of the embodiment of the present disclosure.
Figure 26B:
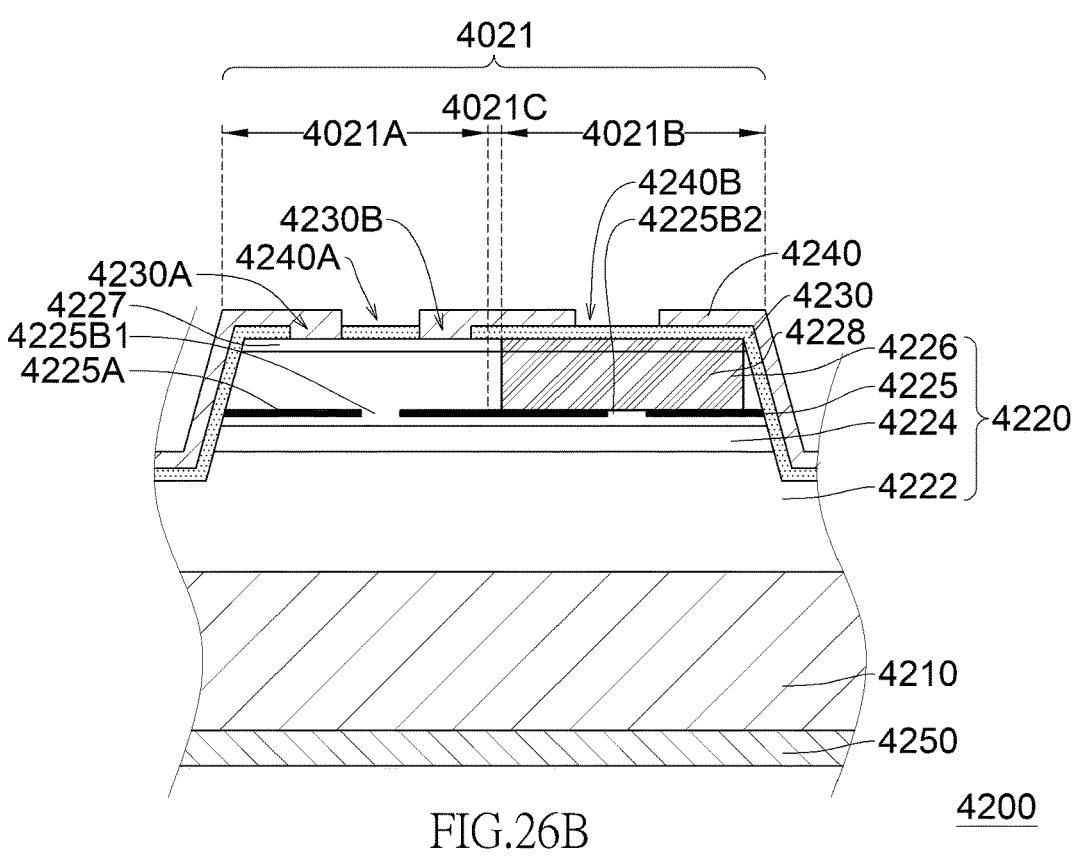
Figure 26C:
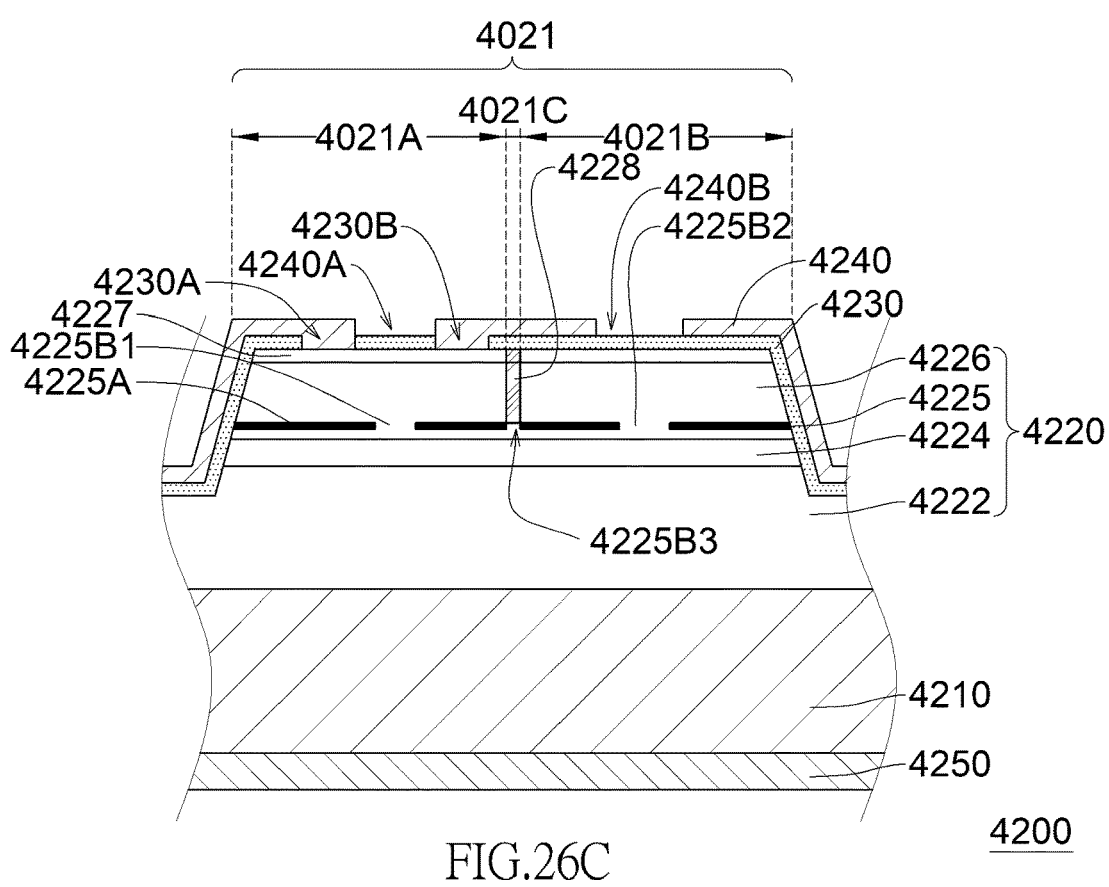

Please refer to FIG. 26A to FIG. 26C, which are cross-sectional views showing a part of structure of the lighting unit 4021 of the semiconductor laser element 4200 (similar to the semiconductor laser element 2100 as shown in FIG. 25A) according to the embodiment of the present disclosure. By means of the design of epitaxial structure, or the process modification, the light zone of the light emitting unit 4021 is formed as being in the first region 4021A, but not in the second region 4021B. Similarly, when the semiconductor laser element 4200 as shown in FIG. 2A to FIG. 2C is powered, the light emitting unit shows a bright spot in the first zone 4021A thereof.

The semiconductor laser element 4200 as shown in FIG. 26A to FIG. 26C has similar structure as the embodiment of FIG. 25C. In the present disclosure, corresponding reference numerals are provided for similar parts or elements of the structure. For example, the semiconductor laser element

2100, 4200, the insulating opening 2130A, 4230A, the first electrode layer 2140, 4240, the second electrode layer 2150, 4250, and so on. The difference therebetween is illustrated as below.

As shown in FIG. 26A, the light emitting unit 4021 is formed as having only one light emitting zone (similar to the light emitting unit 2011, 2012). In order to completely avoid the current from passing through the current-conducting region 4225B2, 4225B3, the epitaxial structures of the second region 4021B and/or the third region 4021C may further include a second current-confining structure 4228 formed therein, for blocking the lateral flow of the current (or "the lateral current"). In more specific, the second current-confining structure 4228 is formed in the epitaxial structure 4220, between the first current-confining structure 4225 and the insulating layer 4230. That is, the second current-confining structure 4228 is formed in the second semiconductor structure 4226 and/or in the contact layer 4227 of the second region 4021B and/or the third region 4021C. However, the person having ordinary skills in this art will acknowledge that, the formation of second current-confining structure 4228 as mentioned is only for illustration, while the location of the second current-confining structure is not limited thereto. For example, in other embodiments, the second current-confining structure 4228 may be formed in the first semiconductor structure 4222 and/or in the active structure 4224. Further, when the first semiconductor structure 4222, the active structure 4224, and the second semiconductor structure 4226 are formed of a respective multilayer structure, the second current-confining structure 4228 may be formed in the all of, or in one portion of, the respective multilayer structure. According to the present disclosure, the first current-confining structure 4225 may be formed by means of oxidation or ion implantation. Similarly, the second current-confining structure 4228 may be also formed by oxidation or by ion implantation. Preferably, the first current-confining structure 4226 is formed by oxidation, while the second current-confining structure 4228 is formed by ion implantation. Depending on the process the second current-confining structure 4228 may be formed in the first region 4021A.

In a further embodiment, as shown in FIG. 26B, FIG. 25A and FIG. 25B, the current-conducting region has a fourth width of a maximum W4 (hereafter, "the fourth maximum width W4"). When the light emitting unit is formed as having only one light emitting zone (such as the light emitting units 2011, 2012), and 0<W3≤(W1−W4), there will be no current-conducting region 4225B3 formed in the third region 4021C. For example, when the first current-confining structure 4225 is formed by means of oxidation, and the depth of oxidation (referring to FIG. 28C, the direction of x and the direction of −x) is set to be (W1−W4)/2, the first current-confining structure 4225 will be all oxidized since 0<W3≤(W1−W4), forming a complete current-blocking region 4225A, and no current-conducting region 4225B3 will be formed thereby. Accordingly, the second current-confining structure 4228 may be formed only in the epitaxial structure of the second region 4021B, achieving the similar effect of blocking the current from passing through the current-conducting region 4225B2 and causing the light emitting unit to show one single bright spot in the first region 4021A, with a reduced cost for the process.

In a further embodiment, as shown in FIG. 26C, because the current is flowing from the first region 4021A, passing through the third region 4021C, and then to the second region 4021B, it may be an alternative to form the second current-confining structure 4228 in only the third region

4021C of the light emitting unit to block the current from entering the second region 4021B, thereby reducing the cost for the process. A further alternative is that, no current-conducting region 4225B3, 4225B2 are formed, thereby blocking the current flow directly. In such a case, the second region 4021B and the third region 4021C of the light emitting unit will show no bright spot therein.

As the above-mentioned, and referring to FIG. 25A for the top view, the light emitting units 2011, 4021 show the substantially the same appearance with the light emitting unit 2014 (e.g., showing an alphabet "8"-like shaped contour); however, the light emitting units 2011, 4021, 2014 may be provided with different amounts of light emitting zones (i.e., showing bright spots when the semiconductor laser element is powered) by the patterning of insulating layers 2130, 4230, and/or by modifying the configuration of the first current-confining structures 2125, 4225 and/or the second current-confining structure 4228. Thereby, the semiconductor laser elements 2100, 4200 may show an irregular or random lighting pattern. Similarly, the light emitting units 2011, 4021 may have the same amount of light emitting zones, but being arranged in different locations, with the light emitting unit 2012, so that the semiconductor laser element 2100, 4200 may show an irregular or random lighting pattern.

Further, as shown in FIG. 25A to FIG. 25C, due to the face that each of the light emitting units are formed as showing substantially the same appearance but having identical or different amounts of light emitting zones, the current-conducting region (or the light emitting zone) may not located at the center of the light emitting unit. In more specific, as shown in the top view (e.g., as shown in FIG. 25B), the light emitting unit 2011 has a geometric center N1, and the current-conducting region 2125B1 has a geometric center N2 not coinciding with N1. The shortest distance between N1 and N2 is larger than 2.5 μm, 3 μm, 4 μm or 5 μm.

In other words, as shown in the cross-sectional view of FIG. 25C, the current-conducting region 2125B is spaced from the first trench region 2110A with a first distance Z1, and is spaced from the second trench region 2110B with a second distance Z2. The first distance Z1 is greater than the second distance Z2, and the difference between the first distance Z1 and the second distance Z2, (Z1−Z2), is greater than the fourth maximum width W4 of the current-conducting region 2125B1.

Figure 27A:
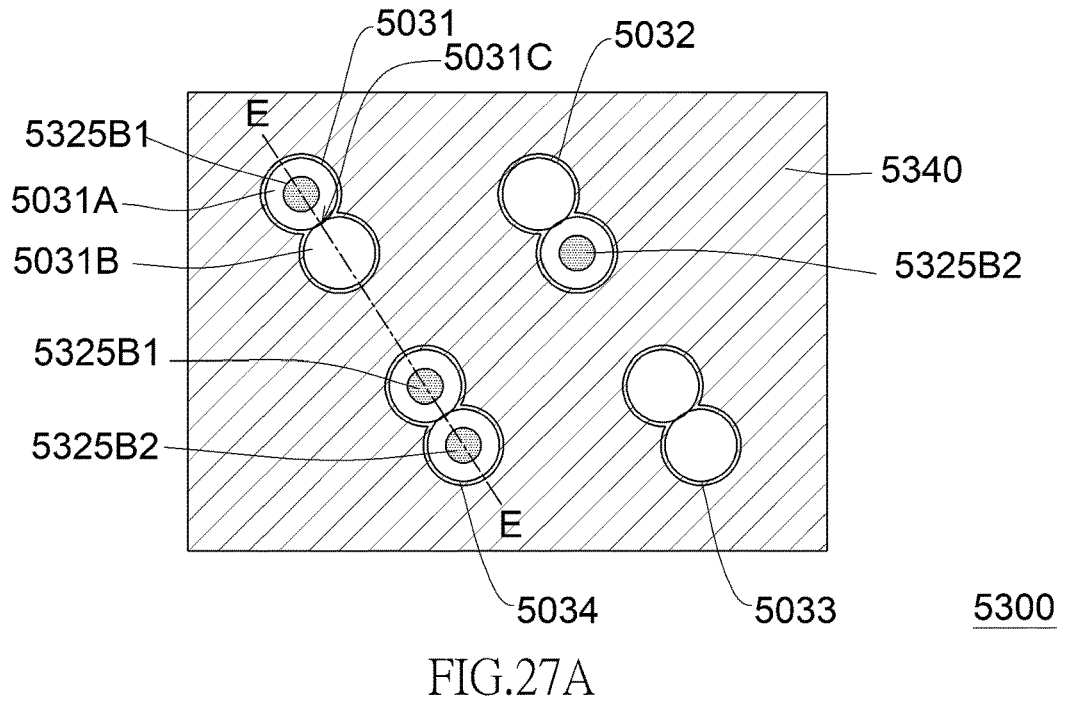
Figure 27B:
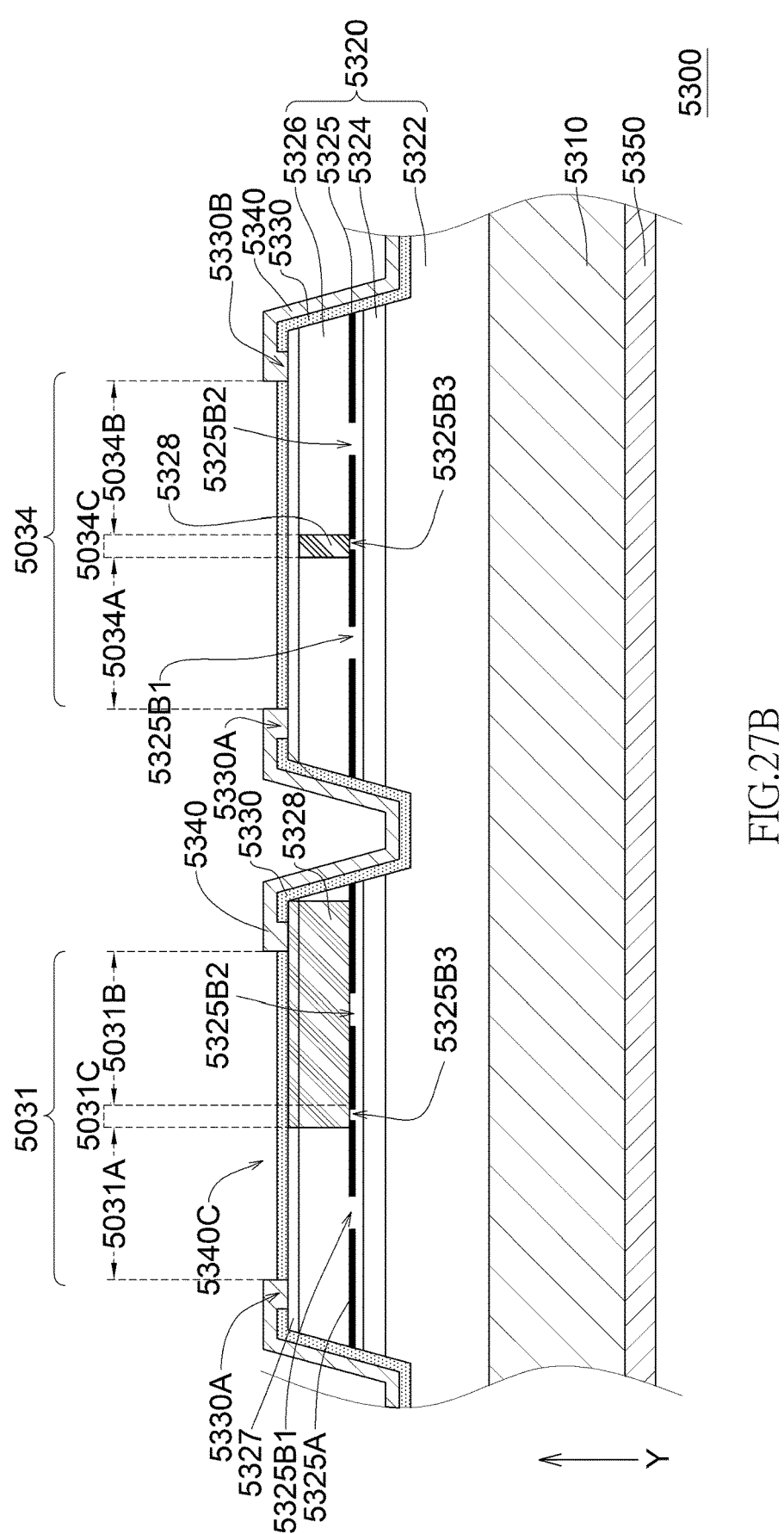

FIG. 27A is a top view showing the semiconductor laser element 5300 according to another embodiment of the present disclosure, in which some layers or structures of the semiconductor laser element 5300 are not shown for brevity. FIG. 27B is a schematic view showing the semiconductor laser element in the cross-section taken along line E-E of FIG. 27A. The semiconductor laser element 5300 has similar construction to the semiconductor laser element 4200. In the present disclosure, corresponding reference numerals are provided for similar parts or elements of the structure, and the materials and properties of these parts or elements are as above-mentioned, which are not repeated for brevity. For example, the semiconductor laser element 2100, 4200, 5300, the insulating opening 2130A, 4230A, 5330A, the first electrode layer 2140, 4240, 5340, the second electrode layer 2150, 4250, 5350, and so on. The difference between the present embodiment and the above-mentioned embodiments is that, in this embodiment, the first electrode layer 5340 of the semiconductor laser element 5300 is formed as having one opening 5340C, and this opening 5340C has substantially the same shape to that of the second semiconductor structure 5326 or the active structure 5324, such as showing an alphabet "8"-like shaped contour. Accordingly, the light emitting unit is defined by the opening 5340C of the first electrode layer 5340. Besides, in the top view as shown, the area of the opening 5340C of the first electrode layer 5340 is smaller than that of the second semiconductor structure 5326 or the active structure 5324.

In more specific, as shown in FIG. 27A, the first electrode layer 5340 includes plural openings 5340C to define the location of the respective light emitting unit (only four openings are shown in FIG. 5340, i.e., the four light emitting units 5031 to 5034). These openings 5340C are formed as being regularly arranged, and thus the plural light emitting units are also arranged in a regular manner. Similarly, each of the opening 5340C includes two sub-units C1 and C2 that are overlapping each other, and includes a first region 5031A, a second region 5031B and a third region 5031C. The definitions of first region, second region and third region are similar to those of the embodiment as shown in FIG. 25A to FIG. 25C, and are not repeated for brevity.

As shown in FIG. 27B, the first region 5031A, the second region 5031B and the third region 5031C are defined by the opening 5340C of the first electrode layer 5340. The light emitting unit 5031 includes a second current-confining structure 5328 formed in the epitaxial structure 5320 (a portion of the second semiconductor structure 5326 or all thereof) of the second region 5031B and the third region 5031C to avoid the current from entering the current-conducting region 5325B2, 5325B3. Therefore, the light emitting unit 5031 is formed as having only one light emitting zone. The light emitting unit 5034 includes the second current-confining structure 5328 formed in the third region 5034C to avoid the current from entering the current-conducting region 5325B3. Therefore, the light emitting unit 5034 is formed as having two light emitting zones.

In a further embodiment, similar to those as shown in FIG. 27B, there may be no current-conducting region 5325B2 formed in the light emitting unit, and the second current-confining structure 5328 may be selectively formed in the first region and/or in the second region, such that the light emitting unit is provided with two (no second current-confining structure 5328 is formed), one (the second current-confining structure 5328 is formed in the first region, or in the second region), or no (the second current-confining structure 5328 is formed in the first region, and in the second region) light emitting zones.

Figure 28A:
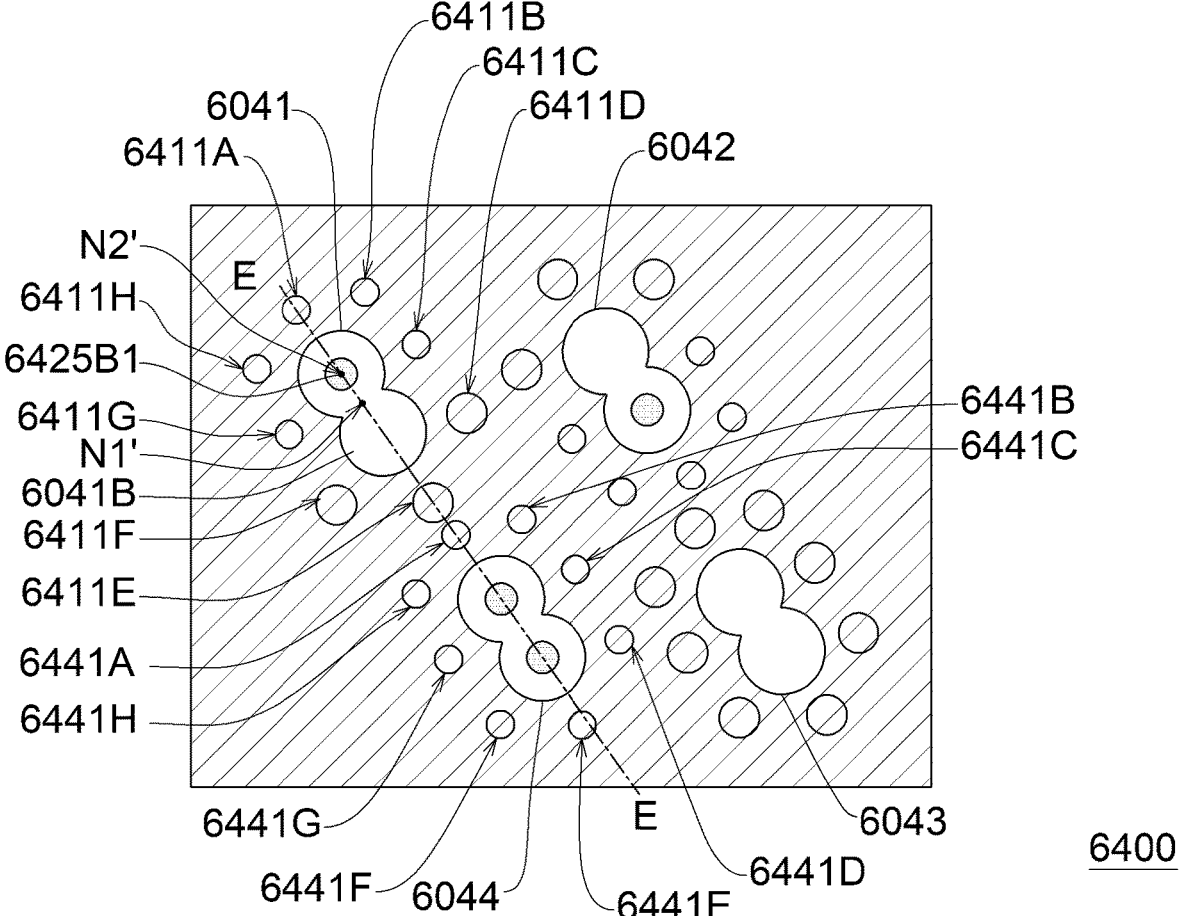
Figure 28B:
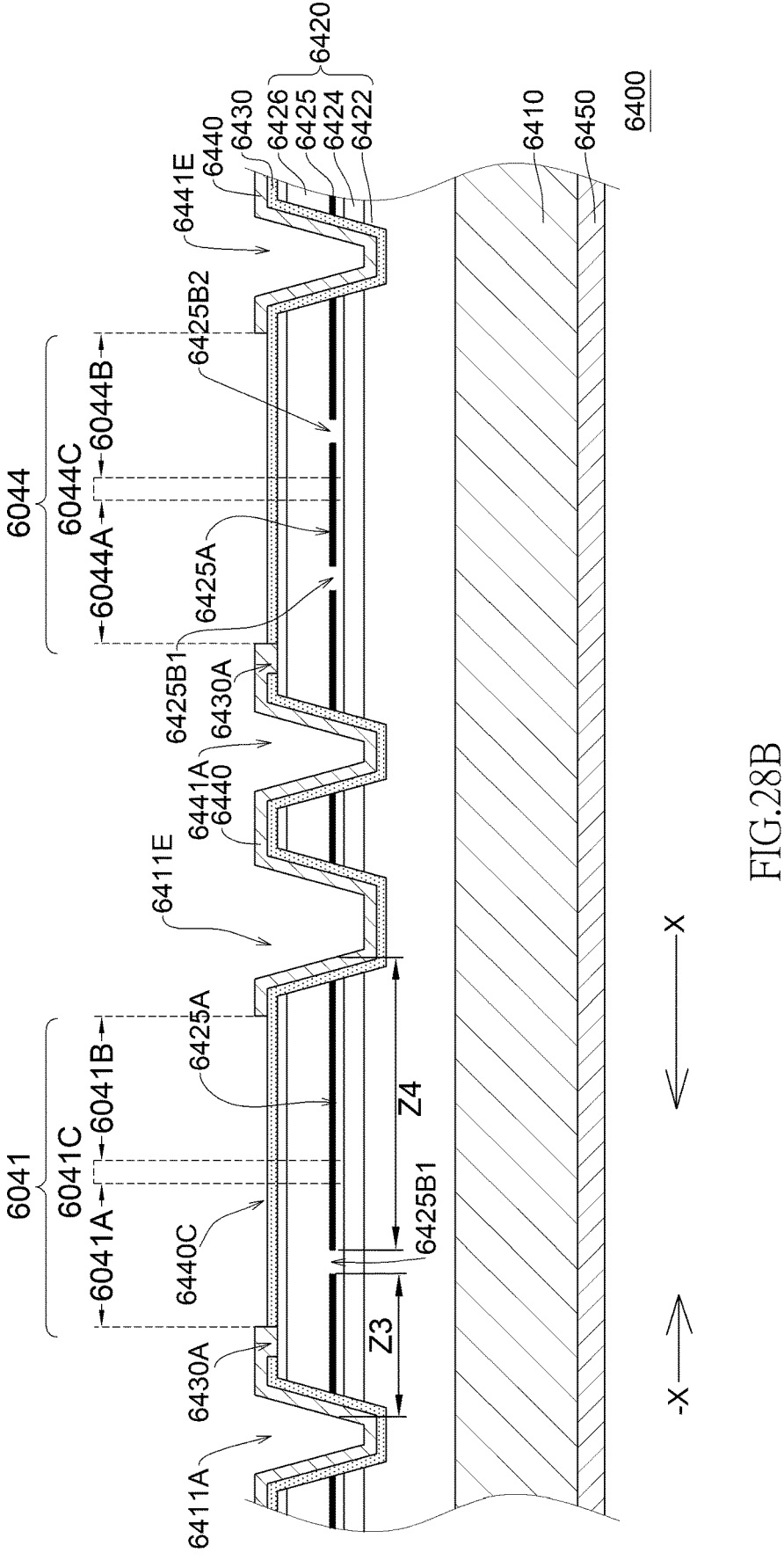
Figures 28C, 28D:
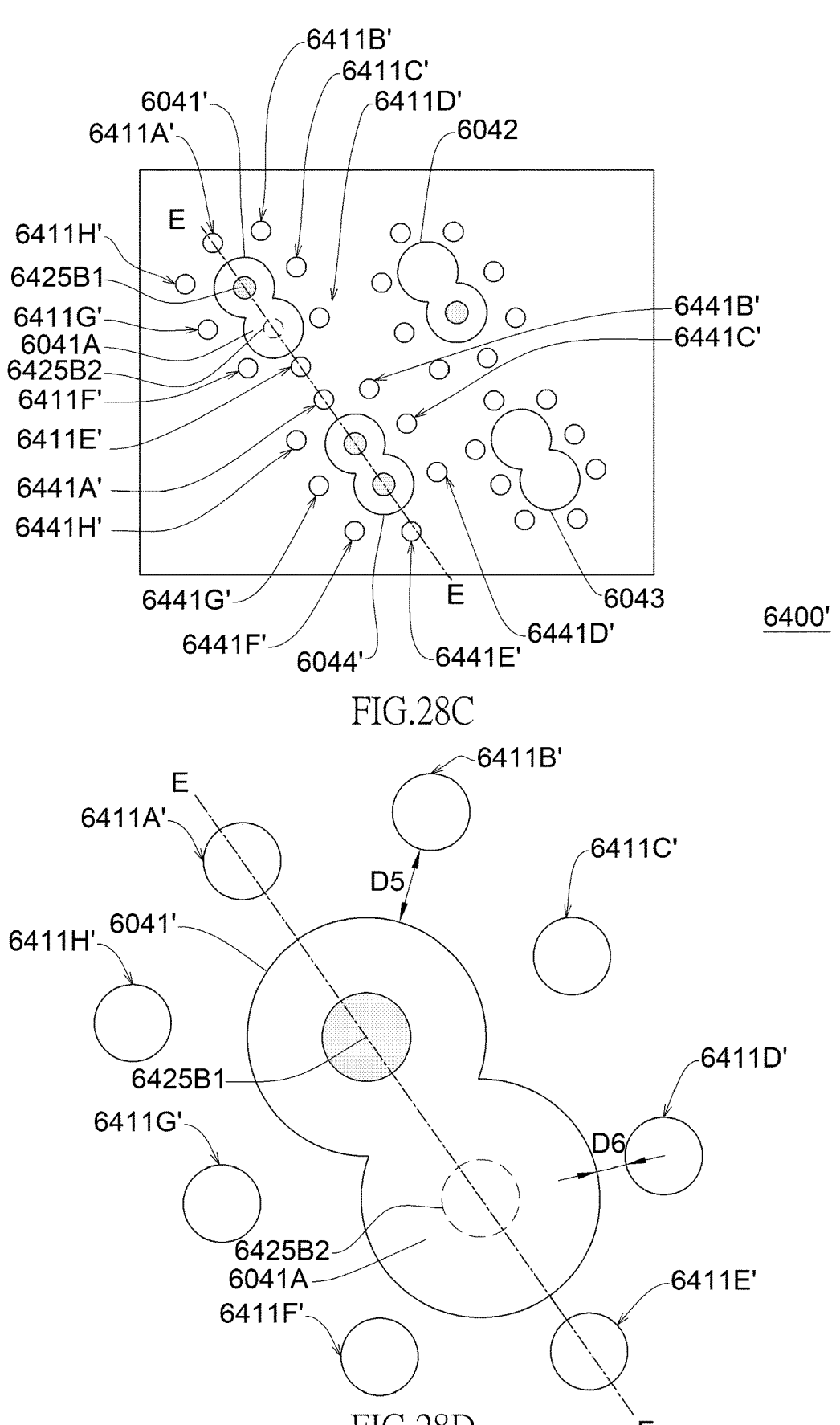

Please refer to FIG. 28A and FIG. 28B, which are respectively a top view and a cross-sectional view showing the semiconductor laser element 6400 according to still one embodiment of the present disclosure, wherein FIG. 28A shows the array of light emitting units of the semiconductor laser element 6400 in the top view, and some parts or layers thereof are not shown for brevity; FIG. 28B shows the semiconductor laser element 6400 in the cross-section taken along line E-E of FIG. 28A. Moreover, FIG. 28C and FIG. 28D are top views showing a portion of the array of light emitting units according to one embodiment of the present disclosure, wherein FIG. 28D is an enlarged view of a portion of FIG. 28C. Similarly, corresponding reference numerals are provided for similar parts or elements of the structure.

Similar to those as shown in FIG. 27A to FIG. 27C, the light emitting unit according to this embodiment is defined by the opening 6440C of the first electrode layer 6440. The first electrode layer 6440 includes plural openings 6440C to define the location of the respective light emitting units (there are four openings shown in FIG. 28A, which means four light emitting units 6041 to 6044). The plural openings

6440C are formed as being regularly arranged, and therefore the light emitting units are also arranged in a regular manner. Similar to the embodiment as shown in FIG. 27A, each of the light emitting units has similar or the same shape, and may include no, one or two (or more than two) light emitting zones therein. For example, the light emitting unit 6043 as shown in FIG. 28A includes no light emitting zone, while the light emitting units 6041 and 6042 include one respective light emitting zone, and the light emitting unit 6042 includes two light emitting zones. The so-called light emitting zone will show the bright spot when the semiconductor laser element 6400 is powered.

Please refer to FIG. 28B, in this embodiment, each one light emitting unit (e.g., the light emitting unit 41, 44) of the array of light emitting units of the semiconductor laser element 6400 includes the epitaxial structure 6420, the insulating layer 430, and first electrode layer 6440 that are disposed on the substrate 6410 in order, and the second electrode layer 6450 disposed on the back side of the substrate 6410. The present embodiment is different from that as shown in FIG. 27A in that, in the embodiment as shown in FIG. 28A and FIG. 28B, the trench regions 6411A to 6411H of the trench structure are not connected to each other. Please refer to the following for the details.

In this embodiment, as shown in FIG. 28B, the semiconductor laser element 6400 includes plural trench regions 6411A, 6411E, 6411A, 6411E formed in the epitaxial structure 6320 (which are corresponding to the trench regions 6411A to 6411H). That is, the trench regions 6411A, 6411E, 6411A, 6411E are formed in the first semiconductor structure 6422, the active structure 6424, and the second semiconductor structure 6426. In more detailed, in this embodiment, the trench regions 6411A, 6411E, 6411A and 6411E are formed in the first semiconductor structure 6422, the active structure 6424, and the second semiconductor structure 6426, thereby the second semiconductor structure 6426 is exposed. In another embodiment, the trench regions 6411A to 6411H are formed as penetrating the first semiconductor structure 6422, the active structure 6424, and the second semiconductor structure 6426, thereby the substrate 6410 is exposed.

The semiconductor laser element 6400 in accordance with the present embodiment optionally includes the first current-confining structure 6425. The first current-confining structure 6425 includes a current-blocking region 6425A, and a current-conducting regions 6425B1, 6425B2, 6425B3 that are respectively surrounded and defined by the current-blocking region 6425A. The first current-confining structure 6425 may be formed by oxidation, or by ion implantation. In this embodiment, when the first current-confining structure 6425 is formed by means of oxidation, the oxygen may react with the epitaxial structure 6420 through the trench regions 6411A, 6411E, 6411A, 6411C (which is illustrated in the following), so as to form the current-blocking region 6425A (the oxidation region) and the current-conducting regions 6425B1, 6425B2, 6425B3 (the non-oxidation regions) in the epitaxial structure 6420.

Referring to FIG. 28A as well, in this embodiment, each one light emitting unit (e.g., the light emitting unit 41, 44 as shown in FIG. 28A) of the semiconductor laser element includes eight trench regions (e.g., the trench regions 6411A to 6411H, 6411A to 6411H) surrounding at the periphery. The trench regions 6411A to 6411H are formed as having different dimensions, thereby the respective location of the oxidation region and the non-oxidation regions can be controlled and/or determined. In other words, in this embodiment, the respective location that the current-blocking region 6425A and the current-conducting regions 6425B1, 6425B2 and 6425B3 are formed at are controllable by adjusting the dimension of the trench regions 6411A to 6411H, so that the amount and location of the light emitting zone in the light emitting units 6041, 6044 of the semiconductor laser element 6400 can be controlled.

For example, as shown in FIG. 28B, in the light emitting unit 6041, the trench region 6411A is of a reduced width compared to the trench region 6411E, thereby the oxidation rate in the trench region 6411A is less than that in the trench region 6411E. In more detailed, when performing the oxidation process, the oxygen will react with the layer having an increased amount of aluminum (will be illustrated later) of the epitaxial structure through the trench region 6411A and the trench region 6411E. The oxygen may react with the layer of an increased amount of aluminum at a relatively small rate in the proximity of the trench region 6411A because of the relatively small oxidation rate. In this case, the oxidation depth (the direction −X as shown) in the proximity of the trench region 6411A will be less than the oxidation depth (the direction X as shown) in the proximity of the trench region 6411E, thus forming in the first region 6041A the current-conducting region 6245B1, but forming no current-conducting region in the second region 6041B and the third region 6041C. Thereby, the current injected into the semiconductor laser element 6400 may pass through the current-conducting region 6425B1, forming the light emitting zone in the light emitting unit 6041. In other words, the first region 6041A of the light emitting unit 6041 shows the bright spot when powered.

Similarly, as shown in FIG. 28B, in the light emitting unit 6044, the oxidation rate of the trench regions 6411A to 6411E is identical because of the same width of the trench regions 6411A to 6411E. In such case, the respective oxidation depths in the proximity of these trench regions (the X direction and the −X direction) are the same, thus forming the current-conducting region 6425B1 and the current-conducting region 6425B2 in the first region 6044A and the second region 6044B, respectively. Thereby, the current injected into the semiconductor laser element 6400 may pass through the current-conducting regions 6425B1, 6425B2, forming the light emitting zone in the light emitting unit 6044. In other words, the first region 6044A and the second region 6044B of the light emitting unit 6044 will show the bright spots when powered.

As shown in FIG. 28A, due to the face that each of the light emitting units are formed as showing substantially the same appearance but having identical or different amounts of light emitting zones, the current-conducting region (or the light emitting zone) may not located at the center of the light emitting unit (or the opening of the first electrode layer). In more specific, as shown in the top view (e.g., as shown in FIG. 28A), the light emitting unit 6041 has a geometric center N1', and the current-conducting region 6425B1 has a geometric center N2' not coinciding with N1'. The shortest distance between N1' and N2' is larger than 2.5 μm, 3 μm, 4 μm or 5 μm.

In other words, as shown in the cross-sectional view of FIG. 28B, the current-conducting region 6425B1 is spaced from the first trench region 6411A at a first distance Z3, and is spaced from the second trench region 6411B at a second distance Z4 larger than Z3. The difference between the first distance Z3 and the second distance Z4, i.e., (Z4−Z3), is greater than the fourth maximum width W4.

FIG. 28C and FIG. 28D are top views showing a portion of the array of light emitting units of the semiconductor laser element 6400' according to one embodiment of the present disclosure, wherein FIG. 28D is an enlarged view of a portion of FIG. 28C. In the semiconductor laser element 6400' of this embodiment, the location at which the trench region is disposed is selected to control the formation of current-blocking region and the current-conducting region. In this embodiment, the eight trench regions at the periphery of light emitting unit 6041' are of the same dimension, but are respectively spaced from the opening of the first electrode layer (or the current-conducting region to be formed) at different distances.

In more specific, the trench regions 6411A' to 6411C' and the trench regions 6411G' to 6411H' are each spaced from the opening 6440C (the region to be formed as the current-conducting region 6425B2, shown in dash) of the first electrode layer 6440 at an identical distance, which is a shortest distance D5. The trench regions 6411D' to 6411F' are each spaced from the opening of the first electrode layer 6440 at an identical distance, which is a shortest distance D6, in which D6<D5. When performing the oxidation process, the oxidation rates of the respective trench regions 6411A' to 6411H' are identical because the dimensions thereof are the same. In the same duration of oxidation, the oxidation depth formed at the trench regions 6411D' to 6411F' will be greater (see, the direction X as shown in FIG. 28B) because the trench regions 6411D' to 6411F' are disposed at a nearer location compared to the remaining trench regions. Thus, the current-conducting region 6425B2 is not formed. In such a case, the current injected into the semiconductor laser element 6400' will pass through the current-conducting region 6425B1, and forms the light emitting zone in the light emitting unit 6041'. In other words, the first region 6041A' of the light emitting unit 6041' will show the bright spot when being powered.

In addition to the above-mentioned embodiments, the locations and the number of the light emitting zones of the light emitting units can be varied and controlled by the configuration of corresponding layers or structures of the semiconductor laser element. Please refer to FIG. 29A and FIG. 29B, which are cross-sectional views showing the structure of the light emitting unit of the semiconductor laser element according to one embodiment of the present disclosure. As mentioned, similar parts or elements of the structure among these embodiments are provided with corresponding reference numerals.

For brevity, only the structure corresponding to the second zone 2011B of the light emitting unit 2011 of FIG. 25A is shown.

Figure 29A:
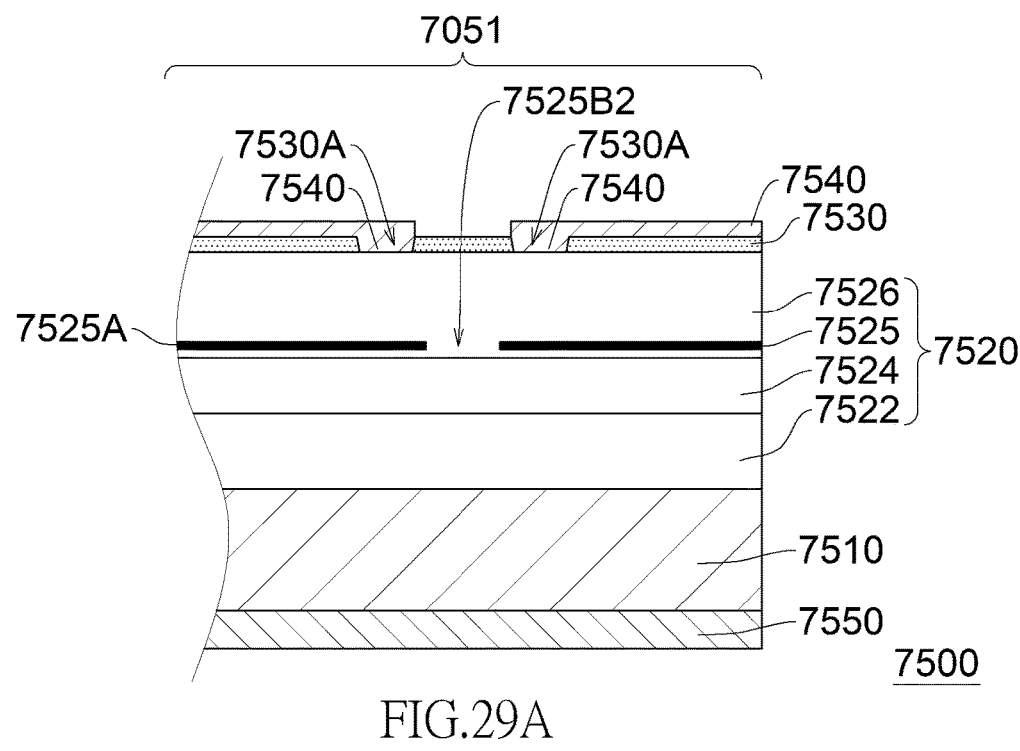
FIG. 29A and FIG. 29B are cross-sectional views showing the structure of the light emitting unit of the semiconductor laser element according to one embodiment of the present disclosure.

As shown in FIG. 29A, in this embodiment, the second semiconductor structure 7526 does not include the contact layer (as shown in FIG. 25A) therein. The first electrode layer 7540 may contact only the second semiconductor structure 7526 through the opening 7530A but cannot form the ohmic contact with the second semiconductor structure 7526. By increasing the resistance of this portion, the current injected into the semiconductor laser element 7500 is blocked to flow through the current-conducting region 7515B2, resulting in no formation of the light emitting zone. Alternatively, the second semiconductor structure 7526 includes therein a contact layer (not shown in FIG. 29A) of a dopant concentration of less than $5\times10^{18}$, such that the first electrode layer 7540 may not form the ohmic contact therewith.

Figure 29B:
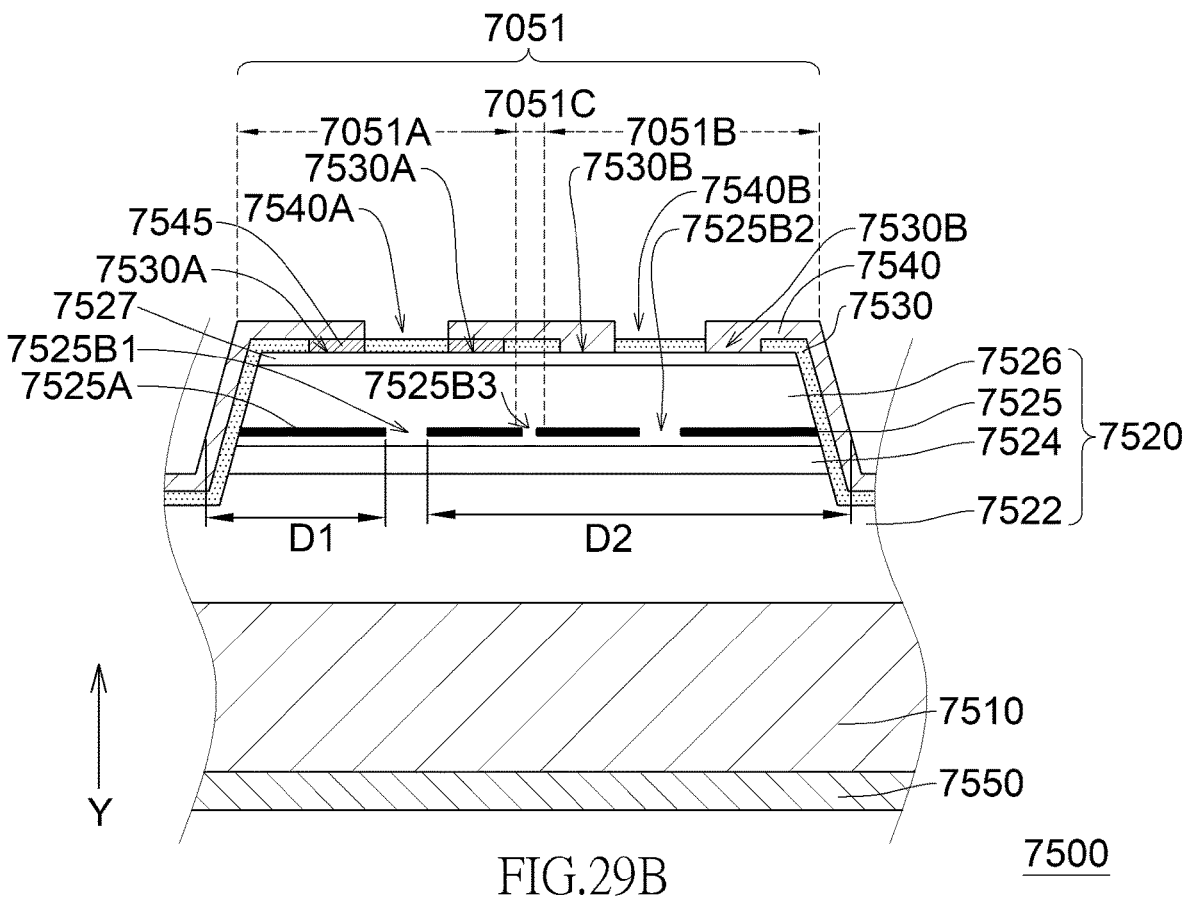

The semiconductor laser element 7500 as shown in FIG. 29B has the corresponding structure to the embodiment of FIG. 25C. The difference between the two embodiments is that, as shown in FIG. 29B. the first region 7051A of the light emitting unit 7051 of the semiconductor laser element 7500 further includes an intermediate layer 7545 formed in the opening 7530A of the insulating layer 7530, but not formed in the opening 7530B. the first electrode layer 7540 is disposed on the patterned insulating layer 7530 and the intermediate layer 7545. In the second region 7051B of the light emitting unit 7051, the first electrode layer 7540 is disposed within the opening 7530B, and contacts in direct with the contact layer 7527. In this embodiment, by selecting properly the material of the first electrode layer 7540 and the material of the intermediate layer 7527, the first region 7051A and/or the second region 7051B of the light emitting unit 7051 can be selectively formed as the light emitting zone(s). For example, when the first electrode layer 7540 is formed of the material that is able to form the ohmic contact with the contact layer 7527 (such as Ti, Pd, Cr, ITO, BeAu, ZnAu, Ag, GeAu, GeAuTi, etc.), and the intermediate layer 7545 is formed of such as Ni, Au, and Pt, the intermediate layer 7545 will not form the ohmic contact with the contact layer 7527, even though being contact in direct with the contact layer 7527, resulting in an increased resistance. In such case, the current injected into the semiconductor laser element 7500 may mostly or even all pass through the current-conducting region 7525B2, resulting in the light emitting zone in the second region 7051B, but no light emitting zone in the first zone 7051A. On the contrary, when the intermediate layer 7545 is formed of the material that is able to form the ohmic contact with the contact layer 7527 (such as Ti, Pd, Cr, ITO, BeAu, ZnAu, Ag, GeAu, GeAuTi, etc.), and the firstI electrode layer 7540 is formed of such as Ni, Au, and Pt, the first electrode layer 7540 will not form the ohmic contact with the contact layer 7527, even though being contact in direct with the contact layer 7527, resulting in an increased resistance. In such case, the current may mostly or even all pass through the current-conducting region 7525B1, resulting in the light emitting zone in the first region 7051A, but no light emitting zone in the second zone 7051B. Please refer to FIG. 30A to FIG. 30C, which are top views showing the respective lighting patterns of the semiconductor laser element according to various embodiments of the present disclosure. As shown, each light emitting unit of the array of light emitting units of the semiconductor laser element may formed by sub-units of the same or different shapes, and the same or different sizes that are overlapping each other. Thereby, the randomness and the complexity of the lighting patterns of the semiconductor laser element may be increased.

Figures 30A, 30B, 30C:
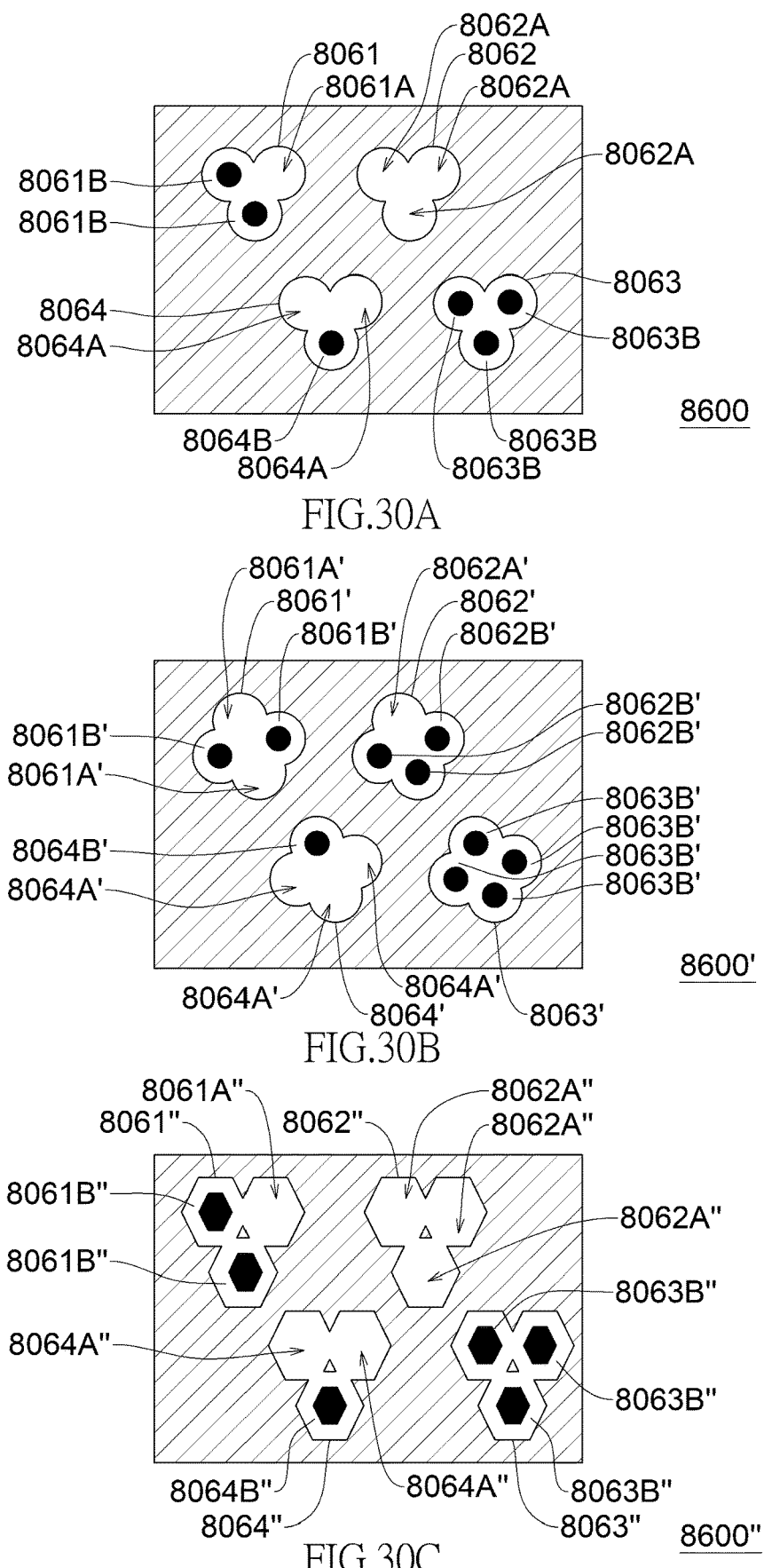
FIG. 30A to FIG. 30C are top views showing the respective lighting patterns of the semiconductor laser element according to various embodiments of the present disclosure.

For example, as shown in FIG. 30A to FIG. 30C, the arrays of light emitting units 8600, 8600', 8600" each includes plural light emitting units that are arranged in a regular manner (only four light emitting units 8061 to 8064, 8061' to 8064', 8061" to 8064" are shown for illustration in FIG. 30A to FIG. 30C, respectively). The light emitting units may each include no, one, two, three or more than three light emitting zones. It should be noted that the locations and numbers of the light emitting zones can be varied by modifying the structure of the light emitting units.

As shown in FIG. 30A, according to the present embodiment, each of the light emitting units 8061 to 8064 of the array of light emitting units of the semiconductor laser element 8600 is constructed by three substantially circular-shaped sub-units of identical size that are overlapping each other. The first light emitting unit 8061 is formed as having one disabled aperture (i.e., the region with no light emitting) 8061A and two enabled apertures (i.e., light-emitting zones showing the bright spots when being powered) 8061B. The second light emitting unit 8062 is formed as having three sub-units that are all disabled apertures 8062A. The third light emitting unit 8063 is formed as having three sub-units that are all enabled apertures (light emitting zones) 8063B. The fourth light emitting unit 8064 is formed as having two disabled apertures 8064A and one enabled aperture 8064B. According to the present disclosure, by means of modifying the structures of the light emitting units, each light emitting unit 8061, 8062, 8063, 8064 may have different combinations of light emitting zones, i.e., bright spots, (in respect of the number and size). Thereby, the array of light emitting units of the semiconductor laser element 8600 that are arranged in a regular manner can show the lighting pattern of irregularly and randomly distributed bright spots when being activated by the injected current.

In the present disclosure, by means of the adjusting and modifying of structure or material of the layers, the number of sub-units of each light emitting unit can be further increased to form a lighting pattern with a higher randomness. For example, as shown in FIG. 30B, each of the light emitting units 8061' to 8064' of the array of light emitting units of the semiconductor laser element 8600' is constructed by four substantially circular-shaped sub-units of identical size that are overlapping each other. The first light emitting unit 8061' is formed as having two disabled aperture (i.e., the region with no light emitting) 8061A' and two enabled apertures (i.e., light-emitting zones showing the bright spots when being powered) 8061B'. The second light emitting unit 8062' is formed as having one disabled aperture 8062A' and three enabled apertures 8062B'. The third light emitting unit 8063' is formed as having four sub-units that are all enabled apertures (i.e., all bright spots) 8063B'. The fourth light emitting unit 8064' is formed as having three disabled apertures 8064A' and one enabled aperture 8064B'. In this embodiment, the amounts of sub-units included by each of the light emitting units 8061' to 8064' are increased, and the complexity of the combination (in respect of the number and location of the bright spots) for the light emitting units 8061' to 8064' is thus enhanced. Thereby, the array of light emitting units of the semiconductor laser element 8600' that are arranged in a regular manner can show the lighting pattern of more randomly distributed bright spots when being activated by the injected current.

In the present disclosure, the shape of the sub-unit of each light emitting unit may be varied. For example, as shown in FIG. 30C, each of the light emitting units 8061" to 8064" of the array of light emitting units of the semiconductor laser element 8600" is constructed by three substantially hexagon-shaped sub-units of identical size that are overlapping each other. As above-mentioned, by means of the various combination of disabled apertures (the regions with no light emitting 8061A", 8062A", 8063A", 8064A") and enabled apertures (the light emitting zones or bright spots 8061B", 8062B", 8063B" 8064B"), the array of light emitting units of the semiconductor laser element 8600" that are arranged in a regular manner can show the lighting pattern of irregularly and randomly distributed bright spots when being activated by the injected current.

Figure 31A:
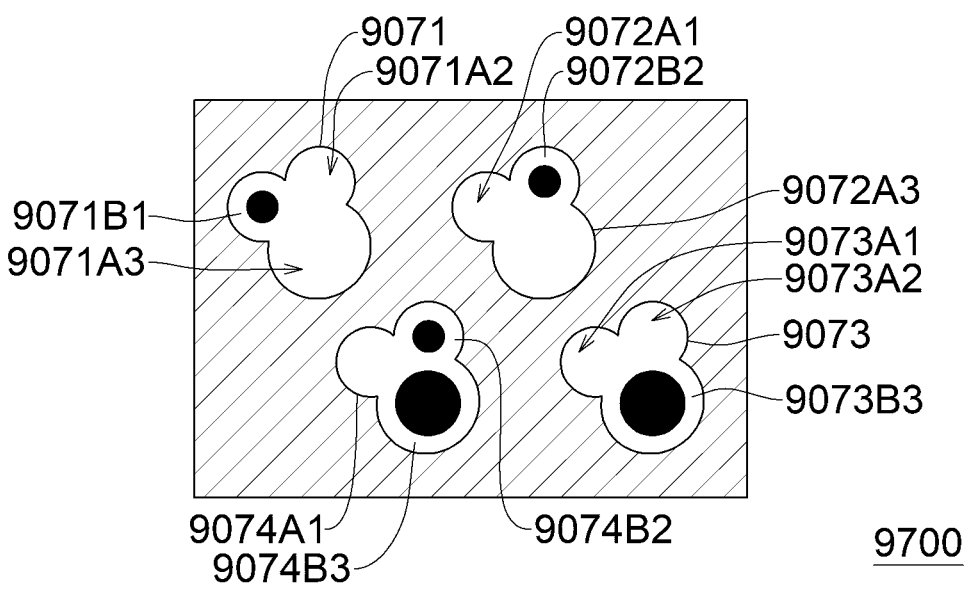
FIG. 31A and FIG. 31B are top views showing the respective lighting patterns of the semiconductor laser element according to various embodiments of the present disclosure.

In the present disclosure, the sub-units of the respective light emitting units may be each formed as having different shapes and sizes, thus forming the light emitting zones of different shapes and different sizes. Please refer to FIG. 31A and FIG. 31B, which are top views showing the respective lighting patterns of the semiconductor laser element according to various embodiments of the present disclosure. For example, as shown in FIG. 31A, the array of light emitting units of the semiconductor laser element 9700 includes four light emitting units 9071 to 9074, each of which is formed by three overlapping sub-units of substantially circular shape and identical size. By means of modifying the process for the various layer structures (as illustrated in relation to FIG. 25A to FIG. 25C, FIG. 26A to FIG. 26C, and FIG. 27A and FIG. 27B), the location of each light emitting zone (i.e., the location of bright spot) of each light emitting unit 9071 to 9074 can be controlled. For example, the light emitting unit 9071 includes the light emitting zone or enabled aperture (bright spot) 9071B1 and the disabled apertures with no light emitting 9071A2 and 9071A3. The light emitting unit 9072 includes the light emitting zone or enabled aperture (bright spot) 9072B2 and the disabled apertures with no light emitting 9072A1 and 9072A3. The light emitting unit 9073 includes the light emitting zone or enabled aperture (bright spot) 9073B3 and the disabled apertures with no light emitting 9073A1 and 9071A2. The light emitting unit 9074 includes a relatively smaller light emitting zone or enabled aperture (bright spot) 9074B2 and a relatively larger light emitting zone or enabled aperture (bright spot) 9074B3, and the disabled apertures with no light emitting 9074A1 in a relatively smaller sub-unit.

Figure 31B:
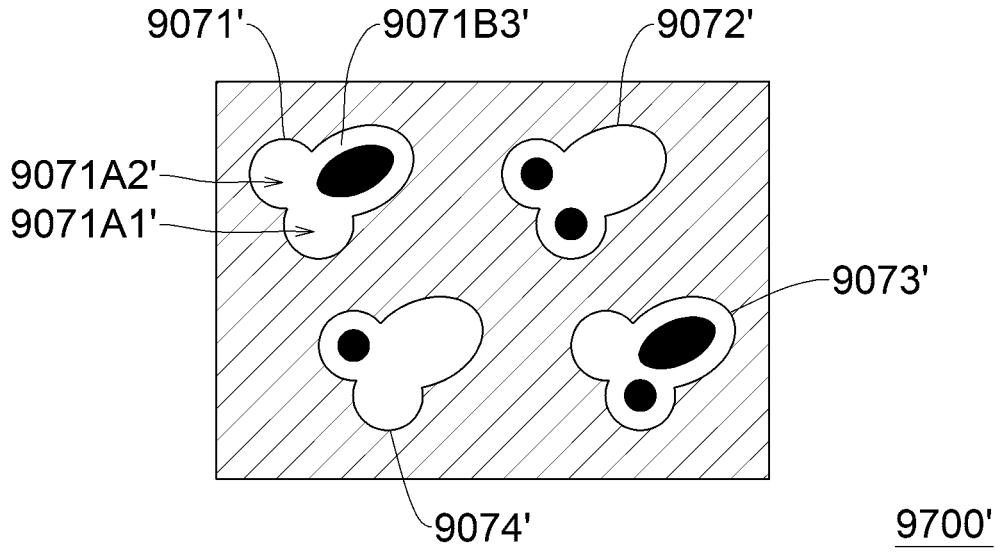

As shown in FIG. 31B, the light emitting units 9071' to 9074' of the array of light emitting units 9700' are each formed by the overlapping sub-units of different shapes and different sizes. For example, the light emitting unit 9071' includes the disabled apertures 9071A1' and 9071A2' that are formed by circular sub-units of a relatively smaller size, and the enabled aperture (the light emitting zone) 9073B3' formed by a relatively larger, oval-shaped sub-unit. As above-mentioned, by means of adjusting the number and shape of the sub-unit included by each light emitting unit, the randomness and complexity of lighting patterns of the laser unit can be further increased.

Figures 32A, 32B:
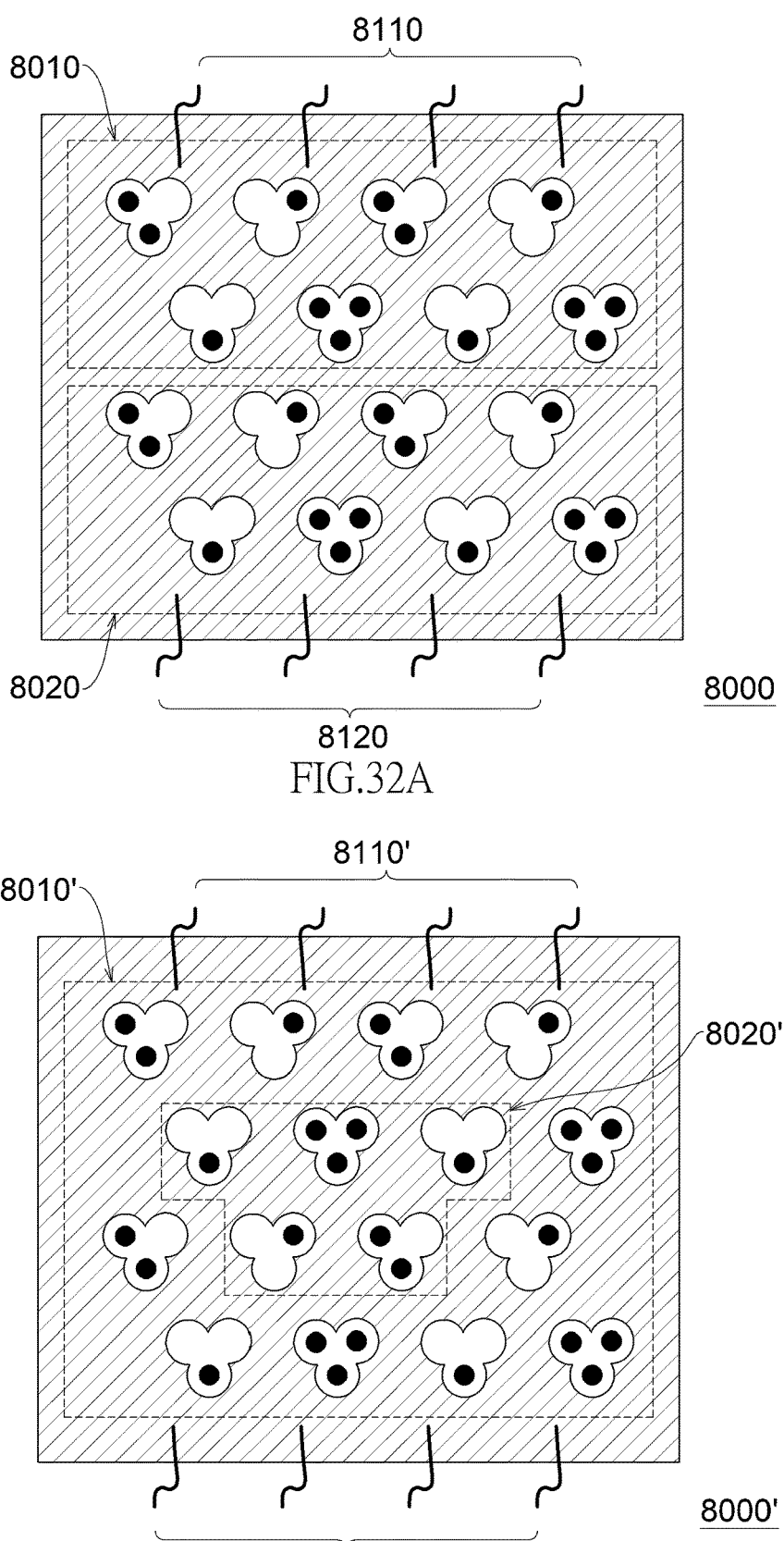
FIG. 32A and FIG. 32B are top views showing the light emitting unit set of the semiconductor laser element according to the embodiment of the present disclosure.

Please refer to FIG. 32A and FIG. 32B, which are top views showing the light emitting unit set and lighting pattern of the semiconductor laser element according to the embodiment of the present disclosure. In the present disclosure, each light emitting unit of the semiconductor laser element can be individually controlled, in a region-by-region manner, so as to power the respective light emitting unit set depending on the usage scenario, thereby saving the power consumption. For example, as shown in FIG. 32A, the array of light emitting units 8000 is divided into a first light emitting unit set 8010 and a second light emitting unit set 8020 that are arranged in parallel. The first and the second light emitting unit sets 8010 and 8020 are individually controlled by the respective electrode sets 8110 and 8220. In such manner, the amounts or numbers of enabled apertures emitting the light (i.e., the numbers of bright spots) can be controlled depending on the usage scenario (such as, for lighting, for payment identification, or for face recognition), so as to improve the accuracy of the algorithm for bright spots and thus the recognition with the saving of power consumption in operation. Further, as shown in FIG. 32B, the array of light emitting units 8000' is divided into a first light emitting unit set 8010' and a second light emitting unit set 8020' that are arranged in concentric (having the common optical axis), wherein the second light emitting unit set 8020' is surrounded by the first light emitting unit set 8010', and the two light emitting unit sets 8010', 8020' are individually controlled by the respective electrode sets 8110' and 8220'. Such configuration is particularly advantageous for the lighting application because the two light emitting unit sets can be individually operated depending on different usage scenarios such as general lighting or high-resolution lighting, so as to save the power consumption.

In this embodiment, the first semiconductor structure and the second semiconductor structure includes a plurality of film layers with different refractive indexes (for example, AlGaAs layer with high aluminum content and AlGaAs layer with low aluminum content) which are stacked up alternately and periodically to form Distributed Bragg Reflector (DBR), such that light emitted from the active structure reflects off two reflecting mirrors to generate coherent light. The reflectance of the first semiconductor structure is lower than the reflectance of the second semiconductor structure, such that the coherent light propagates in the direction of the permanent substrate. The first semiconductor structure, second semiconductor structure and active structure are made of III-V compound semiconductors, such as AlGaInAs group, AlGaInP group, AlInGaN group, AlAsSb group, InGaAsP group, InGaAsN group, and AlGaAsP group, for example, compounds like AlGaInP, GaAs, InGaAs, AlGaAs, GaAsP, GaP, InGaP, AlInP, GaN, InGaN, and AlGaN. Unless otherwise specified in this embodiment, the aforesaid chemical formulas include stoichiometric compounds and non-stoichiometric compounds. The compounds are stoichiometric when, for example, the total stoichiometric amount of group III elements is equal to the total stoichiometric amount of group V elements. The compounds are non-stoichiometric when, for example, the total stoichiometric amount of group III elements is not equal to the total stoichiometric amount of group V elements. For instance, the chemical formula AlGaInAs group comprises group III elements, such as aluminum (Al) and/or gallium (Ga) and/or indium (In) and comprises group V element arsenic (As), wherein the total stoichiometric amount of group III elements (aluminum and/or gallium and/or indium) is the same as or different from the total stoichiometric amount of group V element (arsenic). In addition, when the aforesaid compounds expressed by chemical formulas are stoichiometric compounds, the consequence is as follows: AlGaInAs group is expressed by $(Al_{y1}Ga_{(1-y1)})_{1-x1}In_{x1}As$, where $0 \leq x1 \leq 1$, $0 \leq y1 \leq 1$; AlGaInP group is expressed by $(Al_{y2}Ga_{(1-y2)})_{1-x2}In_{x2}P$, where $0 \leq x2 \leq 1$, $0 \leq y2 \leq 1$; AlInGaN group is expressed by $(Al_{y3}Ga_{(1-y3)})_{1-x3}In_{x3}N$, where $0 \leq x3 \leq 1$, $0 \leq y3 \leq 1$; AlAsSb group is expressed by $AlAs_{x4}Sb_{(1-x4)}$, where $0 \leq x4 \leq 1$; InGaAsP group is expressed by $In_{x5}Ga_{1-x5}As_{1-y4}P_{y4}$, where $0 \leq x5 \leq 1$, $0 \leq y4 \leq 1$; InGaAsN group is expressed by $In_{x6}Ga_{1-x6}As_{1-y5}N_{y5}$, where $0 \leq x6 \leq 1$, $0 \leq y5 \leq 1$; and AlGaAsP group is expressed by $Al_{x7}Ga_{1-x7}As_{1-y6}P_{y6}$, where $0 \leq x7 \leq 1$, $0 \leq y6 \leq 1$. As above-mentioned, when the respective second semiconductor structure and first semiconductor structure is formed as a multilayer structure, and contains aluminum therein, one of the layers of the second semiconductor structure may have aluminum content greater than 97% (defined as the current-confining structure) and greater than the aluminum content of the active structure, first semiconductor structure and the remaining layers of the second semiconductor structure. Thereby, only the portion of the layer having aluminum content greater than 97% will be oxidized upon completion of the oxidation process, thus forming the current-blocking region (such as aluminum oxide). The portion that is unoxidized forms the unoxidized region (the current-conducting region). In more detailed, when the sidewalls of first semiconductor structure, active structure, second semiconductor structure are exposed through the trench structures, and when the semiconductor laser element is disposed in an oxygen-containing environment, the oxygen will react with the first semiconductor structure, active structure, second semiconductor structure, thus forming the oxidation region (the current-blocking region).

The substrate includes the semiconductor material, such as III-V compound semiconductors or Group IV semiconductor material. In one embodiment, the substrate includes a n-typed, p-typed, or i-typed III-V compound semiconductors. In the present disclosure, the III-V compound semiconductor includes gallium arsenide (GaAs) having n-typed dopant of silicon (Si). The insulating layer includes oxides (such as $SiO_2$) or nitrides (such as $Si_3N_4$). The first electrode layer, the second electrode layer and the intermediate layer may include metals, alloys or conductive oxides, such as Ti, Pt, Cu, Au, Ni, Cr, Pd, Ag, BeAu, ZnAu, GeAu, GeAuNi, ITO.

The semiconductor laser element according to the present disclosure may be a VCSEL structure. The appearance of the semiconductor laser element shows that, the array of light emitting units of the semiconductor laser element includes plural light emitting units that are arranged in a regular manner, wherein each light emitting unit is formed by plural overlapping sub-units, and includes different amounts of light emitting zones (e.g., zero, one, two, or more than two light emitting zones). According to the present disclosure, by modifying the structure of the respective layers of the semiconductor laser element, the array of light emitting units of the semiconductor laser element may be formed in such a way that, the current injected into the semiconductor laser element may selectively pass through the current-conducting region of the respective light emitting units to enable the aperture, forming the light emitting zone. The remaining regions will not show any bright spot because no current flows therethrough, or because the light generated by the epitaxial structure is absorbed or reflected by the first electrode layer. Thereby, the semiconductor laser element according to the present disclosure may show an irregular lighting pattern.

According to the present disclosure, the light emitting unit of the semiconductor laser element is constructed by plural sub-units having the same or different shapes and having the same or different sizes, thereby forming the light emitting zones thereof having different shapes and sizes. Moreover, the current-conducting regions in the light emitting units may be all enabled, all disabled, or some enabled while the remaining disabled. Thereby, the amounts, shapes and sizes of the light emitting zones (the bright spots) of the semiconductor laser element can be varied by modifying the structures of the light emitting units. Further, according to the present disclosure, by modifying the process for the respective layer structure of the semiconductor laser element, such as the wet-oxidation process, the ion implantation process, the formation of current-confining structure, and the materials of the first electrode layer and the contact layer, in combination or not, the complexity of lighting pattern of the semiconductor laser element in the present disclosure can be significantly increased, According to the present disclosure, the array of light emitting units of a predetermined arrangement can be adopted as a public version for the design of semiconductor laser element. By means of a simple modification in the process for the respective layer of the semiconductor laser element, the present disclosure provides for a semiconductor laser element which can show a lighting pattern of high randomness, depending on the customer demand, with a same chip.

According to the present disclosure, the light emitting zones in each light emitting unit of the semiconductor laser element may be formed as having the same or different sizes, and the same or different shapes. Combined with the design of enabled and disabled apertures as above-mentioned, the complexity and randomness of the lighting pattern of the semiconductor laser element can be further increased.

Thereby, the accuracy of the algorithm for bright spots and thus the recognition will be enhanced.

According to the present disclosure, the plurality of light emitting units may be individually controlled by region. Depending on the usage scenario (such as for recognition, for general lighting, for high-resolution lighting etc.), the number of the enabled current-conducting regions (i.e., the number of light emitting zones or bright spots) can be adjusted thereby, thus improving the accuracy of algorithm with the saving of power.

The above disclosures in respect of the shapes of light emitting zones, the number/amounts of the light emitting zones, and the number of the light emitting unit sets are all provided for exemplary illustration. The person having ordinary skills in this art may recognize that the shape and number of the light emitting zones as well as the number of the light emitting unit sets can be modified as desired based on the teachings of the present disclosure.

In aforesaid embodiments, the laser element can be a laser chip or a laser die after wafer dicing process, a wafer dicing pitch can be set to obtain a single chip integrated with plural lighting units therein.

The aforesaid embodiments of the present disclosure are illustrative rather than restrictive of the present disclosure. All modifications and changes made by persons skilled in the art to the present disclosure do not depart from the spirit and scope of the present disclosure. Identical or similar constituent elements in different embodiments or constituent elements denoted by identical reference numerals in different embodiments have identical physical or chemical properties. In addition, in appropriate situations, the aforesaid embodiments of the present disclosure can be combined or can replace each other but are not restricted to the above description of the aforesaid specific embodiments. Specific constituent elements and connection relationships between any other constituent elements described in an embodiment may also apply to any other embodiments and fall within the scope of the appended claims of the present disclosure.

What is claimed is:

1. A package structure of a laser device, comprising:
   a first light transmissive substrate comprising a first surface, a second surface opposing the first surface, a first side surface between the first surface and the second surface, and a second side surface opposing the first side surface;
   a laser structure comprising a first laser chip and a second laser chip which are on the first surface, and the first laser chip comprising a third side surface;
   a first optical component on the first light transmissive substrate and corresponding in position to the first laser chip; and
   a second optical component on the light transmissive substrate and corresponding in position to the second laser chip; and
   a first conductive post and a second conductive post respectively penetrating at least portions of the first laser chip and the second laser chip;
   wherein the first laser chip comprises a lower surface away from the second surface, a first electrode and a second electrode on the lower surface.

2. The laser package structure of claim 1, wherein the first side surface is coplanar with the third side surface, and the second laser chip further comprises a fourth side surface coplanar with the second side surface.

3. The laser package structure of claim 1, further comprising a conductive layer between the laser structure and the first light transmissive substrate.

4. The laser package structure of claim 1, further comprising a conductive layer on the second surface of the first light transmissive substrate.

5. The laser package structure of claim 1, further comprising an adhesive layer between the first light transmissive substrate and the laser structure.

6. The laser package structure of claim 5, wherein the adhesive layer disposes between a conductive layer and the laser structure.

7. The laser package structure of claim 5, wherein the first conductive post and the second conductive post penetrate the adhesive layer.

8. The laser package structure of claim 5, wherein the adhesive layer disposes between the first light transmissive substrate and a conductive layer.

9. The laser package structure of claim 1, further comprising a common electrode on the first laser chip and the second laser chip.

10. The laser package structure of claim 1, wherein the first electrode or the second electrode connect to the first conductive post.

11. The laser package structure of claim 1, further comprising a support element surrounding the laser structure and the first light transmissive substrate.

12. The laser package structure of claim 11, wherein the support element further surrounds the first optical component and the second optical component.

13. The laser package structure of claim 11, further comprising a conductive layer on the support element.

14. The laser package structure of claim 13, further comprising a first conductive post and a second conductive post penetrating the support element, and wherein the conductive layer connects to the first conductive post and the second conductive post.

15. The laser package structure of claim 13, further comprising a second light transmissive substrate, and wherein the conductive layer disposes between the second light transmissive substrate and the support element.

16. The laser package structure of claim 15, wherein the second optical component comprises an optical component pattern portion and a light transmissive substrate portion disposed between the second light transmissive substrate and the optical component pattern portion.

17. The laser package structure of claim 1, further comprising a first distance between the first optical component and the first laser chip, and a second distance between the second optical component and the second laser chip, the second distance being different from the first distance.

18. The laser package structure of claim 1, further comprising a spacing layer between the first laser chip and the second laser chip.

* * * * *